US009041033B2

(12) United States Patent
Akimoto et al.

(10) Patent No.: US 9,041,033 B2
(45) Date of Patent: May 26, 2015

(54) SEMICONDUCTOR LIGHT EMITTING DEVICE

(71) Applicant: Kabushiki Kaisha Toshiba, Minato-ku, Tokyo (JP)

(72) Inventors: Yosuke Akimoto, Kanagawa-ken (JP); Yoshiaki Sugizaki, Kanagawa-ken (JP); Akihiro Kojima, Kanagawa-ken (JP); Miyoko Shimada, Kanagawa-ken (JP); Hideyuki Tomizawa, Kanagawa-ken (JP); Hideto Furuyama, Kanagawa-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 13/781,617

(22) Filed: Feb. 28, 2013

(65) Prior Publication Data
US 2014/0001502 A1    Jan. 2, 2014

(30) Foreign Application Priority Data

Jun. 28, 2012  (JP) ................. 2012-146031

(51) Int. Cl.
*H01L 33/00* (2010.01)
*H01L 33/36* (2010.01)
*H01L 33/60* (2010.01)
(Continued)

(52) U.S. Cl.
CPC ............... *H01L 33/36* (2013.01); *H01L 33/60* (2013.01); *H01L 33/387* (2013.01); *H01L 33/405* (2013.01); *H01L 33/382* (2013.01); *H01L 33/62* (2013.01); *H01L 2224/13* (2013.01); *H01L 2924/0002* (2013.01)

(58) Field of Classification Search
CPC ................... H01L 33/36; H01L 33/60
USPC .............. 257/98, 99, 701, 773, 774, E33.055, 257/E33.056, E33.058, E33.059; 313/501, 313/512; 438/26, 106
See application file for complete search history.

(56) References Cited

U.S. PATENT DOCUMENTS

2005/0194605 A1    9/2005  Shelton et al.
2007/0241348 A1    10/2007  Inoue et al.
(Continued)

FOREIGN PATENT DOCUMENTS

JP    06-296041 A    10/1994
JP    2003-110140 A   4/2003
(Continued)

*Primary Examiner* — Meiya Li
*Assistant Examiner* — Peter M Albrecht
(74) *Attorney, Agent, or Firm* — Holtz, Holtz, Goodman & Chick PC

(57) ABSTRACT

According to one embodiment, a semiconductor light emitting device includes a first semiconductor layer, a light emitting layer, a second semiconductor layer, a p-side electrode, a plurality of n-side electrodes, a first insulating film, a p-side interconnect unit, and an n-side interconnect unit. The p-side interconnect unit is provided on the first insulating film to connect to the p-side electrode through a first via piercing the first insulating film. The n-side interconnect unit is provided on the first insulating film to commonly connect to the plurality of n-side electrodes through a second via piercing the first insulating film. The plurality of n-side regions is separated from each other without being linked at the second surface. The p-side region is provided around each of the n-side regions at the second surface.

20 Claims, 52 Drawing Sheets

(51) Int. Cl.
  *H01L 33/38* (2010.01)
  *H01L 33/40* (2010.01)
  *H01L 33/62* (2010.01)

(56) References Cited

U.S. PATENT DOCUMENTS

| | | | |
|---|---|---|---|
| 2009/0206354 A1* | 8/2009 | Kitano et al. | 257/98 |
| 2011/0220931 A1 | 9/2011 | Kojima | |
| 2011/0233588 A1 | 9/2011 | Deguchi et al. | |
| 2011/0297997 A1 | 12/2011 | Izuka et al. | |
| 2012/0049219 A1* | 3/2012 | Kamiya et al. | 257/98 |

FOREIGN PATENT DOCUMENTS

| JP | 2006-019347 A | 1/2006 |
|---|---|---|
| JP | 2006-032857 A | 2/2006 |
| JP | 2008-130721 A | 6/2008 |
| JP | 2008-135789 A | 6/2008 |
| JP | 2010-103186 A | 5/2010 |

\* cited by examiner

SEMICONDUCTOR LIGHT EMITTING DEVICE

CROSS-REFERENCE TO RELATED APPLICATION

This application is based upon and claims the benefit of priority from Japanese Patent Application No. 2012-146031, filed on Jun. 28, 2012; the entire contents of which are incorporated herein by reference.

FIELD

Embodiments described herein relate generally to a semiconductor light emitting device.

BACKGROUND

A structure is known in which a p-side electrode and an n-side electrode formed on a surface of a semiconductor layer that includes a light emitting layer are on the side opposite to the light extraction surface. In this structure, the degrees of freedom of the configurations and layout of the electrodes are high because the electrodes do not impede the light extraction from the light extraction surface. An appropriate design of the configurations and layout of the electrodes is necessary because the configurations and layout of the electrodes affect the electrical characteristics and the luminous efficiency.

DETAILED DESCRIPTION

Figure 1:
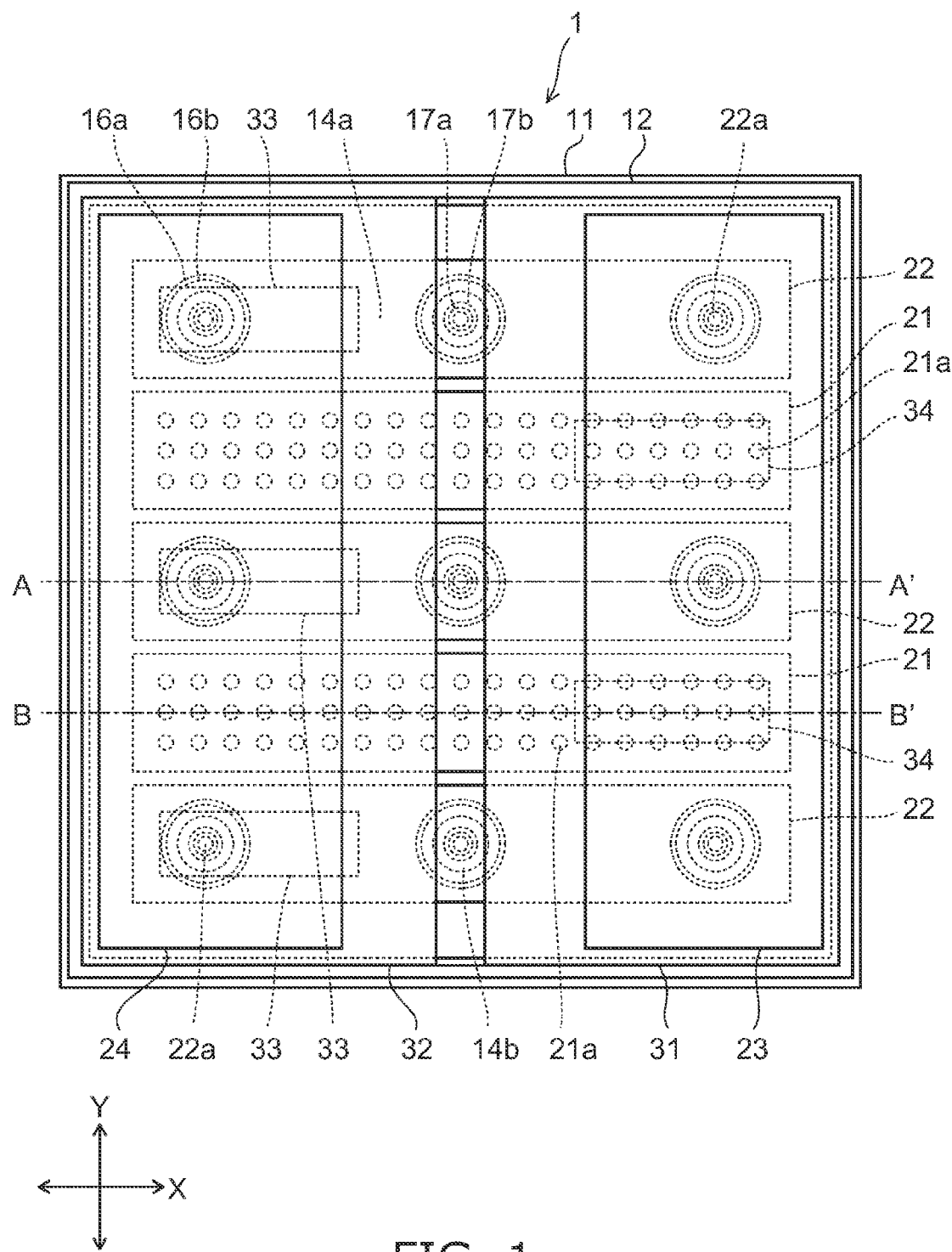
FIG. 1 is a schematic plan view of a semiconductor light emitting device of a first embodiment.

According to one embodiment, a semiconductor light emitting device includes a first semiconductor layer, a light emitting layer, a second semiconductor layer, a p-side electrode, a plurality of n-side electrodes, a first insulating film, a p-side interconnect unit, and an n-side interconnect unit. The first semiconductor layer has a first surface and a second surface opposite to the first surface. The second surface has a p-side region and a plurality of n-side regions. The light emitting layer is provided on the p-side region. The second semiconductor layer is provided on the light emitting layer. The p-side electrode is provided on the second semiconductor layer. The plurality of n-side electrodes is provided respectively on the plurality of n-side regions. The first insulating film is provided on the p-side electrode and on the n-side electrodes. The p-side interconnect unit is provided on the first insulating film to connect to the p-side electrode through a first via piercing the first insulating film. The n-side interconnect unit is provided on the first insulating film to commonly connect to the plurality of n-side electrodes through a second via piercing the first insulating film. The plurality of n-side regions is separated from each other without being linked at the second surface. The p-side region is provided around each of the n-side regions at the second surface.

Embodiments will now be described with reference to the drawings. Similar components in the drawings are marked with like reference numerals.

First Embodiment

Figure 2:
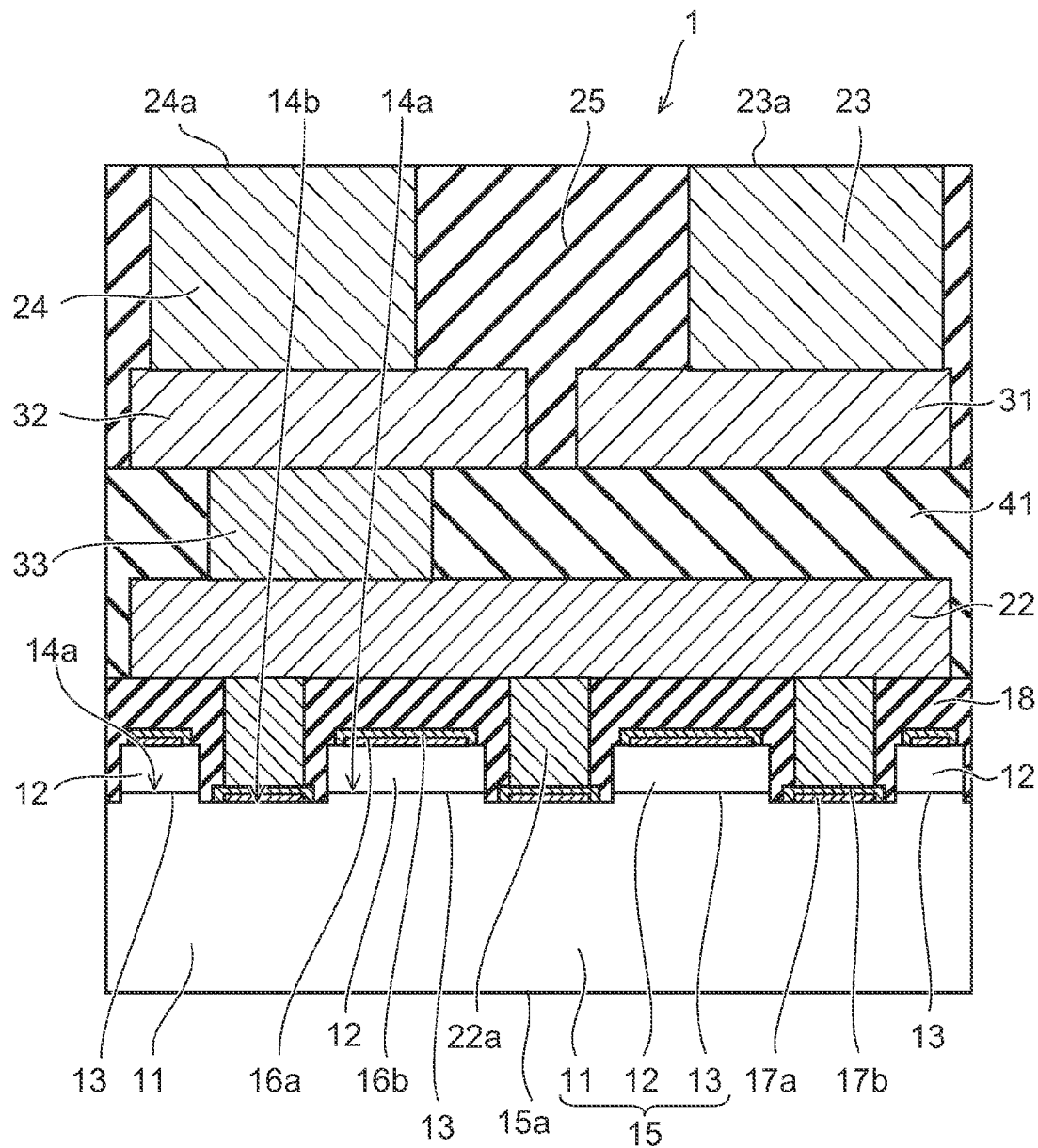
FIG. 2 is the A-A' cross-sectional view of FIG. 1.
Figure 3:
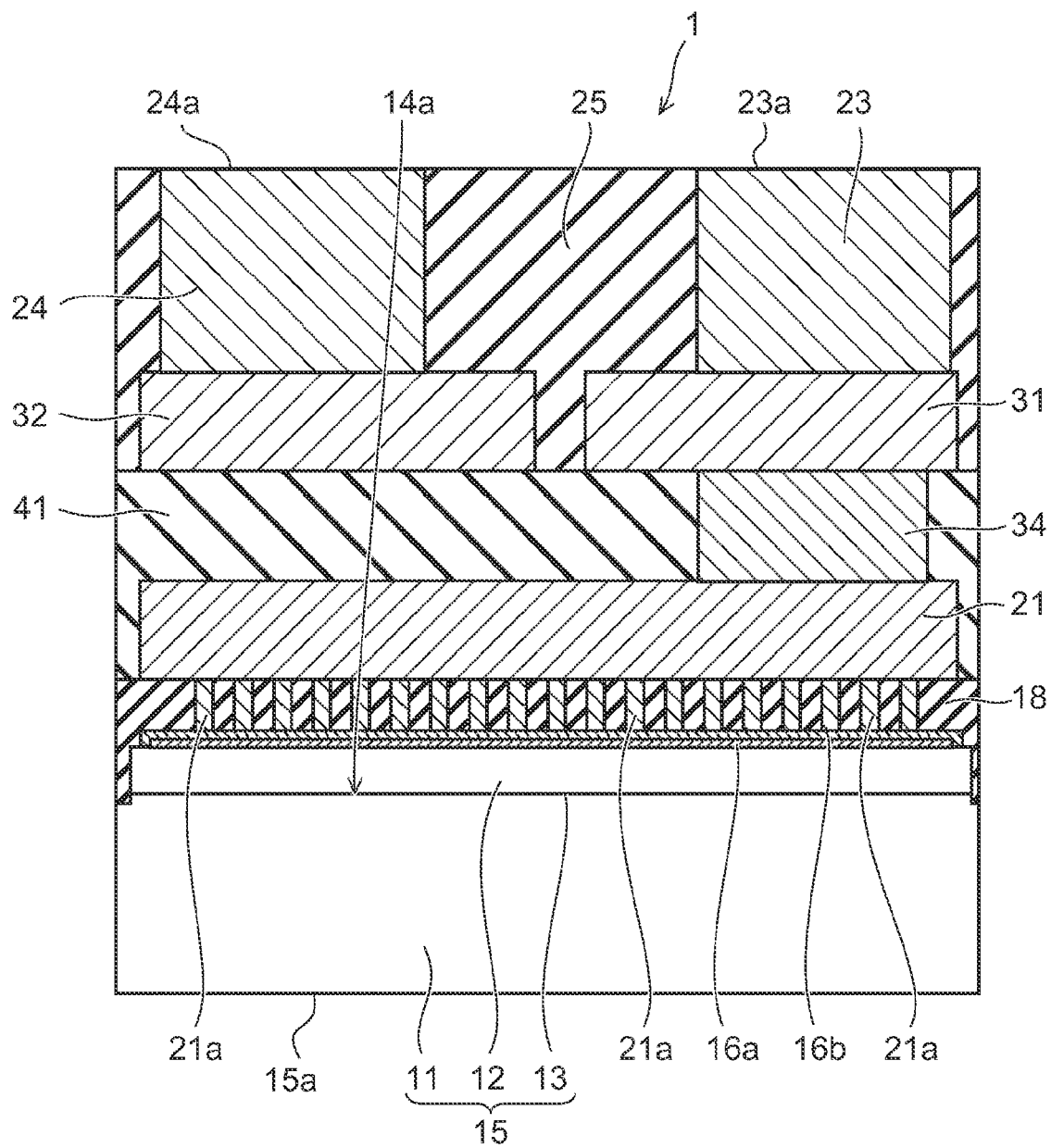
FIG. 3 is the B-B' cross-sectional view of FIG. 1.

FIG. 1 is a schematic plan view of a semiconductor light emitting device 1 of the first embodiment.
FIG. 2 is the A-A' cross-sectional view of FIG. 1.
FIG. 3 is the B-B' cross-sectional view of FIG. 1.
FIG. 1 shows a second surface side which is the side opposite to a first surface 15a of a semiconductor layer 15 and shows the planar layout of the components other than the insulating films and the resin layers.

As shown in FIGS. 2 and 3, the semiconductor light emitting device 1 includes the semiconductor layer 15. The semiconductor layer 15 includes a first semiconductor layer 11, a second semiconductor layer 12, and a light emitting layer 13. The first semiconductor layer 11, the second semiconductor layer 12, and the light emitting layer 13 are nitride semiconductors of $In_xAl_yGa_{1-x-y}N$ ($0 \leq x \leq 1$, $0 \leq y \leq 1$, and $x+y \leq 1$). "Nitride semiconductor" further includes components including an impurity added to control the conductivity type.

The first semiconductor layer 11 has the first surface 15a and the second surface provided on the side opposite to the first surface 15a. The second surface has a p-side region 14a and n-side regions 14b. The first semiconductor layer 11 includes, for example, a foundation buffer layer and an n-type GaN layer.

The light emitting layer (the active layer) 13 is provided on the p-side region 14a at the second surface of the first semiconductor layer 11. The light emitting layer 13 has, for example, an InGaN multiple quantum well structure in which multiple pairs of an InGaN well layer and a GaN or InGaN barrier layer are stacked and emits blue light, violet light, bluish-violet light, ultraviolet light, etc.

The second semiconductor layer 12 including a p-type GaN layer is provided on the light emitting layer 13. The light emitting layer 13 is provided between the first semiconductor layer 11 and the second semiconductor layer 12. The light emitting layer 13 and the second semiconductor layer 12 are not provided in the n-side regions 14b at the second surface of the first semiconductor layer 11.

The n-side regions 14b are formed by the front surface of the first semiconductor layer 11 being exposed by selectively removing a portion of the light emitting layer 13 and the second semiconductor layer 12 formed on the entire surface of the second surface of the first semiconductor layer 11.

The first surface 15a of the first semiconductor layer 11 functions as the main extraction surface of the light; and the light emitted by the light emitting layer 13 is emitted outside the semiconductor layer 15 mainly from the first surface 15a. The p-side electrode, the n-side electrodes, the p-side interconnect unit, and the n-side interconnect unit described below are provided on the side opposite to the first surface 15a.

A p-side electrode 16a is provided on the second semiconductor layer 12. The p-side electrode 16a has an ohmic contact with the second semiconductor layer 12. N-side electrodes 17a are provided in the n-side regions 14b at the second surface of the first semiconductor layer 11. The n-side electrodes 17a have ohmic contacts with the first semiconductor layer 11.

The p-side electrode 16a and the n-side electrodes 17a are provided on the same surface side which is the side opposite to the first surface 15a which is the main light extraction surface of the semiconductor layer 15; the p-side electrode 16a is provided on the region including the light emitting layer 13; and the n-side electrodes 17a are provided on the n-side regions 14b not including the light emitting layer 13.

A p-side pad 16b covering the p-side electrode 16a is provided on the front surface and the side surface of the p-side electrode 16a. The p-side electrode 16a includes a material having a high reflectance for the light emitted by the light emitting layer 13, e.g., Ag, a Ag alloy, etc. The p-side pad 16b includes a material that protects the p-side electrode 16a from corroding, e.g., Al, Ti, Ni, Au, etc.

N-side pads 17b covering the n-side electrodes 17a are provided on the front surfaces and the side surfaces of the n-side electrodes 17a. The n-side electrodes 17a include, for example, at least one selected from nickel (Ni), gold (Au), and rhodium (Rh) that is capable of forming an alloy with the gallium (Ga) included in the semiconductor layer 15. The n-side pads 17b include a material that protects the n-side electrodes 17a from corroding, e.g., Al, Ti, Ni, Au, etc.

Figure 4:
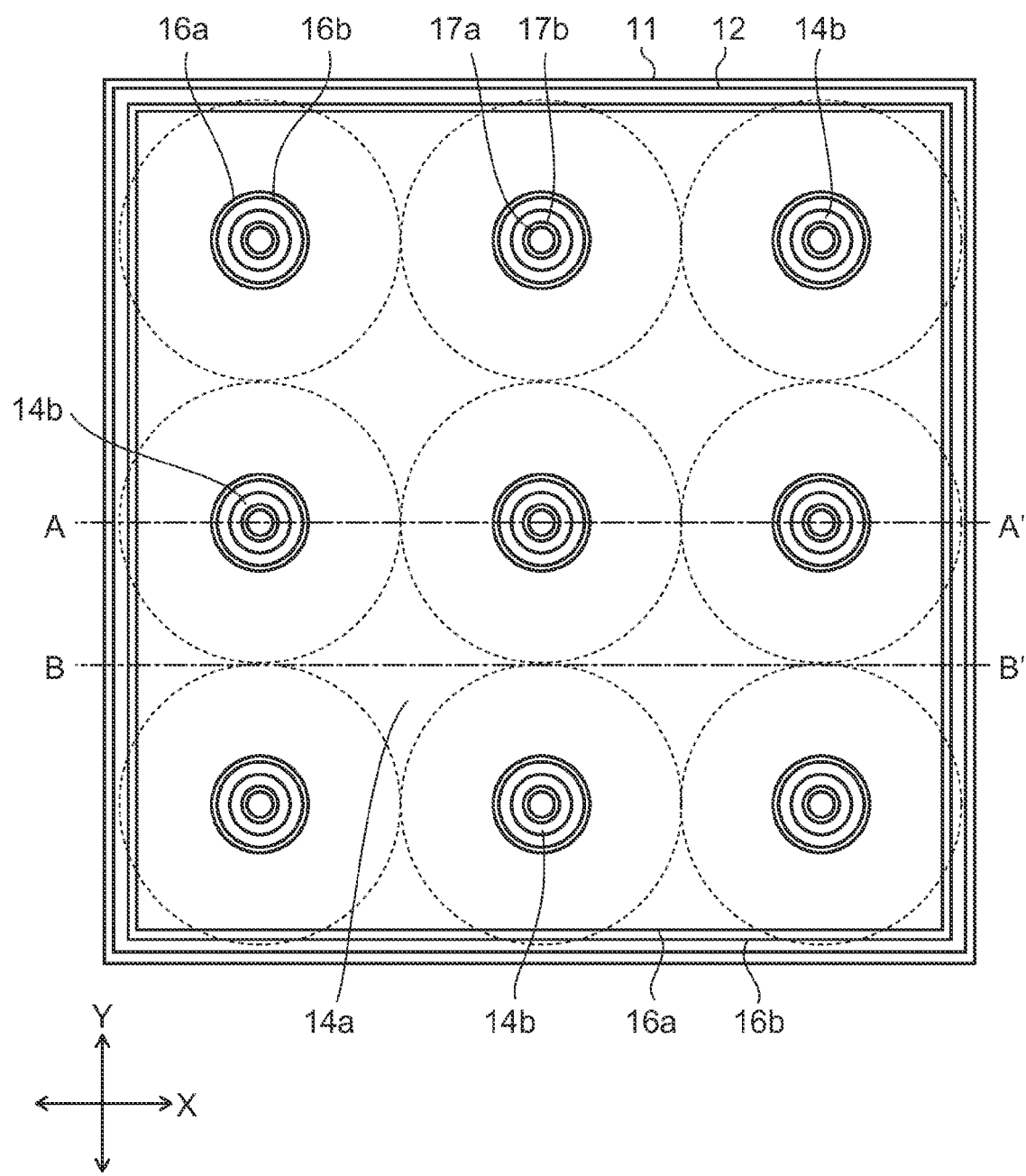
FIG. 4 to FIG. 8 are schematic plan views showing a method for manufacturing the semiconductor light emitting device of the first embodiment.

FIG. 4 shows the planar layout of the p-side region 14a, the n-side regions 14b, the p-side electrode 16a, the p-side pad 16b, the n-side electrodes 17a, and the n-side pads 17b on the second surface.

The multiple n-side regions 14b inside the p-side region 14a which is spread over the entire second surface are uniformly interspersed. Each of the n-side regions 14b is formed as, for example, a circular region. The multiple n-side regions 14b are separated from each other without being linked at the second surface; and the p-side region 14a is provided around each of the n-side regions 14b at the second surface.

The n-side electrodes 17a are provided respectively on the multiple n-side regions 14b. The multiple n-side electrodes 17a are uniformly interspersed in a dot configuration or an island configuration on the second surface.

As shown in FIG. 2, the second semiconductor layer 12 is provided around each of the n-side electrodes 17a and n-side pads 17b. The n-side regions 14b of the first semiconductor layer 11, the n-side electrodes 17a provided on the n-side regions 14b, and the n-side pads 17b covering the n-side electrodes 17a are partitioned by the light emitting layer 13 and the second semiconductor layer 12 stacked on the light emitting layer 13 and are separated into a plurality on the second surface.

As shown in FIGS. 2 and 3, a first insulating film (hereinbelow, called simply the insulating film) 18 is provided on the second surface side of the semiconductor layer 15. The insulating film 18 covers the n-side regions 14b, the front surface of the second semiconductor layer 12, the side surface of the second semiconductor layer 12, the side surface of the light emitting layer 13, the p-side pad 16b, and the n-side pads 17b.

There are cases where another insulating film (e.g., a silicon oxide film) is provided between the insulating film 18 and the semiconductor layer 15. The insulating film 18 is, for example, a resin such as polyimide, etc., having excellent patternability of fine openings. Or, an inorganic film such as a silicon oxide film, a silicon nitride film, etc., may be used as the insulating film 18.

An n-side interconnect layer (a first n-side interconnect layer) 22 shown in FIG. 2 and a p-side interconnect layer (a first p-side interconnect layer) 21 shown in FIG. 3 are provided on the front surface of the insulating film 18 on the side opposite to the semiconductor layer 15.

As shown in FIG. 2, n-side vias 22a are provided respectively on the n-side pads 17b by piercing the insulating film 18. The n-side interconnect layer 22 is electrically connected to each of the n-side pads 17b and n-side electrodes 17a by means of each of the n-side vias 22a.

As shown in FIG. 3, multiple p-side vias 21a are provided on the p-side pad 16b by piercing the insulating film 18. The p-side interconnect layer 21 is electrically connected to the p-side pad 16b and the p-side electrode 16a by means of the multiple first p-side vias 21a.

Figure 5:
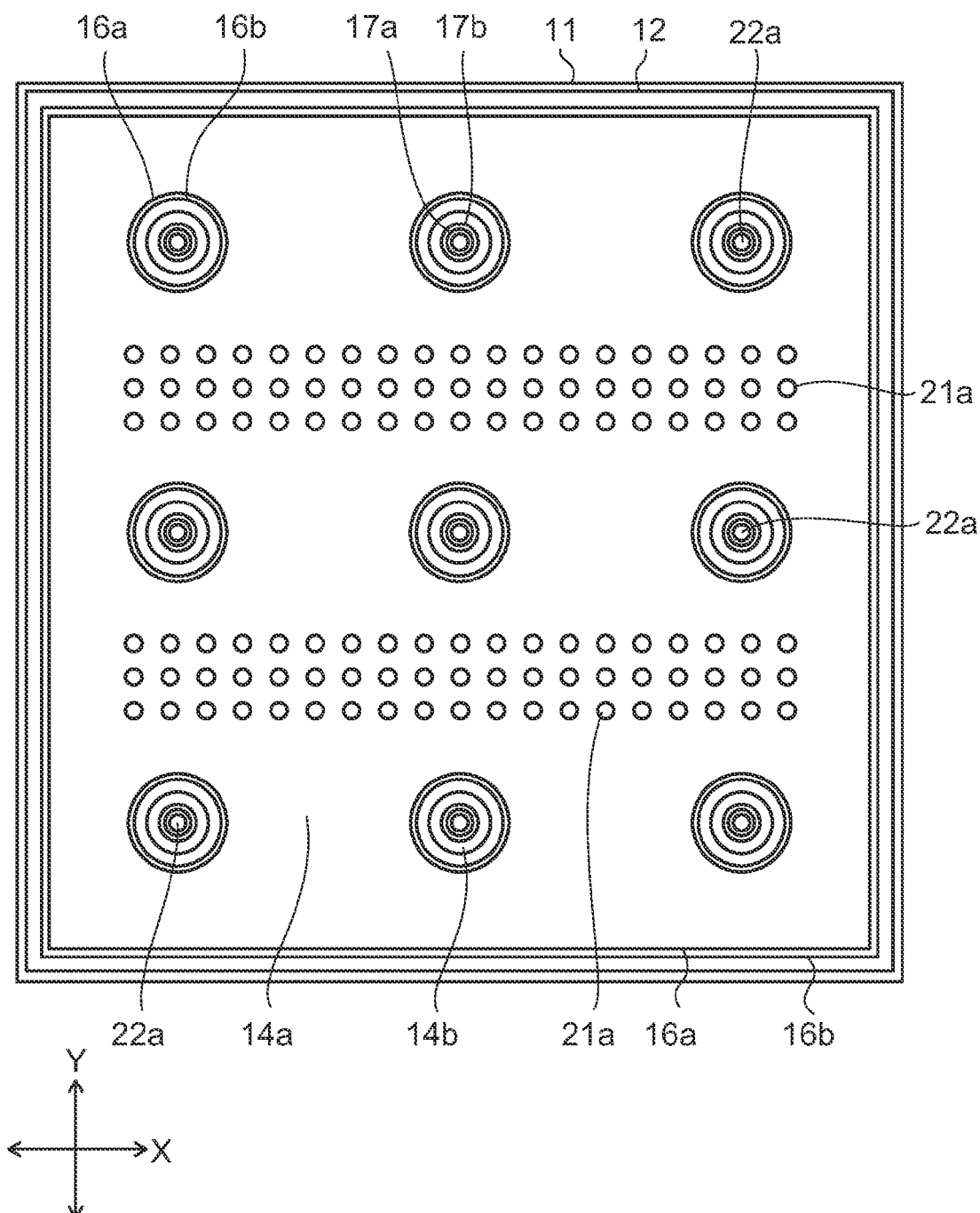
Figure 6:
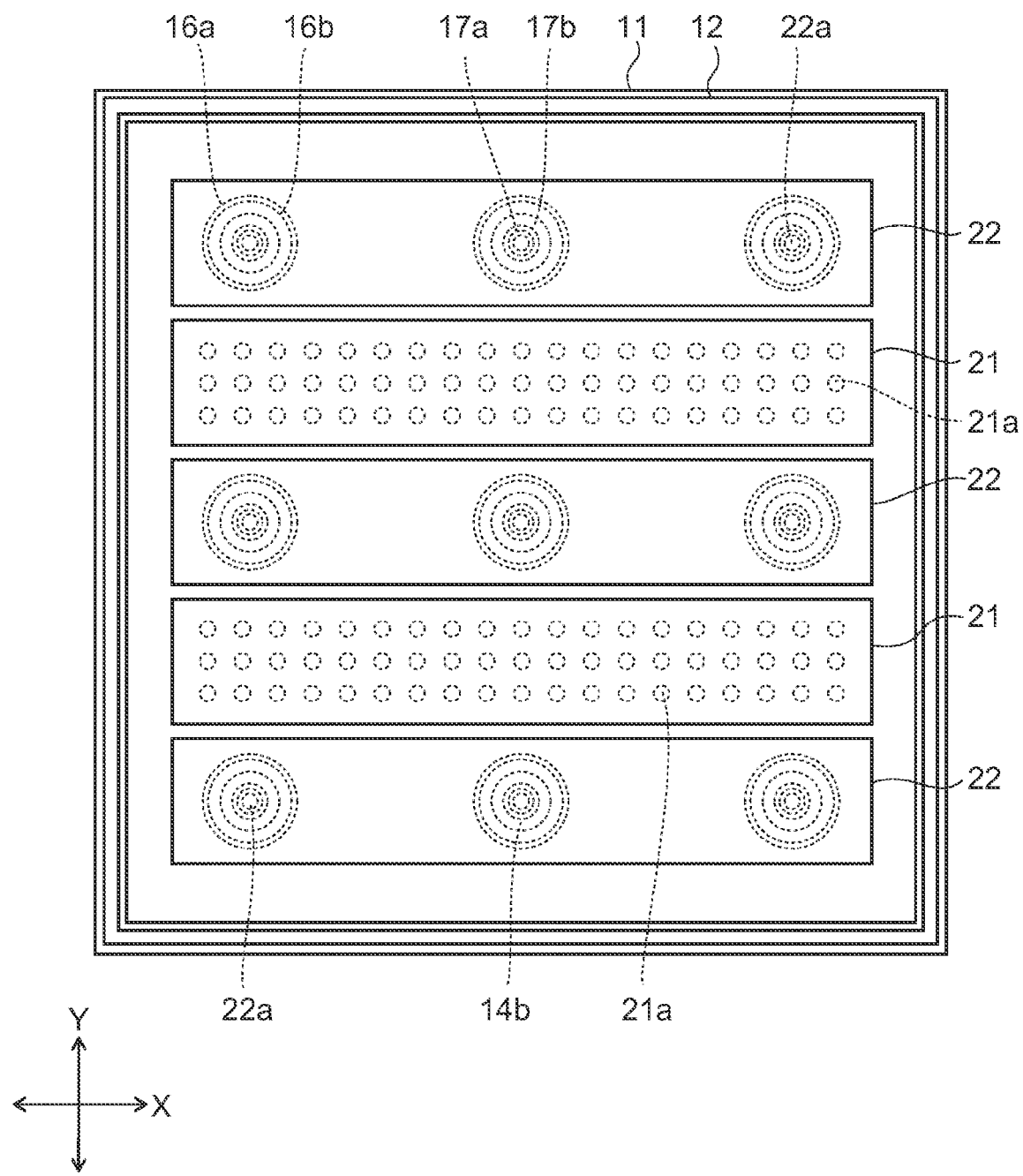

FIG. 5 shows the planar layout of the n-side vias 22a and the p-side vias 21a; and FIG. 6 is a plan view in which the n-side interconnect layers 22 and the p-side interconnect layers 21 are overlaid on FIG. 5.

The multiple (in FIG. 6, e.g., three) n-side electrodes 17a provided to be separated on the second surface are connected respectively by means of the n-side vias 22a to one common n-side interconnect layer 22 extending in a first direction X in FIG. 6. As shown in FIG. 2, the one n-side interconnect layer 22 straddles above the p-side electrode 16a and the p-side pad 16b with the insulating film 18 interposed to commonly connect to the multiple n-side electrodes 17a.

The n-side interconnect layer 22 is multiply provided; and each of the n-side interconnect layers 22 extends in the first direction X in FIG. 6. The p-side interconnect layers 21 are provided in the region between the n-side interconnect layers 22 adjacent to each other in a second direction Y orthogonal to the first direction X.

The multiple n-side interconnect layers 22 and the multiple p-side interconnect layers 21 are arranged alternately to be separated from each other in the second direction Y on the insulating film 18.

As shown in FIG. 2 and FIG. 3, an insulating film 41 is provided on the insulating film 18, on the n-side interconnect layers 22, and on the p-side interconnect layers 21. The insulating film 41 is a material similar to that of the insulating film 18 such as, for example, an inorganic insulating film such as a silicon oxide film, a resin film such as polyimide, etc. The insulating film 41 covers the n-side interconnect layers 22 and the p-side interconnect layers 21.

An n-side interconnect layer (a second n-side interconnect layer) 32 and a p-side interconnect layer (a second p-side interconnect layer) 31 are provided on the insulating film 41.

As shown in FIG. 2, n-side vias 33 are provided on the n-side interconnect layers 22 by piercing the insulating film 41. The n-side interconnect layer 32 is electrically connected to the n-side interconnect layers 22 by means of the n-side vias 33.

As shown in FIG. 3, p-side vias 34 are provided on the p-side interconnect layers 21 by piercing the insulating film 41. The p-side interconnect layer 31 is electrically connected to the p-side interconnect layers 21 by means of the p-side vias 34.

Figure 7:
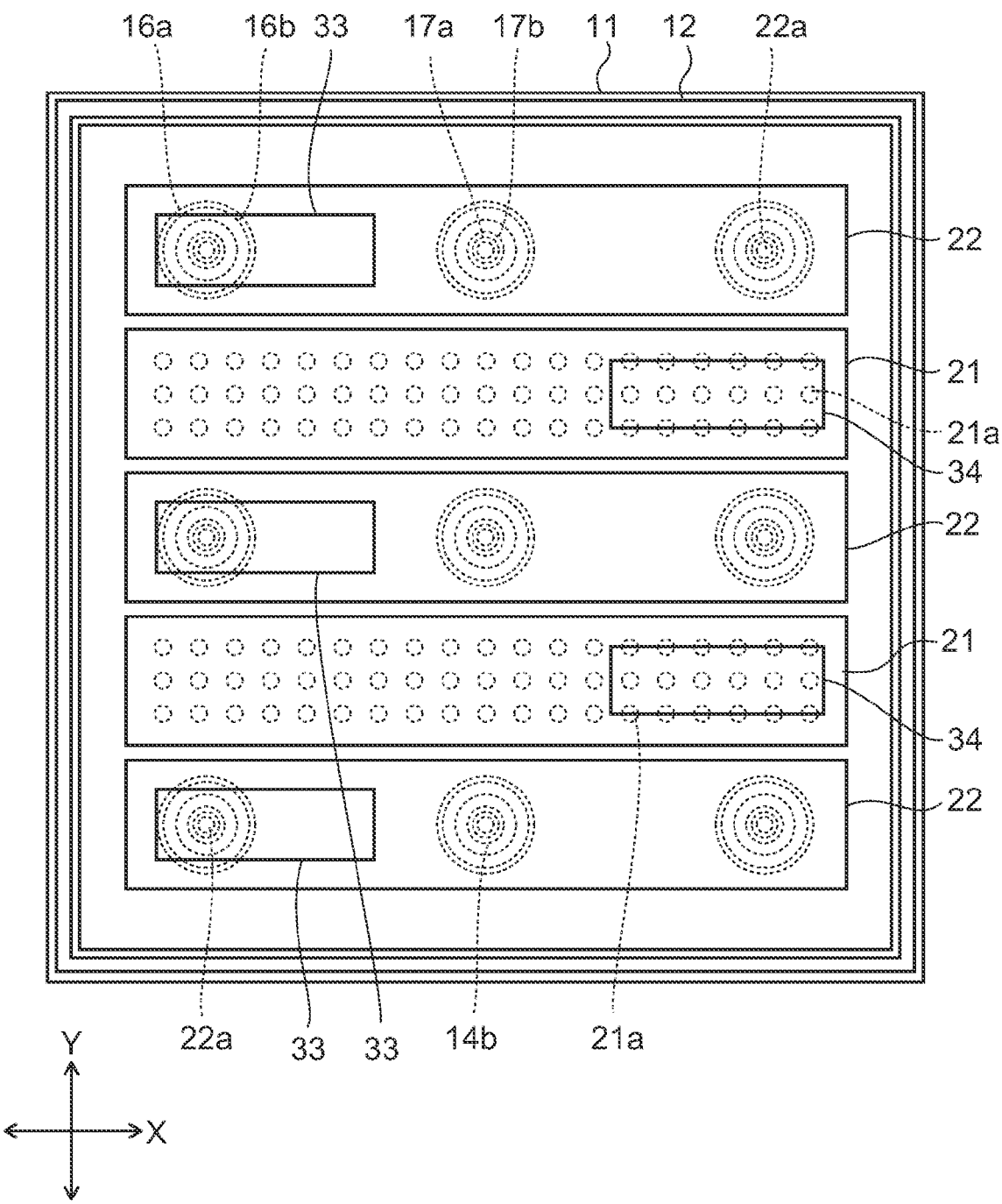
Figure 8:
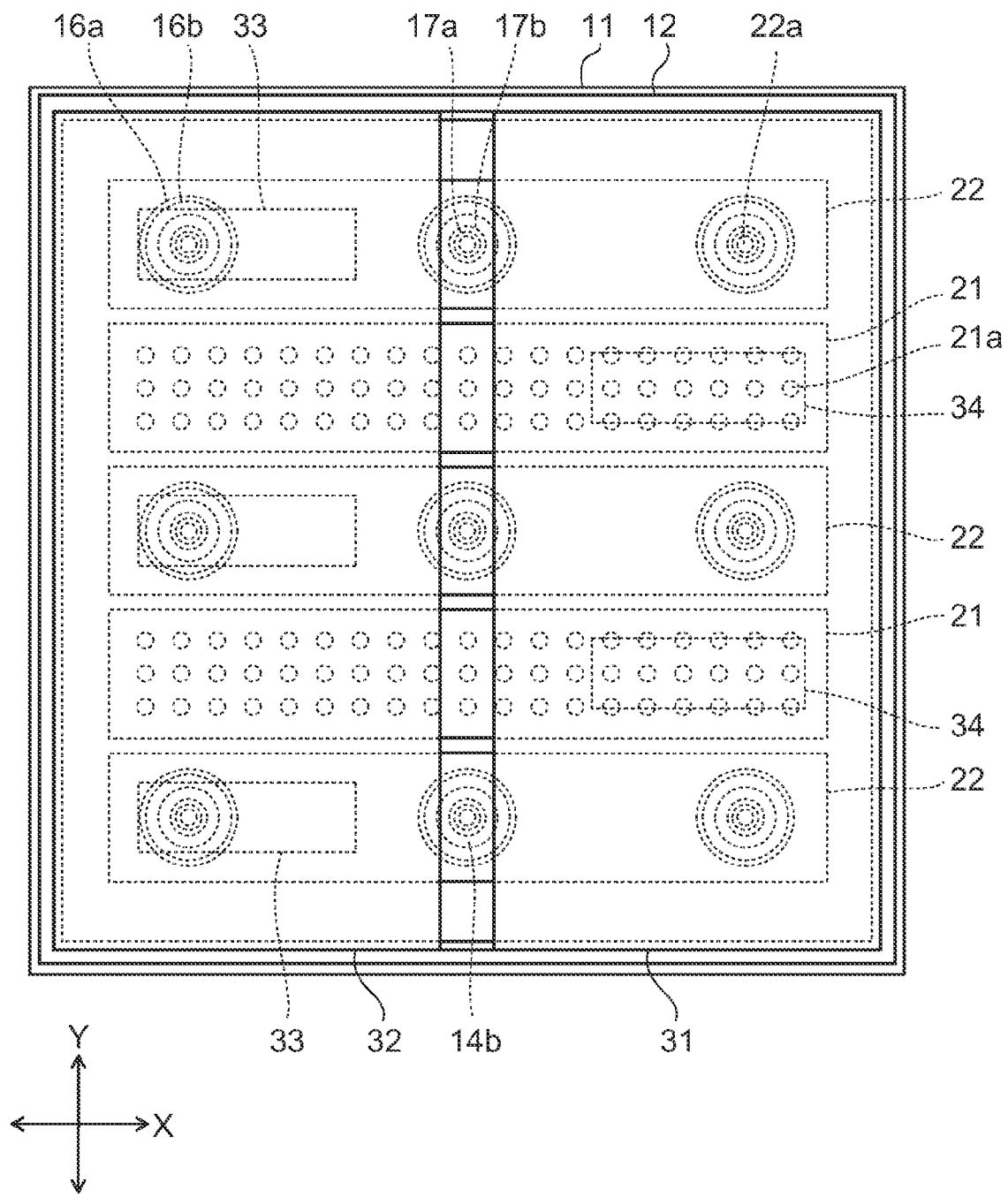

FIG. 7 shows the planar layout of the n-side vias 33 and the p-side vias 34; and FIG. 8 is a plan view in which the n-side interconnect layer 32 and the p-side interconnect layer 31 are overlaid on FIG. 7.

One n-side via 33 is provided for one n-side interconnect layer 22. Accordingly, the multiple n-side vias 33 are arranged in the second direction Y to correspond to the number of the n-side interconnect layers 22.

One p-side via 34 is provided for one p-side interconnect layer 21. Accordingly, the multiple p-side vias 34 are arranged in the second direction Y to correspond to the number of the p-side interconnect layers 21.

The multiple n-side vias 33 and the multiple p-side vias 34 are provided to be divided into the left and right with respect to the center in the first direction X. In FIGS. 7 and 8, the n-side vias 33 are provided in the region on the left side of the center in the first direction X; and the p-side vias 34 are provided in the region on the right side of the center in the first direction X.

The n-side interconnect layer 32 spreads in the region on the left side of the center in the first direction X in FIG. 8. The multiple n-side interconnect layers 22 are connected to one common n-side interconnect layer 32 by means of the n-side vias 33.

The p-side interconnect layer 31 spreads in the region on the right side of the center in the first direction X in FIG. 8. The multiple p-side interconnect layers 21 are connected to one common p-side interconnect layer 31 by means of the p-side vias 34.

The n-side interconnect layer 32 and the p-side interconnect layer 31 spread to be divided into the left and right with the same surface area with the center in the first direction X interposed. The n-side interconnect layer 32 and the p-side interconnect layer 31 are separated from each other on the insulating film 41.

As shown in FIGS. 2 and 3, a p-type metal pillar 23 is provided on the p-side interconnect layer 31. The p-side interconnect layers 21, the p-side interconnect layer 31, and the p-type metal pillar 23 are included in the p-side interconnect unit of the embodiment.

An n-side metal pillar 24 is provided on the n-side interconnect layer 32. The n-side interconnect layers 22, the n-side interconnect layer 32, and the n-side metal pillar 24 are included in the n-side interconnect unit of the embodiment.

For example, a resin layer 25 is stacked on the insulating film 41 as a second insulating film. The resin layer 25 covers the periphery of the n-side interconnect layer 32, the periphery of the n-side metal pillar 24, the periphery of the p-side interconnect layer 31, and the periphery of the p-type metal pillar 23. The resin layer 25 is filled between the p-side interconnect layer 31 and the n-side interconnect layer 32 and between the p-type metal pillar 23 and the n-side metal pillar 24.

The side surface of the p-type metal pillar 23 and the side surface of the n-side metal pillar 24 are covered with the resin layer 25. The surface of the p-type metal pillar 23 on the side opposite to the p-side interconnect layer 31 is exposed from the resin layer 25 and functions as a p-side external terminal 23a. The surface of the n-side metal pillar 24 on the side opposite to the n-side interconnect layer 32 is exposed from the resin layer 25 and functions as an n-side external terminal 24a.

The p-side external terminal 23a and the n-side external terminal 24a are bonded to pads formed in a not-shown mounting substrate via solder, etc.

The distance between the p-side external terminal 23a and the n-side external terminal 24a exposed at the same surface (in FIGS. 2 and 3, the upper surface) of the resin layer 25 is greater than the distance between the p-side interconnect layer 31 and the n-side interconnect layer 32 on the insulating film 41. The distance between the p-side external terminal 23a and the n-side external terminal 24a is greater than the distance between the p-side interconnect layers 21 and the n-side interconnect layers 22 on the insulating film 18.

The p-side external terminal 23a and the n-side external terminal 24a are separated by a distance such that the p-side external terminal 23a and the n-side external terminal 24a are not shorted to each other by the solder when mounting to the mounting substrate.

The p-side interconnect layers 21 can be proximal to the n-side interconnect layers 22 to the limits of the processes; and the surface area of the p-side interconnect layer 31 can be increased. Also, the p-side interconnect layer 31 can be proximal to the n-side interconnect layer 32 to the limits of the processes. As a result, the surface area of the p-side interconnect layers 21 and the p-side interconnect layer 31 can be large; and the current distribution and the heat dissipation can be improved.

The surface area of the p-side interconnect layers 21 contacting the p-side pad 16b by means of the multiple p-side vias 21a is greater than the surface area of the n-side interconnect layers 22 contacting the n-side pads 17b by means of the multiple n-side vias 22a. Therefore, the current distribution to the light emitting layer 13 can be improved; and the heat dissipation of the heat of the light emitting layer 13 can be improved.

The surface area of the n-side interconnect layers 22 spreading on the insulating film 18 is greater than the surface area where the n-side interconnect layers 22 connect to the n-side pads 17b by means of the n-side vias 22a.

According to the embodiment, a high light output can be obtained by the light emitting layer 13 spreading over the region that is larger than the n-side electrodes 17a. The n-side electrodes 17a provided in the n-side regions 14b that are narrower than the region including the light emitting layer 13 are drawn out to the side opposite to the light extraction surface (the first surface 15a) as the n-side interconnect layers 22 that have larger surface areas.

As shown in FIG. 2, the first semiconductor layer 11 is electrically connected to the n-side external terminal 24a via the n-side electrodes 17a, the n-side pads 17b, the n-side vias 22a, the n-side interconnect layers 22, the n-side vias 33, the n-side interconnect layer 32, and the n-side metal pillar 24.

As shown in FIG. 3, the second semiconductor layer 12 is electrically connected to the p-side external terminal 23a via the p-side electrode 16a, the p-side pad 16b, the p-side vias 21a, the p-side interconnect layers 21, the p-side vias 34, the p-side interconnect layer 31, and the p-type metal pillar 23.

The p-type metal pillar 23 is thicker than the p-side interconnect layers 21 and thicker than the p-side interconnect layer 31. The n-side metal pillar 24 is thicker than the n-side interconnect layers 22 and thicker than the n-side interconnect layer 32. The thicknesses of the p-type metal pillar 23, the n-side metal pillar 24, and the resin layer 25 are thicker than the semiconductor layer 15. Here, "thickness" refers to the thickness in the vertical direction in FIGS. 2 and 3.

The thicknesses of the p-type metal pillar 23 and the n-side metal pillar 24 are thicker than the thickness of the chip which includes the semiconductor layer 15, the p-side electrode 16a, the p-side pad 16b, the n-side electrodes 17a, and the n-side pads 17b. The aspect ratios (the ratios of the thickness to the planar size) of the metal pillars 23 and 24 are not limited to being 1 or more and may be smaller than 1. In other words, the thicknesses of the metal pillars 23 and 24 may be less than the planar sizes of the metal pillars 23 and 24.

According to the embodiment, even if the substrate used to form the semiconductor layer 15 is removed, the semiconductor layer 15 can be stably supported by the support body including the p-type metal pillar 23, the n-side metal pillar 24, and the resin layer 25; and the mechanical strength of the semiconductor light emitting device 1 can be increased.

Copper, gold, nickel, silver, etc., may be used as the materials of the p-side vias 21a, the p-side interconnect layers 21, the p-side vias 34, the p-side interconnect layer 31, the p-type metal pillar 23, the n-side vias 22a, the n-side interconnect layers 22, the n-side vias 33, the n-side interconnect layer 32, and the n-side metal pillar 24. Among these, good thermal conductivity, high migration resistance, and excellent adhesion with insulating materials are obtained when copper is used.

The resin layer 25 reinforces the p-type metal pillar 23 and the n-side metal pillar 24. It is desirable for the resin layer 25 to have a coefficient of thermal expansion near to or the same as that of the mounting substrate. Examples of such a resin layer 25 include, for example, an epoxy resin, a silicone resin, a fluorocarbon resin, etc.

The stress applied to the semiconductor layer 15 via the solder in the state in which the semiconductor light emitting device 1 is mounted to the mounting substrate via the p-side external terminal 23a and the n-side external terminal 24a can be relaxed by being absorbed by the p-type metal pillar 23 and the n-side metal pillar 24.

The substrate used when forming the semiconductor layer 15 is removed from the first surface 15a. Therefore, the semiconductor light emitting device 1 can be thinner.

Figure 11:
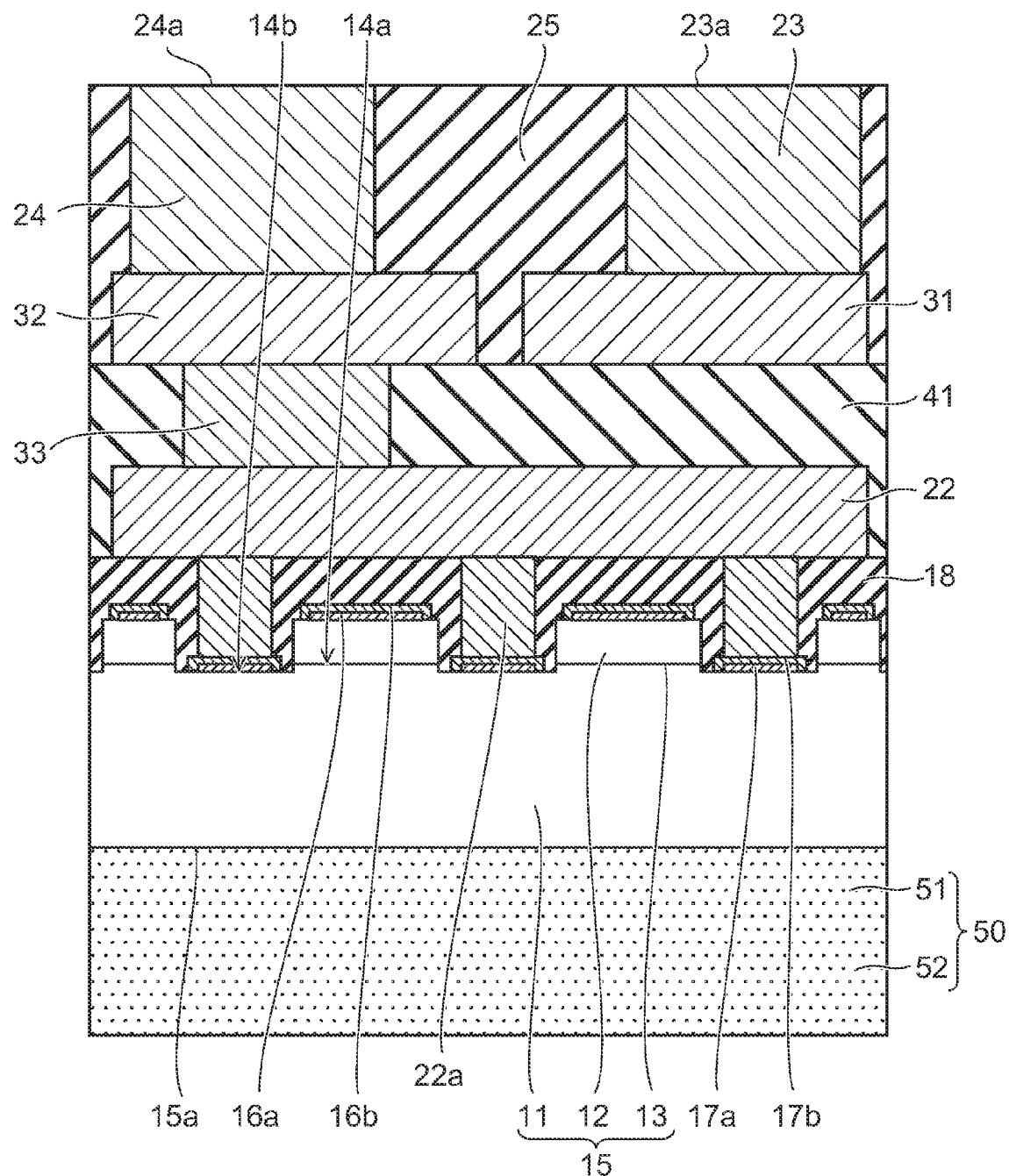
FIG. 11 is a schematic cross-sectional view of another semiconductor light emitting device of the first embodiment.

As shown in FIG. 11, a phosphor layer 50 can be provided on the first surface 15a. The phosphor layer 50 includes a transparent resin 51 as a transparent medium and a phosphor 52 having a multiple particle configuration dispersed in the transparent resin 51.

The transparent resin 51 is transmissive to the light emitted by the light emitting layer 13 and the light emitted by the phosphor 52 and may include, for example, a silicone resin, an acrylic resin, a phenyl resin, etc.

The phosphor 52 is capable of absorbing the emitted light (the excitation light) of the light emitting layer 13 and emitting wavelength-converted light. Therefore, the semiconductor light emitting device of the embodiment is capable of emitting a mixed light of the light emitted by the light emitting layer 13 and the wavelength-converted light of the phosphor 52.

For example, white, lamp, etc., can be obtained as a mixed color of the blue light of the light emitting layer 13 which is the InGaN-based material and the yellow light which is the wavelength-converted light of the phosphor 52 in the case where the phosphor 52 is a yellow phosphor that emits yellow light. The phosphor layer 50 may have a configuration including multiple types of phosphors (e.g., a red phosphor that emits red light and a green phosphor that emits green light).

In the semiconductor light emitting device 1 of the embodiment, the p-side electrode 16a and the n-side electrodes 17a are provided on the second surface on the side opposite to the first surface 15a which is the main extraction surface of the light. Accordingly, the light extraction from the first surface 15a is not impeded by the electrodes. The p-side electrode 16a is provided on the region including the light emitting layer 13. The n-side electrodes 17a are provided on the first semiconductor layer 11 not including the light emitting layer 13.

According to the embodiment, the contact surface between the n-side electrodes 17a and the first semiconductor layer 11, i.e., the n-side regions 14b at the second surface of the first semiconductor layer 11, has a uniform disposition in the second surface in a dot configuration. Therefore, a uniform current distribution in the surface direction of the light emitting layer 13 can be realized while increasing the light emission surface area by reducing the region not including the light emitting layer 13.

Holes are supplied from the p-side electrode 16a to the light emitting layer 13 via the contact surface between the p-side electrode 16a and the second semiconductor layer 12; and electrons are supplied from the n-side electrodes 17a to the light emitting layer 13 via the contact surface between the first semiconductor layer 11 and the n-side electrodes 17a. The current density of the light emitting layer 13 easily increases in the region proximal to the n-side electrodes 17a.

According to the embodiment, the p-side region 14a and the light emitting layer 13 exist completely around the n-side regions 14b and the n-side electrodes 17a. Accordingly, as schematically illustrated by the broken lines in FIG. 4, the current from one n-side electrode 17a can spread 360 degrees around the one n-side electrode 17a; and the current can be supplied efficiently to the entire region of the light emitting layer 13. Accordingly, according to the embodiment, the entire region of the light emitting layer 13 can be efficiently caused to emit light.

Although the multiple n-side electrodes 17a are separated from each other on the second surface of the first semiconductor layer 11, the multiple n-side electrodes 17a are connected to a common n-side interconnect unit on the side opposite to the light extraction surface (the first surface 15a) by which the mounting to the mounting substrate is performed. Therefore, the same potential can be provided to the multiple n-side electrodes 17a by a simple configuration without performing wire bonding to each of the multiple n-side electrodes 17a.

A method for manufacturing the semiconductor light emitting device 1 of the first embodiment will now be described with reference to FIG. 4 to FIG. 10B.

Figure 9A:
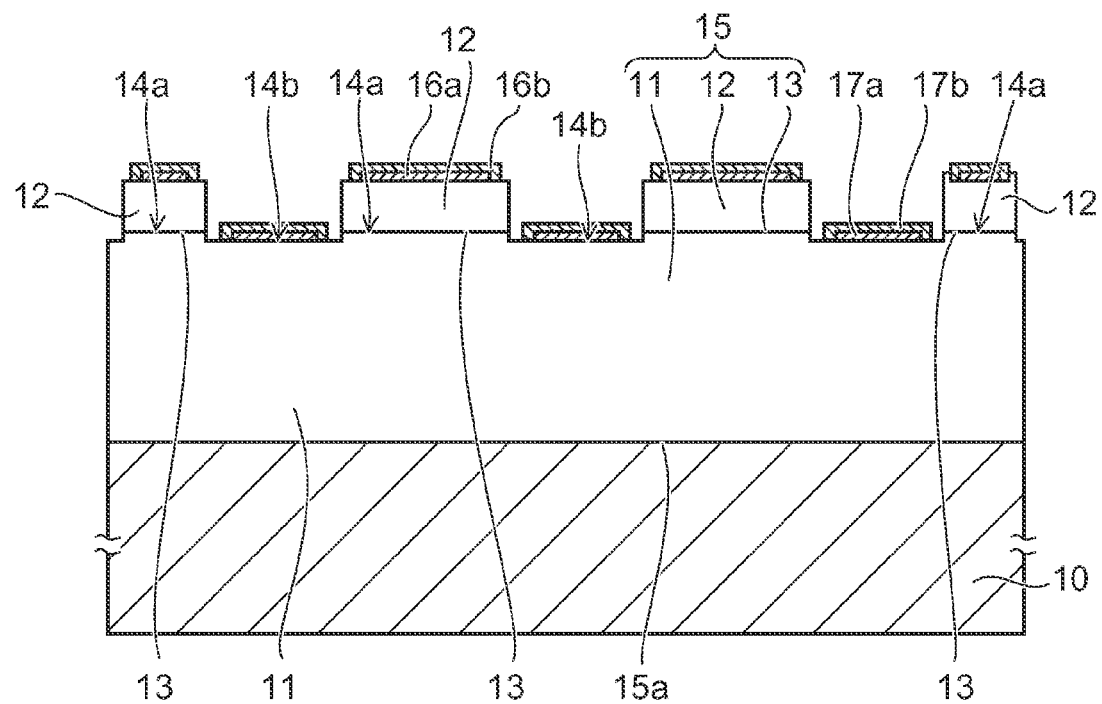
FIG. 9A to FIG. 10B are schematic cross-sectional views showing a method for manufacturing the semiconductor light emitting device of the first embodiment.
Figure 9B:
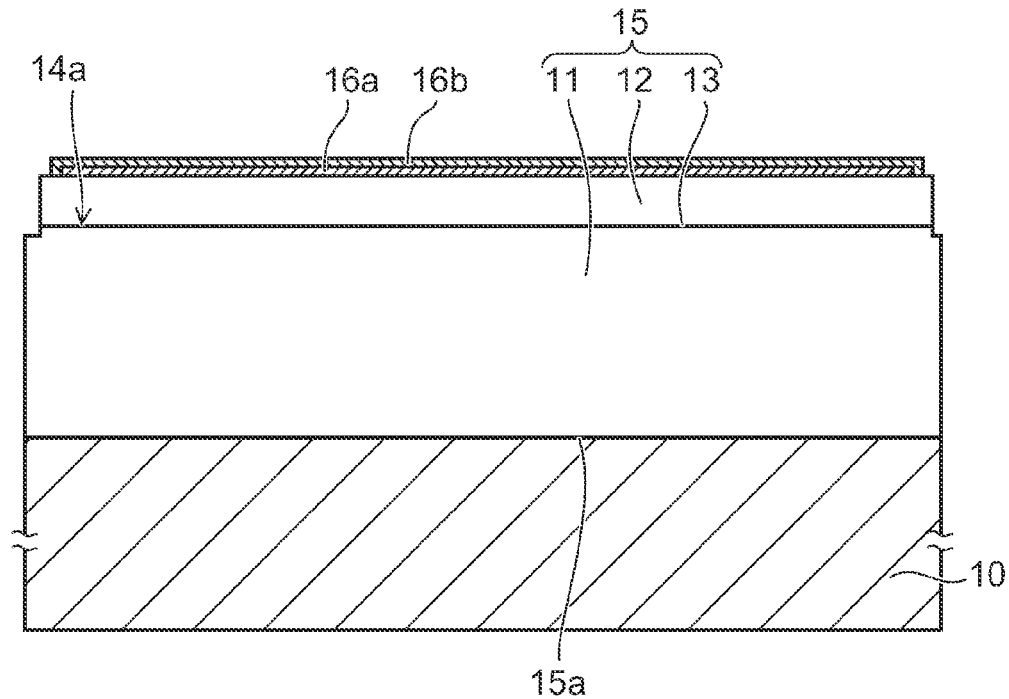

FIG. 9A is the A-A' cross section of FIG. 4; and FIG. 9B is the B-B' cross section of FIG. 4.

The semiconductor layer 15 is formed on a substrate 10. First, the first semiconductor layer 11 is formed on the major surface of the substrate 10; the light emitting layer 13 is formed on the first semiconductor layer 11; and the second semiconductor layer 12 is formed on the light emitting layer 13.

Crystal growth of the semiconductor layer 15 which is a nitride semiconductor of $In_xAl_yGa_{1-x-y}N$ ($0 \leq x \leq$, $0 \leq y \leq 1$, and $x+y \leq 1$) may be performed by, for example, MOCVD (metal organic chemical vapor deposition) on a sapphire substrate. Or, a silicon substrate may be used as the substrate 10.

The semiconductor layer 15 is formed on the entire surface of the substrate 10. Subsequently, a portion of the first semiconductor layer 11 is exposed by removing a portion of the light emitting layer 13 and the second semiconductor layer 12 as shown in FIG. 9A by, for example, RIE (Reactive Ion Etching) using a not-shown resist. The first semiconductor layer 11 is selectively exposed in a dot configuration or an island configuration.

The regions where the first semiconductor layer 11 is exposed are the n-side regions 14b which do not include the light emitting layer 13 and the second semiconductor layer 12. The region where the second semiconductor layer 12 and the light emitting layer 13 are left is the p-side region 14a.

The n-side electrodes 17a and the n-side pads 17b are formed on the n-side regions 14b. The p-side electrode 16a and the p-side pad 16b are formed on the front surface of the second semiconductor layer 12 of the p-side region 14a.

For example, a silicon nitride film and/or a silicon oxide film may be formed by CVD (chemical vapor deposition) as a passivation film on the end surface (the side surface) of the light emitting layer 13 between the p-side pad 16b and the n-side pads 17b.

Figure 10A:
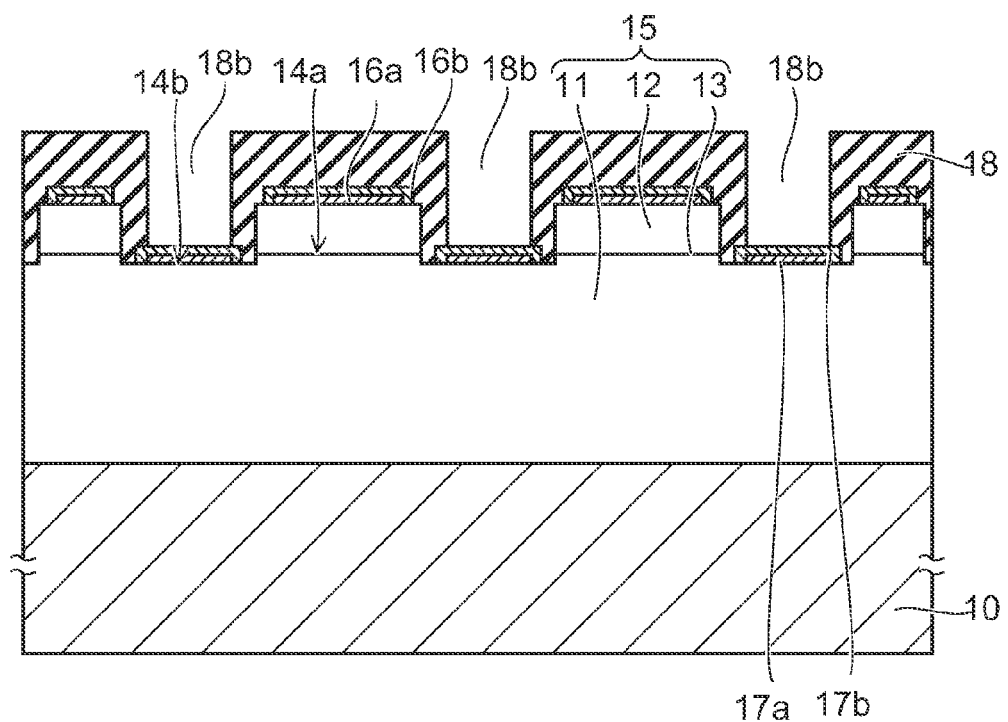
Figure 10B:
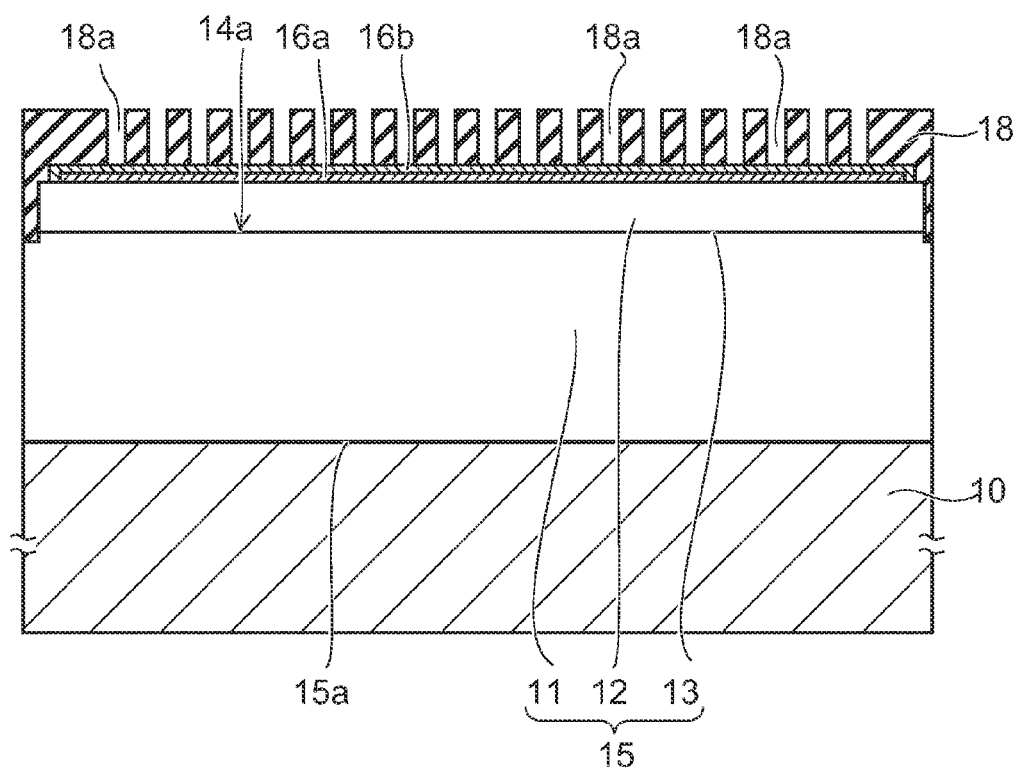

Then, after covering all of the exposed portions on the major surface of the substrate 10 with the insulating film 18 shown in FIGS. 10A and 10B, first openings 18a and second openings 18b are made selectively in the insulating film 18 by patterning the insulating film 18 by etching. FIGS. 10A and 10B correspond to the cross sections of FIGS. 9A and 9B, respectively.

As shown in FIG. 10B, the first openings 18a are multiply formed; and each of the first openings 18a reaches the p-side pad 16b. As shown in FIG. 10A, the second openings 18b are made respectively on the multiple n-side pads 17b; and the second openings 18b respectively reach the n-side pads 17b.

FIG. 10A shows a cross section along the first direction X of FIG. 4; and the first openings 18a are not made on the p-side pad 16b between the n-side regions 14b adjacent to each other in the first direction X. Accordingly, the p-side vias 21a filled into the first openings 18a are not formed on the p-side pad 16b between the n-side regions 14b adjacent to each other in the first direction X.

An organic material such as, for example, photosensitive polyimide, benzocyclobutene, etc., may be used as the insulating film 18. In such a case, direct exposure and developing of the insulating film 18 are possible without using a resist.

Or, an inorganic film such as a silicon nitride film, a silicon oxide film, etc., may be used as the insulating film 18. In the case where the insulating film 18 is the inorganic film, the first openings 18a and the second openings 18b are made by etching after a resist formed on the insulating film 18 is patterned.

Then, Cu electroplating is performed using a not-shown metal film as a seed metal (a current path) after forming the metal film on the front surface of the insulating film 18, the inner walls (the side walls and the bottom portions) of the first openings 18a, and the inner walls (the side walls and the bottom portions) of the second openings 18b.

Thereby, as shown in FIGS. 2, 3, and 5, the p-side vias 21a are formed inside the first openings 18a; the n-side vias 22a are formed inside the second openings 18b; and the p-side interconnect layers 21 and the n-side interconnect layers 22 are formed on the insulating film 18. The p-side vias 21a, the n-side vias 22a, the p-side interconnect layers 21, and the n-side interconnect layers 22 are made of, for example, a copper material formed simultaneously by plating using a not-shown plating resist.

Then, as shown in FIGS. 2 and 3, the insulating film 41 is formed on the p-side interconnect layers 21 and on the n-side interconnect layers 22. Continuing, similarly to the interconnect units of the first layer including the p-side vias 21a, the n-side vias 22a, the p-side interconnect layers 21, and the n-side interconnect layers 22 described above, the interconnect units of the second layer including the p-side vias 34, the n-side vias 33, the p-side interconnect layer 31, and the n-side interconnect layer 32 shown in FIGS. 2, 3, 7, and 8 are formed by Cu electroplating. Cu electroplating also is used to form the p-type metal pillar 23 on the p-side interconnect layer 31 and to form the n-side metal pillar 24 on the n-side interconnect layer 32.

After forming the p-type metal pillar 23 and the n-side metal pillar 24, the resin layer 25 is stacked on the insulating film 41. The resin layer 25 covers the p-side interconnect layer 31, the n-side interconnect layer 32, the p-type metal pillar 23, and the n-side metal pillar 24.

Then, the substrate 10 described above that is used to form the semiconductor layer 15 is removed. In the case where the substrate 10 is the sapphire substrate, the substrate 10 can be removed by, for example, laser lift-off. Specifically, laser light is irradiated from the back surface side of the substrate 10 toward the first semiconductor layer 11. The substrate 10 is transmissive to the laser light; and the laser light has a wavelength in the absorption region of the first semiconductor layer 11.

When the laser light reaches the interface between the substrate 10 and the first semiconductor layer 11, the first semiconductor layer 11 proximal to the interface decomposes by absorbing the energy of the laser light. The first semiconductor layer 11 decomposes into gallium (Ga) and nitrogen gas. A micro gap is made between the substrate 10 and the first semiconductor layer 11 by this decomposition reaction; and the substrate 10 and the first semiconductor layer 11 separate.

The irradiation of the laser light is performed over the entire wafer by performing multiply for every set region; and the substrate 10 is removed.

In the case where the substrate 10 is the silicon substrate, the substrate 10 can be removed by etching.

Because the stacked body described above formed on the major surface of the substrate 10 is reinforced by the p-type metal pillar 23, the n-side metal pillar 24, and the resin layer 25 that are thicker than the semiconductor layer 15, it is possible to maintain the wafer state even in the case where there is no substrate 10.

The resin layer 25 and the metals included in the p-type metal pillar 23 and the n-side metal pillar 24 are materials more flexible than the semiconductor layer 15. The semiconductor layer 15 is supported by such a flexible support body.

Therefore, destruction of the semiconductor layer 15 can be avoided even in the case where the large internal stress generated in the epitaxial growth of the semiconductor layer 15 on the substrate 10 is relieved all at once when peeling the substrate 10.

The first surface 15a of the semiconductor layer 15, from which the substrate 10 is removed, is cleaned. For example, the gallium (Ga) adhered to the first surface 15a is removed using dilute hydrofluoric acid, etc.

Subsequently, we etching of the first surface 15a is performed using, for example, a KOH (potassium hydroxide) aqueous solution, TMAH (tetramethylammonium hydroxide), etc. Thereby, an unevenness is formed in the first surface 15a due to the difference of the etching rates that depend on the crystal plane orientation. Or, the unevenness may be formed in the first surface 15a by performing etching after the patterning using the resist. The light extraction efficiency can be increased by the unevenness being formed in the first surface 15a.

If necessary, the phosphor layer 50 shown in FIG. 11 is formed on the first surface 15a. The liquid transparent resin 51 into which the phosphor 52 is dispersed is thermally cured after being supplied onto the first surface 15a by a method such as, for example, printing, potting, molding, compression molding, etc.

Subsequently, singulation into the multiple semiconductor light emitting devices 1 is performed by cutting the stacked body recited above. For example, the cutting is performed using a dicing blade. Or, the cutting may be performed using laser irradiation.

The semiconductor light emitting device 1 that is singulated may have a single-chip structure including one semiconductor layer 15 or may have a mufti-chip structure including multiple semiconductor layers 15.

Because each of the processes described above until the dicing is performed can be performed collectively in the wafer state, it is unnecessary to perform the interconnects and the packaging for every singulated individual device; and it becomes possible to drastically reduce the production costs. In other words, the interconnects and the packaging are already complete in the singulated state. Therefore, the productivity can be increased; and as a result, price reductions become easy.

Second Embodiment

Figure 12:
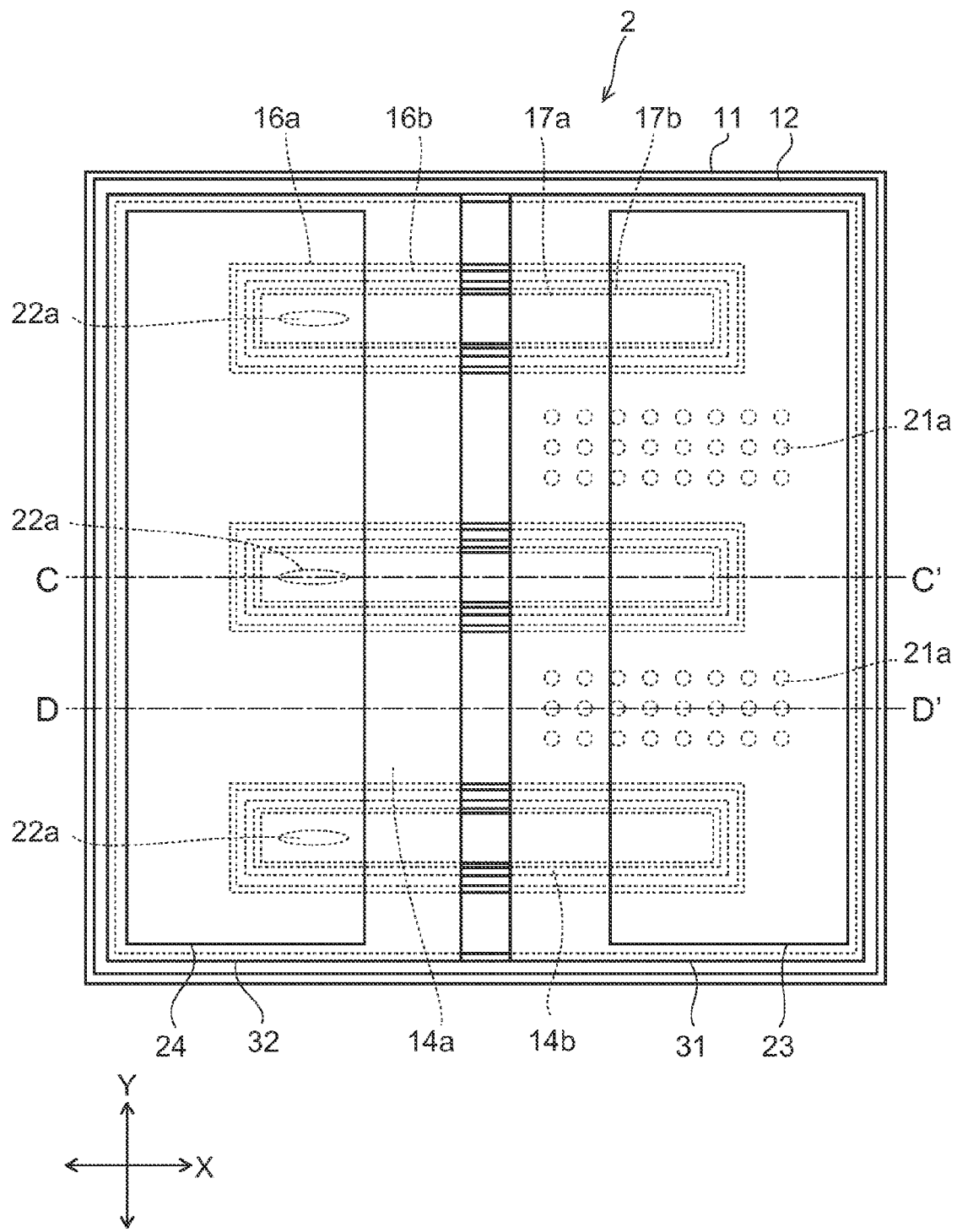
FIG. 12 is a schematic plan view of a semiconductor light emitting device of a second embodiment.

FIG. 12 is a schematic plan view of a semiconductor light emitting device 2 of a second embodiment.

Figure 13:
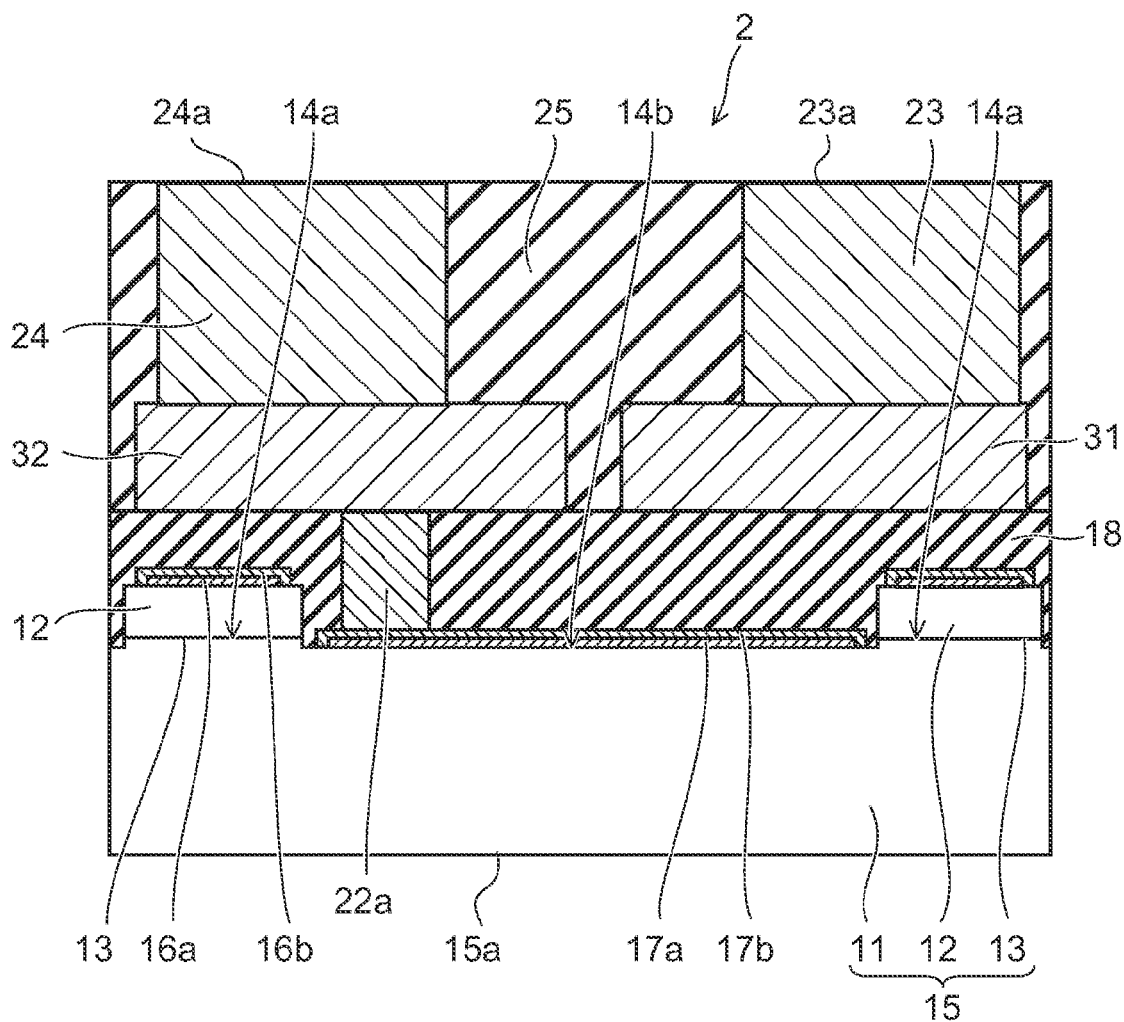
FIG. 13 is the C-C' cross-sectional view of FIG. 12.

FIG. 13 is the C-C' cross-sectional view of FIG. 12.

Figure 14:
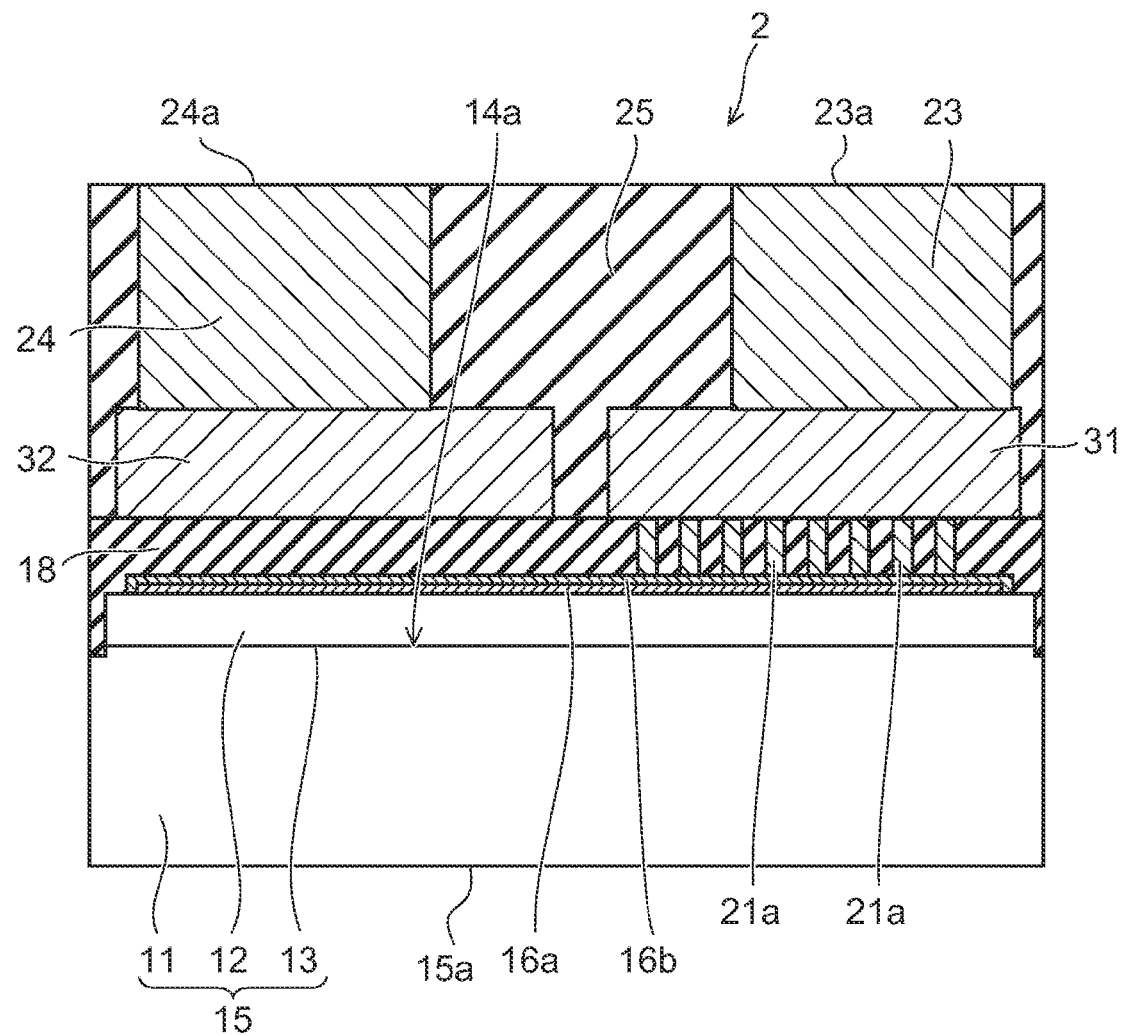
FIG. 14 is the D-D' cross-sectional view of FIG. 12.

FIG. 14 is the D-D' cross-sectional view of FIG. 12.

The semiconductor light emitting device 2 of the second embodiment also includes the semiconductor layer 15; and the semiconductor layer 15 includes the first semiconductor layer 11, the second semiconductor layer 12, and the light emitting layer 13 of $In_xAl_yGa_{1-x-y}N$ ($0 \leq x \leq 1$, $0 \leq y \leq 1$, and $x+y \leq 1$).

FIG. 12 shows the second surface side which is the side opposite to the first surface 15a of the semiconductor layer 15 and shows the planar layout of the components other than the insulating films and the resin layers.

In the second embodiment as well, the n-side electrodes 17a and the n-side pads 17b are provided on the n-side regions 14b of the first semiconductor layer 11 not including the light emitting layer 13 and the second semiconductor layer 12.

The light emitting layer 13 and the second semiconductor layer 12 are provided on the p-side region 14a which is the region of the second surface of the first semiconductor layer 11 other than the n-side regions 14b. The p-side electrode 16a and the p-side pad 16b are provided on the front surface of the second semiconductor layer 12.

According to the second embodiment, the planar layout of the n-side regions 14b, the n-side electrodes 17a provided on the n-side regions 14b, and the n-side pads 17b provided on the n-side regions 14b is different from that of the first embodiment.

Figure 15:
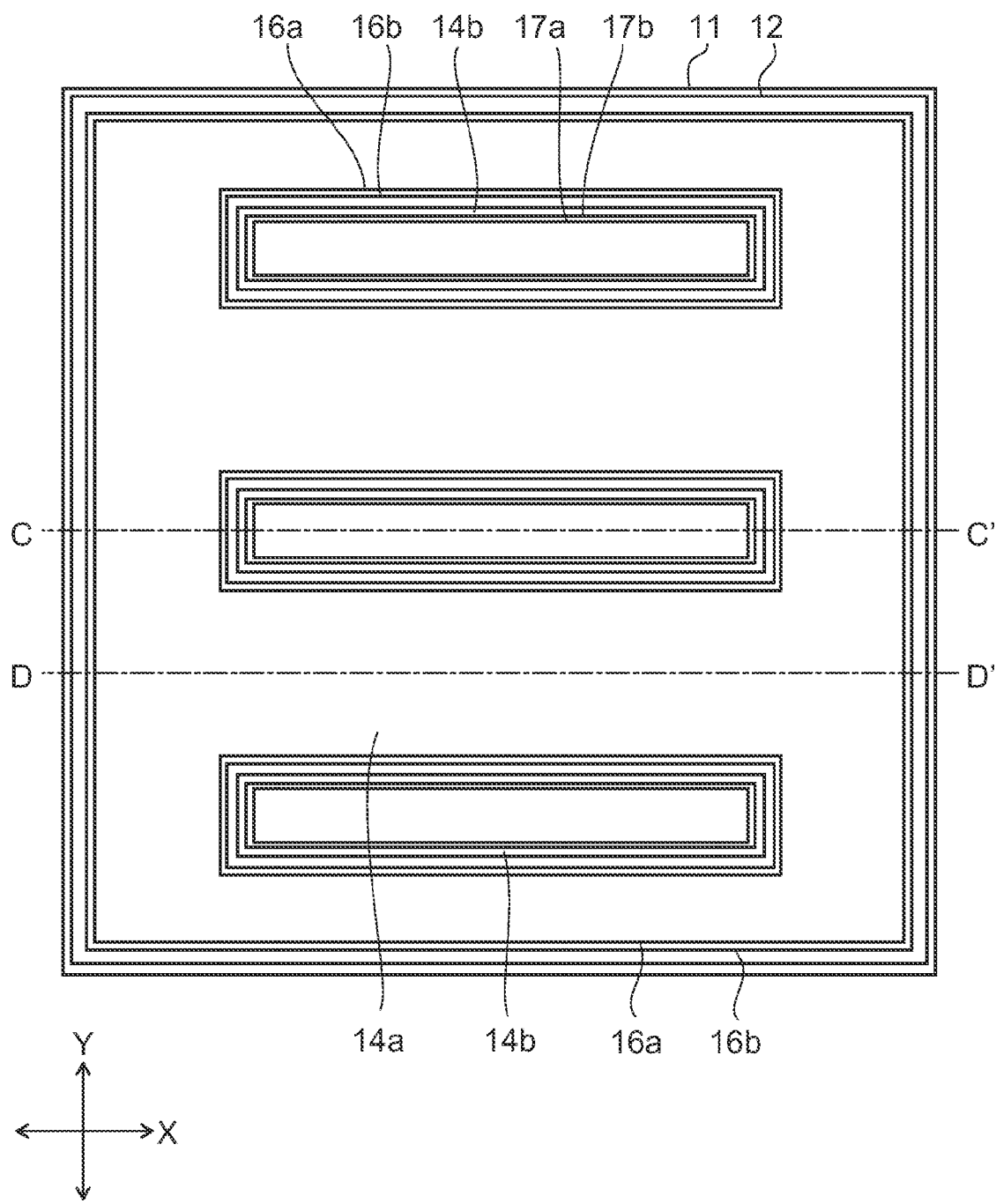
FIG. 15 to FIG. 17 are schematic plan views showing a method for manufacturing the semiconductor light emitting device of the second embodiment.

FIG. 15 shows the planar layout of the p-side region 14a, the n-side regions 14b, the p-side electrode 16a, the p-side pad 16b, the n-side electrodes 17a, and the n-side pads 17b on the second surface.

Multiple (in the illustrations, e.g., three) n-side regions 14b are uniformly disposed inside the p-side region 14a which is spread over the entire second surface. Each of the n-side regions 14b is formed as a region having, for example, a rectangular configuration. At the second surface, the multiple n-side regions 14b are separated from each other without being linked; and the p-side region 14a is provided around each of the n-side regions 14b.

The n-side electrodes 17a are provided respectively on the multiple n-side regions 14b. The multiple n-side electrodes 17a are formed in rectangular configurations on the second surface.

As shown in FIG. 13, the second semiconductor layer 12 is provided around each of the n-side electrodes 17a and n-side pads 17b. The n-side regions 14b of the first semiconductor layer 11, the n-side electrodes 17a provided on the n-side regions 14b, and the n-side pads 17b covering the n-side electrodes 17a are partitioned by the light emitting layer 13 and the second semiconductor layer 12 stacked on the light emitting layer 13 and are separated into a plurality on the second surface.

As shown in FIGS. 13 and 14, the insulating film 18 is provided on the second surface side of the semiconductor layer 15. The insulating film 18 covers the n-side regions 14b, the front surface of the second semiconductor layer 12, the side surface of the second semiconductor layer 12, the side surface of the light emitting layer 13, the p-side pad 16b, and the n-side pads 17b.

There are cases where another insulating film (e.g., a silicon oxide film) is provided between the insulating film 18 and the semiconductor layer 15. The insulating film 18 is, for example, a resin such as polyimide, etc., having excellent patternability of fine openings. Or, an inorganic film such as a silicon oxide film, a silicon nitride film, etc., may be used as the insulating film 18.

The second embodiment differs from the first embodiment in that the p-side interconnect layer and the n-side interconnect layer having single-layer structures are provided on the insulating film 18. The n-side interconnect layer 32 and the p-side interconnect layer 31 are provided on the front surface of the insulating film 18 on the side opposite to the semiconductor layer 15.

Figure 16:
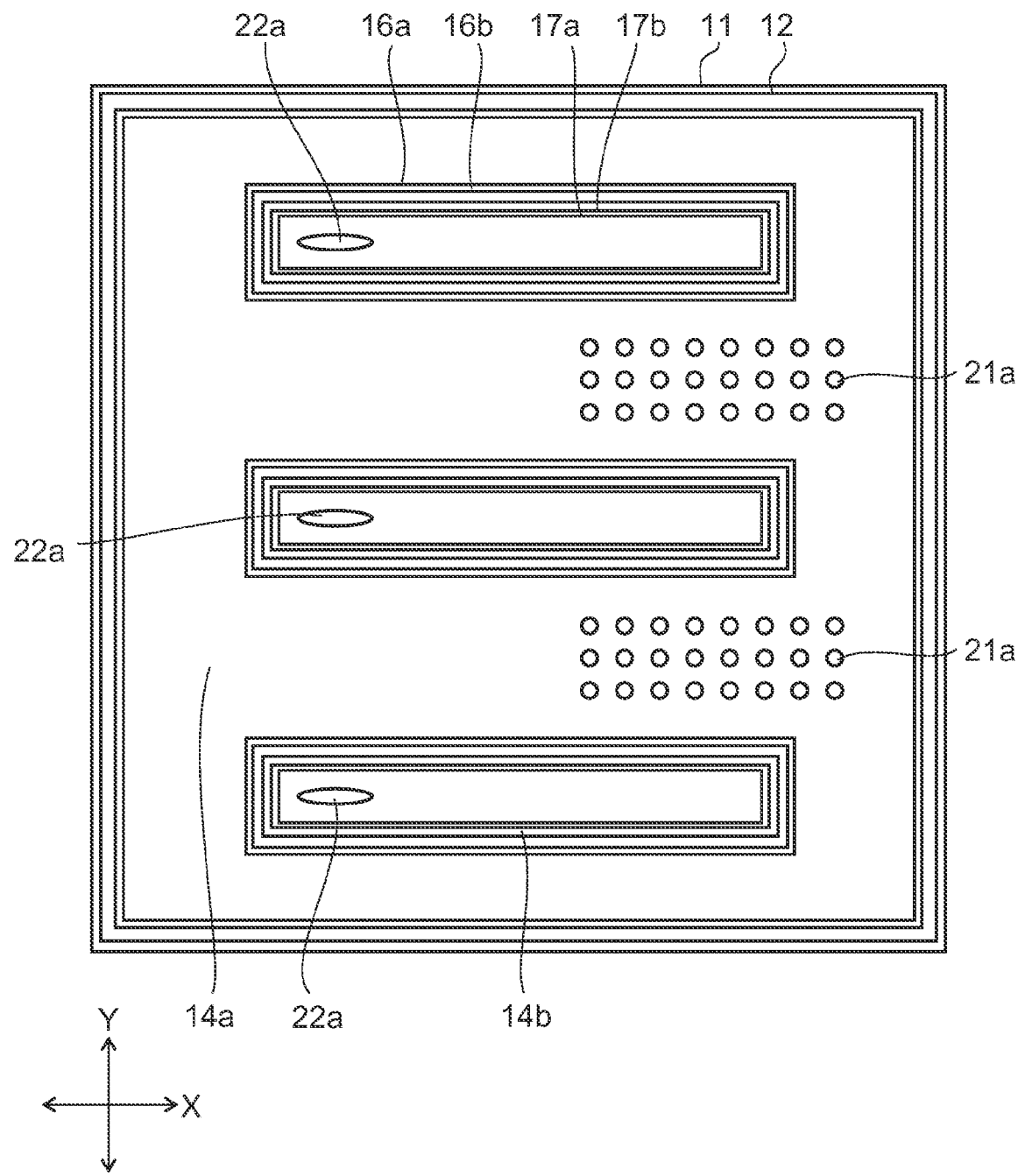

As shown in FIGS. 13 and 16, the n-side vias 22a are provided respectively on the multiple n-side pads 17b by piercing the insulating film 18. The n-side interconnect layer 32 is electrically connected to the n-side pads 17b and the n-side electrodes 17a by means of the n-side vias 22a.

As shown in FIGS. 14 and 16, the multiple p-side vias 21a are provided on the p-side pad 16b by piercing the insulating film 18. The p-side interconnect layer 31 is electrically connected to the p-side pad 16b and the p-side electrode 16a by means of the p-side vias 21a.

Figure 17:
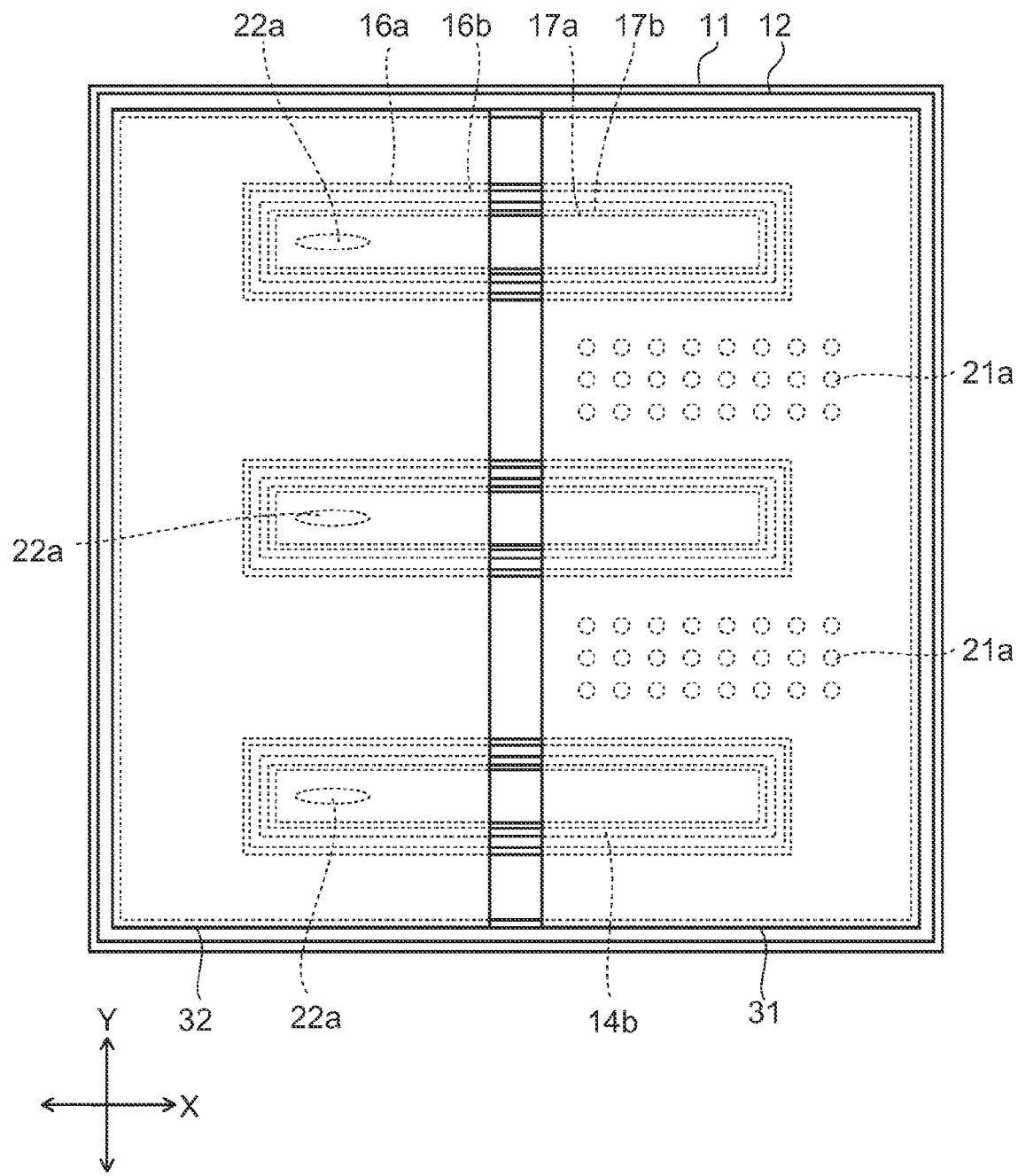

FIG. 16 shows the planar layout of the n-side vias 22a and the p-side vias 21a; and FIG. 17 is a plan view in which the n-side interconnect layer 32 and the p-side interconnect layer 31 are overlaid onto FIG. 16.

The n-side vias 22a and the p-side vias 21a are provided to be divided into the left and right with respect to the center in the first direction X. In FIGS. 16 and 17, the n-side vias 22a are provided in the region on the left side of the center in the first direction X; and the p-side vias 21a are provided in the region on the right side of the center in the first direction X.

The n-side interconnect layer 32 spreads in a region on the left side of the center in the first direction X in FIG. 17. The multiple n-side electrodes 17a are electrically connected respectively by means of the n-side vias 22a to one common n-side interconnect layer 32.

The p-side interconnect layer 31 spreads in a region on the right side of the center in the first direction X in FIG. 17. The p-side electrode 16a that spreads over the entire second surface other than the n-side regions 14b is electrically connected by means of the multiple p-side vias 21a to one common p-side interconnect layer 31.

The n-side interconnect layer 32 and the p-side interconnect layer 31 spread to be divided into the left and right with the same surface area with the center in the first direction X interposed. The n-side interconnect layer 32 and the p-side interconnect layer 31 are separated from each other on the insulating film 18.

As shown in FIGS. 12, 13, and 14, the p-type metal pillar 23 is provided on the p-side interconnect layer 31. The p-side interconnect layer 31 and the p-type metal pillar 23 are included in the p-side interconnect unit of the embodiment. The n-side metal pillar 24 is provided on the n-side interconnect layer 32. The n-side interconnect layer 32 and the n-side metal pillar 24 are included in the n-side interconnect unit of the embodiment.

The resin layer 25 is stacked on the insulating film 18. The resin layer 25 covers the periphery of the n-side interconnect layer 32, the periphery of the n-side metal pillar 24, the periphery of the p-side interconnect layer 31, and the periphery of the p-type metal pillar 23. The resin layer 25 is filled between the p-side interconnect layer 31 and the n-side interconnect layer 32 and between the p-type metal pillar 23 and the n-side metal pillar 24.

The side surface of the p-type metal pillar 23 and the side surface of the n-side metal pillar 24 are covered with the resin layer 25. The surface of the p-type metal pillar 23 on the side opposite to the p-side interconnect layer 31 is exposed from the resin layer 25 and functions as the p-side external terminal 23a. The surface of the n-side metal pillar 24 on the side opposite to the n-side interconnect layer 32 is exposed from the resin layer 25 and functions as the n-side external terminal 24a.

The p-side external terminal 23a and the n-side external terminal 24a are bonded to pads formed in a not-shown mounting substrate via solder, etc.

The surface area of the p-side interconnect layer 31 contacting the p-side pad 16b by means of the multiple p-side vias 21a is greater than the surface area of the n-side interconnect layer 32 contacting the n-side pads 17b by means of the multiple n-side vias 22a. Therefore, the current distribution to the light emitting layer 13 can be improved; and the heat dissipation of the heat of the light emitting layer 13 can be improved.

The surface area of the n-side interconnect layer 32 spreading on the insulating film 18 is greater than the surface area where the n-side interconnect layer 32 connects the n-side pads 17b by means of the n-side vias 22a.

According to the second embodiment, a high light output can be obtained by the light emitting layer 13 spreading over a region that is larger than the n-side electrodes 17a. Also, the n-side electrodes 17a provided in the n-side regions 14b that are narrower than the region including the light emitting layer 13 are drawn out to the side opposite to the light extraction surface (the first surface 15a) as the n-side interconnect layer 32 that has a larger surface area.

As shown in FIG. 13, the first semiconductor layer 11 is electrically connected to the n-side external terminal 24a via the n-side electrodes 17a, the n-side pads 17b, the n-side vias 22a, the n-side interconnect layer 32, and the n-side metal pillar 24.

As shown in FIG. 14, the second semiconductor layer 12 is electrically connected to the p-side external terminal 23a via the p-side electrode 16a, the p-side pad 16b, the p-side vias 21a, the p-side interconnect layer 31, and the p-type metal pillar 23.

The p-type metal pillar 23 is thicker than the p-side interconnect layer 21 and thicker than the p-side interconnect layer 31. The n-side metal pillar 24 is thicker than the n-side interconnect layers 22 and thicker than the n-side interconnect layer 32. The thicknesses of the p-type metal pillar 23, the n-side metal pillar 24, and the resin layers 25 are thicker than the semiconductor layer 15. The thicknesses of the p-type metal pillar 23 and the n-side metal pillar 24 are thicker than the thickness of the chip which includes the semiconductor layer 15, the p-side electrode 16a, the p-side pad 16b, the n-side electrodes 17a, and the n-side pads 17b.

According to the second embodiment, the semiconductor layer 15 can be stably supported by the support body including the p-type metal pillar 23, the n-side metal pillar 24, and the resin layer 25 even if the substrate used to form the semiconductor layer 15 is removed; and the mechanical strength of the semiconductor light emitting device 1 can be increased.

The stress applied to the semiconductor layer 15 via the solder in the state in which the semiconductor light emitting device 2 is mounted to the mounting substrate via the p-side external terminal 23a and the n-side external terminal 24a can be relaxed by being absorbed by the p-type metal pillar 23 and the n-side metal pillar 24.

The substrate used when forming the semiconductor layer 15 is removed from the first surface 15a. Therefore, the semiconductor light emitting device 2 can be thinner.

Figure 20:
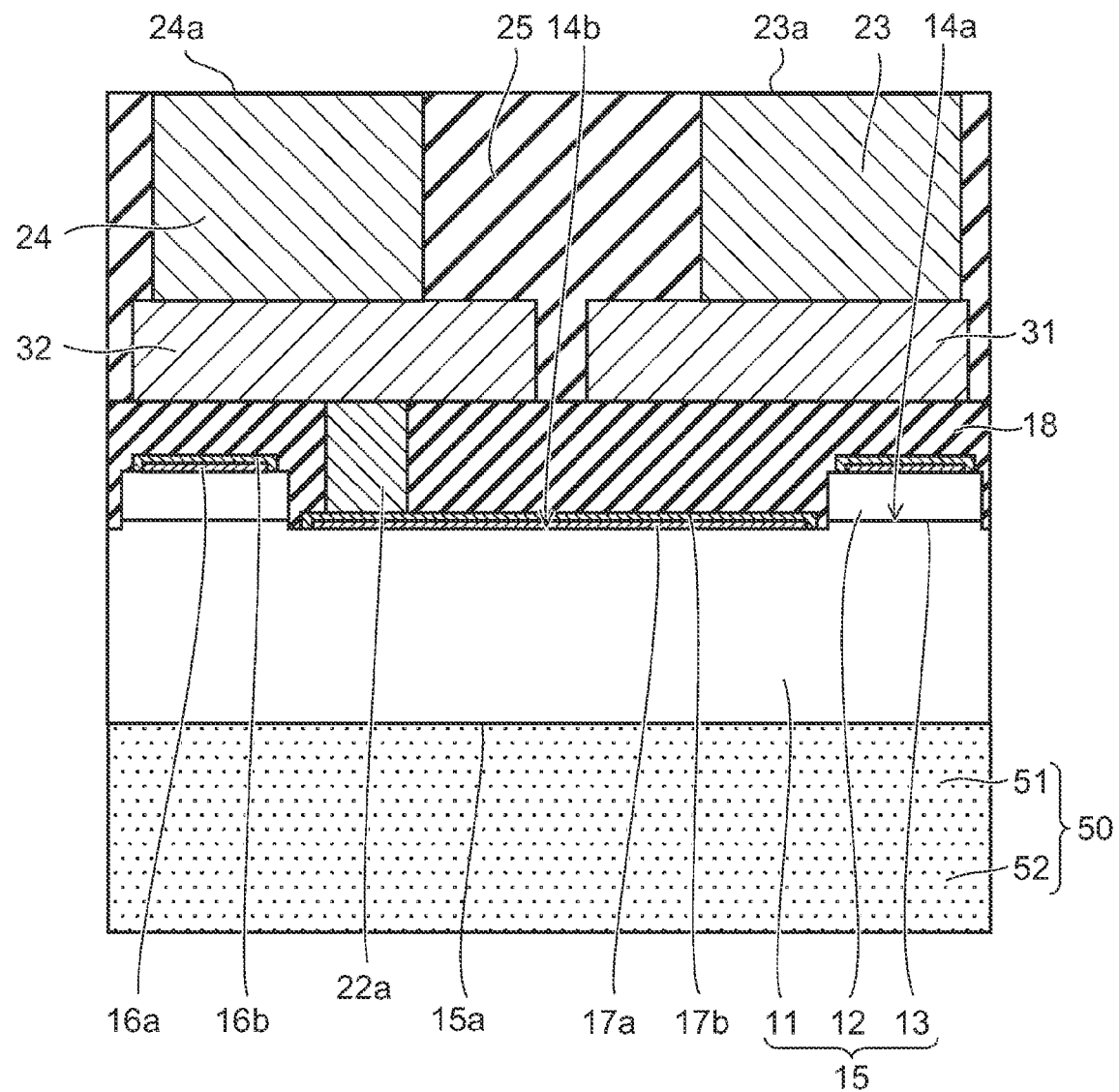
FIG. 20 is a schematic cross-sectional view of another semiconductor light emitting device of the second embodiment.

As shown in FIG. 20, the phosphor layer 50 can be provided on the first surface 15a. The phosphor layer 50 includes the transparent resin 51 as a transparent medium and the phosphor 52 having a multiple particle configuration dispersed in the transparent resin 51.

The transparent resin 51 is transmissive to the light emitted by the light emitting layer 13 and the light emitted by the phosphor 52 and may include, for example, a silicone resin, an acrylic resin, a phenyl resin, etc.

The phosphor 52 is capable of absorbing the emitted light (the excitation light) of the light emitting layer 13 and emitting a wavelength-converted light. Therefore, the semiconductor light emitting device of the second embodiment is capable of emitting a mixed light of the light emitted by the light emitting layer 13 and the wavelength-converted light of the phosphor 52.

For example, white, lamp, etc., can be obtained as a mixed color of the blue light of the light emitting layer 13 which is the InGaN-based material and the yellow light which is the wavelength-converted light of the phosphor 52 in the case where the phosphor 52 is a yellow phosphor that emits yellow light. The phosphor layer 50 may have a configuration including multiple types of phosphors (e.g., a red phosphor that emits red light and a green phosphor that emits green light).

In the semiconductor light emitting device 2 of the second embodiment, the p-side electrode 16a and the n-side electrodes 17a are provided on the second surface on the side opposite to the first surface 15a which is the main extraction surface of the light. Accordingly, the light extraction from the first surface 15a is not impeded by the electrodes. The p-side electrode 16a is provided on the region including the light emitting layer 13. The n-side electrodes 17a are provided on the first semiconductor layer 11 not including the light emitting layer 13.

According to the second embodiment, the contact surface between the n-side electrodes 17a and the first semiconductor layer 11, i.e., the n-side regions 14b at the second surface of the first semiconductor layer 11, have a uniform disposition in the second surface. Therefore, a uniform current distribution in the surface direction of the light emitting layer 13 can be realized while increasing the light emission surface area by reducing the region not including the light emitting layer 13.

In the second embodiment as well, the p-side region 14a and the light emitting layer 13 exist completely around the n-side regions 14b and the n-side electrodes 17a. Accordingly, the current spreads from one n-side electrode 17a to the entire peripheral region of the one n-side electrode 17a; and the current can be supplied efficiently to the entire region of the light emitting layer 13. Accordingly, according to the second embodiment, the entire region of the light emitting layer 13 can be efficiently caused to emit light.

Although the multiple n-side electrodes 17a are separated from each other on the second surface of the first semiconductor layer 11, the multiple n-side electrodes 17a are connected on the side opposite to the light extraction surface (the first surface 15a) to a common n-side interconnect unit by which the mounting to the mounting substrate is performed. Therefore, the same potential can be provided to the multiple n-side electrodes 17a by a simple configuration without performing wire bonding to each of the multiple n-side electrodes 17a.

A method for manufacturing the semiconductor light emitting device 2 of the second embodiment will now be described with reference to FIG. 15 to FIG. 19B.

Figure 18A:
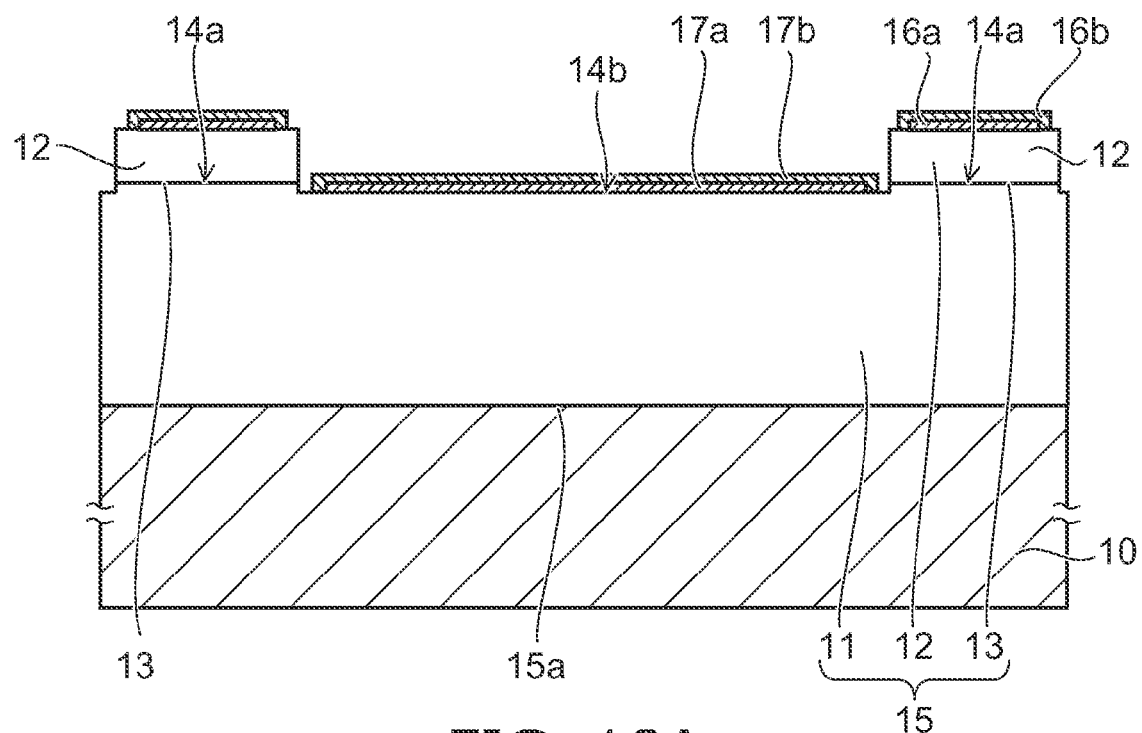
FIG. 18A to FIG. 19B are schematic cross-sectional views showing a method for manufacturing the semiconductor light emitting device of the second embodiment.
Figure 18B:
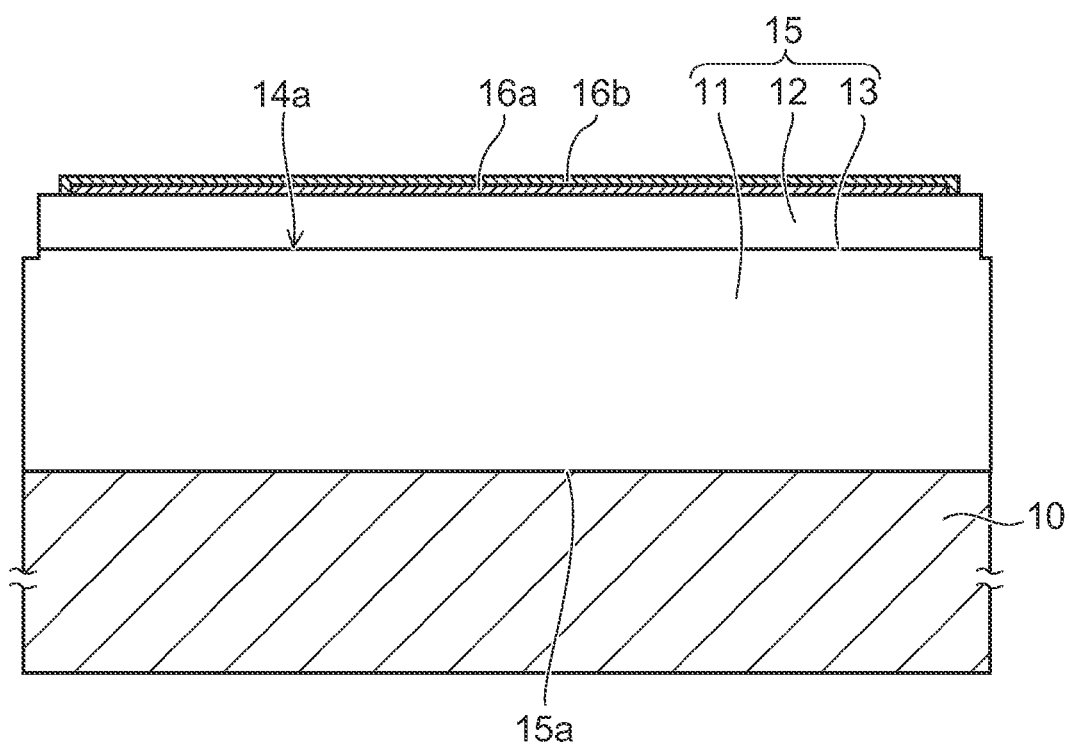

FIG. 18A shows the C-C' cross section of FIG. 15; and FIG. 18B shows the D-D' cross section of FIG. 15.

Similarly to the first embodiment, the semiconductor layer 15 is formed on the entire surface of the substrate 10. Subsequently, a portion of the first semiconductor layer 11 is exposed by removing a portion of the light emitting layer 13 and the second semiconductor layer 12 as shown in FIG. 18A by, for example, RIE using a not-shown resist. The first semiconductor layer 11 is selectively exposed in a rectangular configuration.

The regions where the first semiconductor layer 11 is exposed are the n-side regions 14b which do not include the light emitting layer 13 and the second semiconductor layer 12. The region where the second semiconductor layer 12 and the light emitting layer 13 are left is the p-side region 14a.

The n-side electrodes 17a and the n-side pads 17b are formed on the n-side regions 14b. The p-side electrode 16a and the p-side pad 16b are formed on the front surface of the second semiconductor layer 12 of the p-side region 14a.

For example, a silicon nitride film and/or a silicon oxide film may be formed by CVD as a passivation film between the p-side pad 16b and the n-side pads 17b and/or on the end surface (the side surface) of the light emitting layer 13.

Figure 19A:
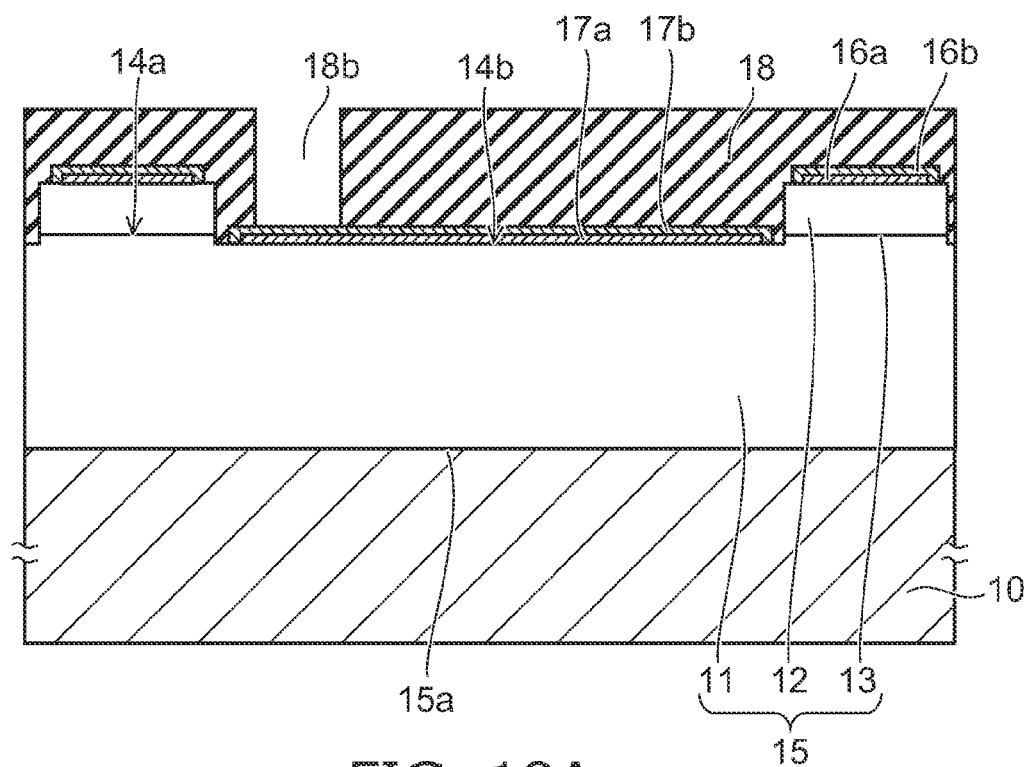
Figure 19B:
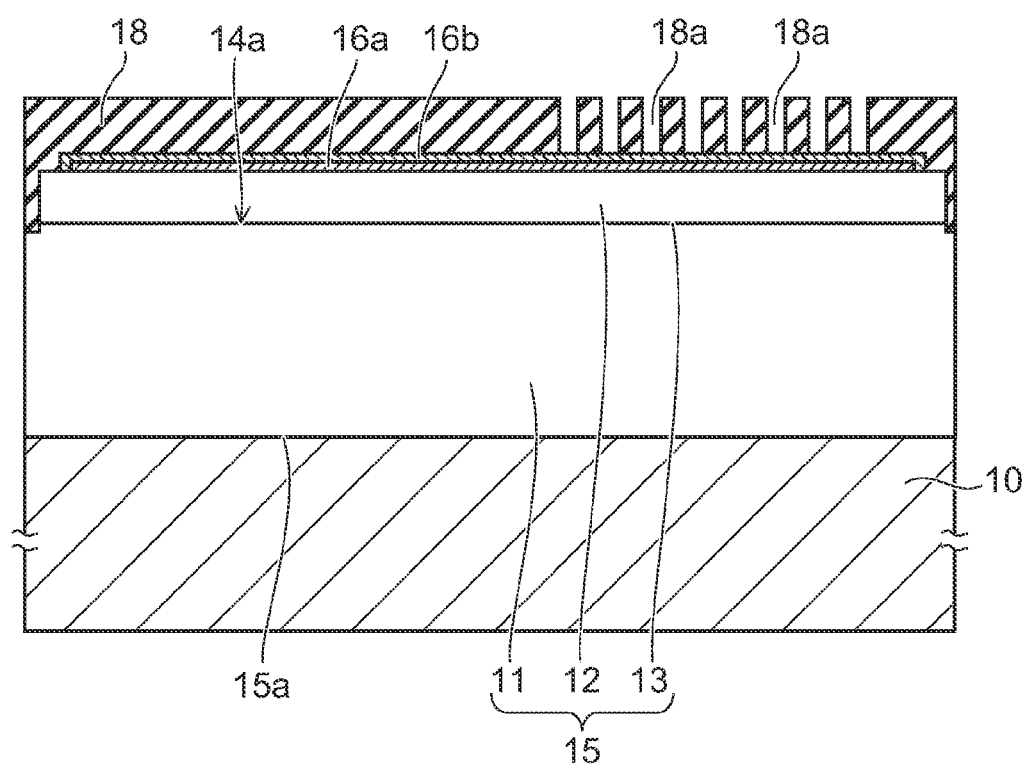

Then, after all of the exposed portions on the major surface of the substrate 10 are covered with the insulating film 18 shown in FIGS. 19A and 19B, the first openings 18a and the second openings 18b are made selectively in the insulating film 18 by patterning the insulating film 18 by etching. FIGS. 19A and 19B correspond to cross sections of FIGS. 18A and 18B, respectively.

As shown in FIG. 19B, the first openings 18a are multiply formed; and each of the first openings 18a reaches the p-side pad 16b. As shown in FIG. 19A, the second openings 18b are made respectively on the multiple n-side pads 17b; and the second openings 18b respectively reach the n-side pads 17b.

Then, Cu electroplating is performed using a not-shown metal film as a seed metal (a current path) after forming the metal film on the front surface of the insulating film 18, the inner walls (the side walls and the bottom portions) of the first openings 18a, and the inner walls (the side walls and the bottom portions) of the second openings 18b.

Thereby, as shown in FIGS. 13, 14, 16, and 17, the p-side vias 21a are formed inside the first openings 18a; the n-side vias 22a are formed inside the second openings 18b; and the p-side interconnect layer 31 and the n-side interconnect layer 32 are formed on the insulating film 18. The p-side vias 21a, the n-side vias 22a, the p-side interconnect layer 31, and the n-side interconnect layer 32 are made of, for example, a copper material formed simultaneously by plating using a not-shown plating resist.

Cu electroplating also is used to form the p-type metal pillar 23 on the p-side interconnect layer 31 and to form the n-side metal pillar 24 on the n-side interconnect layer 32.

After forming the p-type metal pillar 23 and the n-side metal pillar 24, the resin layer 25 is stacked on the insulating film 41. The resin layer 25 covers the p-side interconnect layer 31, the n-side interconnect layer 32, the p-type metal pillar 23, and the n-side metal pillar 24.

Then, the substrate 10 described above that is used to form the semiconductor layer 15 is removed. In the case where the substrate 10 is the sapphire substrate, the substrate 10 can be removed by, for example, laser lift-off. In the case where the substrate 10 is the silicon substrate, the substrate 10 can be removed by etching.

Because the stacked body described above formed on the major surface of the substrate 10 is reinforced by the p-type metal pillar 23, the n-side metal pillar 24, and the resin layer 25 that are thicker than the semiconductor layer 15, it is possible to maintain the wafer state even in the case where there is no substrate 10.

The resin layer 25 and the metals included in the p-type metal pillar 23 and the n-side metal pillar 24 are materials more flexible than the semiconductor layer 15. The semiconductor layer 15 is supported by such a flexible support body. Therefore, destruction of the semiconductor layer 15 can be avoided even in the case where the large internal stress generated in the epitaxial growth of the semiconductor layer 15 on the substrate 10 is relieved all at once when peeling the substrate 10.

The first surface 15a of the semiconductor layer 15, from which the substrate 10 is removed, is cleaned. Subsequently, we etching of the first surface 15a is performed using, for example, a KOH (potassium hydroxide) aqueous solution, TMAH (tetramethylammonium hydroxide), etc. Thereby, an unevenness is formed in the first surface 15a due to the difference of the etching rates that depend on the crystal plane orientation. Or, the unevenness may be formed in the first surface 15a by performing etching after the patterning using the resist. The light extraction efficiency can be increased by the unevenness being formed in the first surface 15a.

If necessary, the phosphor layer 50 shown in FIG. 20 is formed on the first surface 15a. The liquid transparent resin 51 into which the phosphor 52 is dispersed is thermally cured after being supplied onto the first surface 15a by a method such as, for example, printing, potting, molding, compression molding, etc.

Subsequently, singulation into the multiple semiconductor light emitting devices 2 is performed by cutting the stacked body recited above. For example, cutting is performed using a dicing blade. Or, the cutting may be performed using laser irradiation.

The semiconductor light emitting device 1 that is singulated may have a single-chip structure including one semiconductor layer 15 or may have a mufti-chip structure including multiple semiconductor layers 15.

Because each of the processes described above until the dicing is performed can be performed collectively in the wafer state, it is unnecessary to perform the interconnects and the packaging for every singulated individual device; and it becomes possible to drastically reduce the production costs.

In other words, the interconnects and the packaging are already complete in the singulated state. Therefore, the productivity can be increased; and as a result, price reductions become easy.

In the embodiment described above, the p-side interconnect layer 31 and the n-side interconnect layer 32 may be bonded to the pads of the mounting substrate without providing the p-type metal pillar 23 and the n-side metal pillar 24.

The p-side interconnect layer 31 and the p-type metal pillar 23 are not limited to being separate entities; and the p-side interconnect layer 31 and the p-type metal pillar 23 may be provided as a single body by the same process. Similarly, the n-side interconnect layer 32 and the n-side metal pillar 24 are not limited to being separate entities; and the n-side interconnect layer 32 and the n-side metal pillar 24 may be provided as a single body by the same process.

Third Embodiment

Figure 32A:
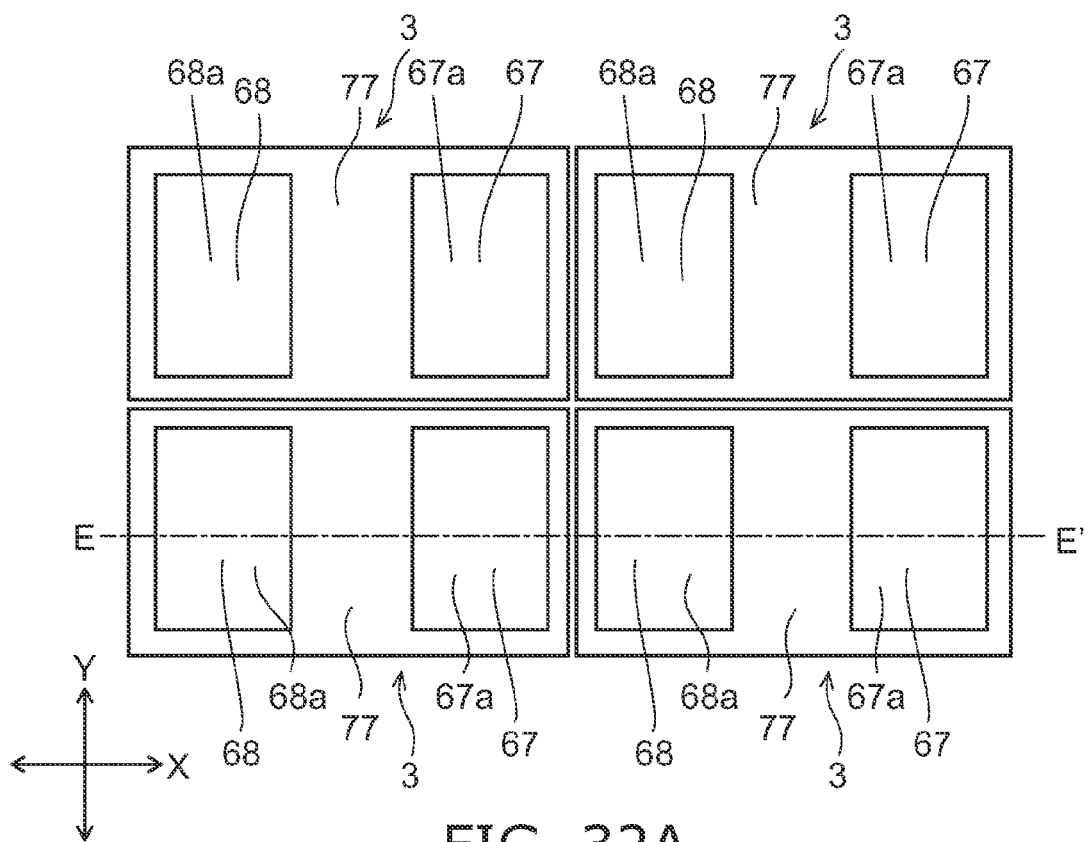
Figure 32B:
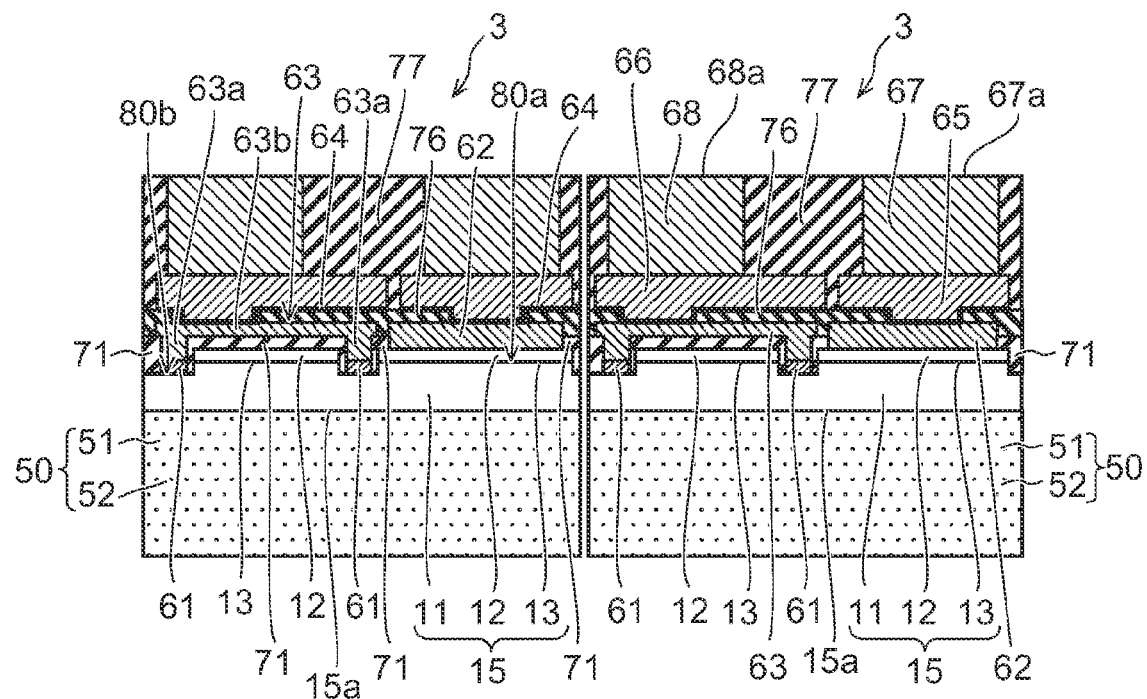

FIG. 32A is a schematic plan view of a semiconductor light emitting device 3 of a third embodiment; and FIG. 32B is a schematic cross-sectional view of the semiconductor light emitting device 3 of the third embodiment.

FIG. 32A shows, for example, four semiconductor light emitting devices 3 singulated from the wafer state. FIG. 32B is the E-E' cross-sectional view of FIG. 32A.

Similarly to the first and second embodiments recited above, the semiconductor light emitting device 3 of the third embodiment includes the semiconductor layer 15. The semiconductor layer 15 includes the first semiconductor layer 11, the second semiconductor layer 12, and the light emitting layer 13.

The first semiconductor layer 11 has the first surface 15a and the second surface provided on the side opposite to the first surface 15a. As shown in FIG. 32B, the second surface has a p-side region 80a and n-side regions 80b. The first semiconductor layer 11 includes, for example, a foundation buffer layer and an n-type GaN layer.

The light emitting layer (the active layer) 13 is provided on the p-side region 80a at the second surface of the first semiconductor layer 11. The light emitting layer 13 has, for example, an InGaN multiple quantum well structure in which multiple pairs of an InGaN well layer and a GaN or InGaN barrier layer are stacked and emits blue light, violet light, bluish-violet light, ultraviolet light, etc.

The second semiconductor layer 12 including a p-type GaN layer is provided on the light emitting layer 13. The light emitting layer 13 is provided between the first semiconductor layer 11 and the second semiconductor layer 12. The light emitting layer 13 and the second semiconductor layer 12 are not provided in the n-side regions 80b at the second surface of the first semiconductor layer 11.

The first surface 15a of the first semiconductor layer 11 functions as the main extraction surface of the light; and the light emitted by the light emitting layer 13 is emitted outside the semiconductor layer 15 mainly from the first surface 15a. A p-side electrode 62, n-side electrodes 61, and an n-side reflecting electrode 63 described below are provided on the side opposite to the first surface 15a.

The p-side electrode 62 is provided on the front surface of the second semiconductor layer 12. The n-side electrodes 61 are provided on the n-side regions 80b at the second surface of the first semiconductor layer 11.

Figure 22A:
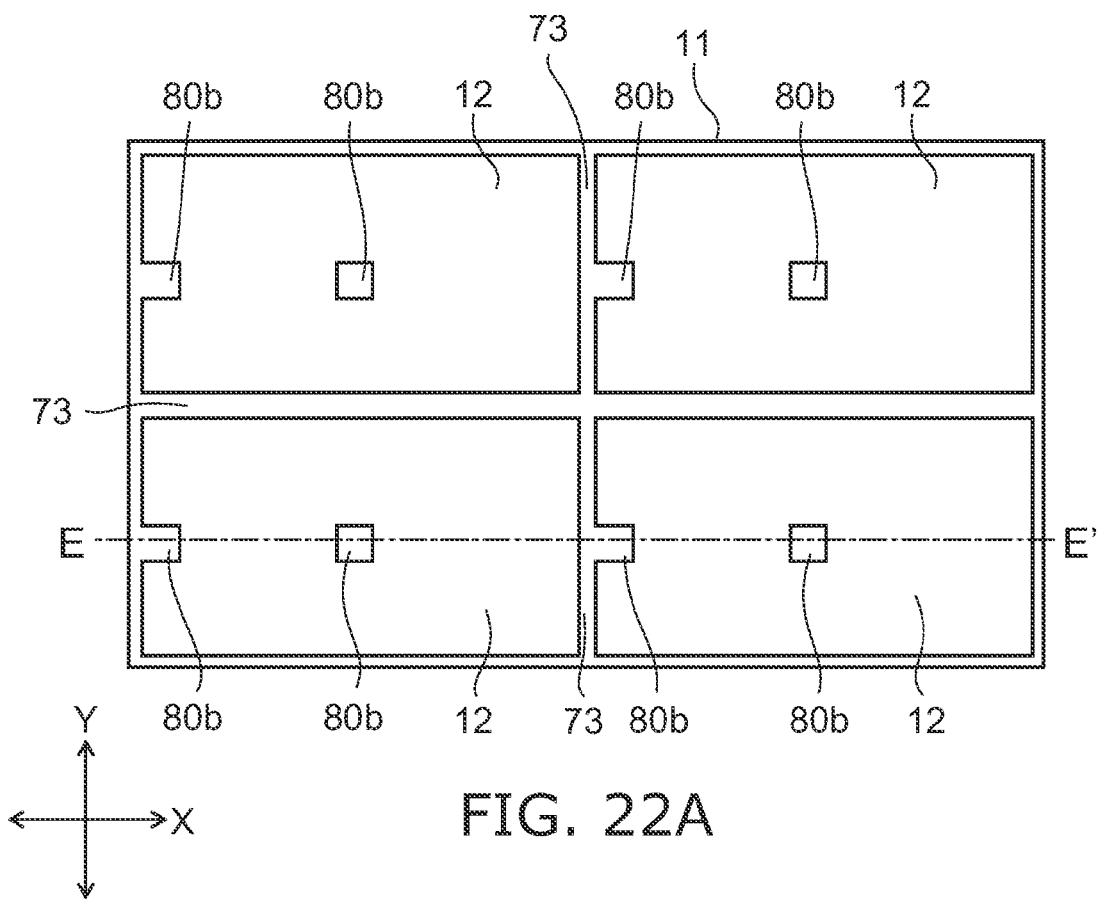
Figure 22B:
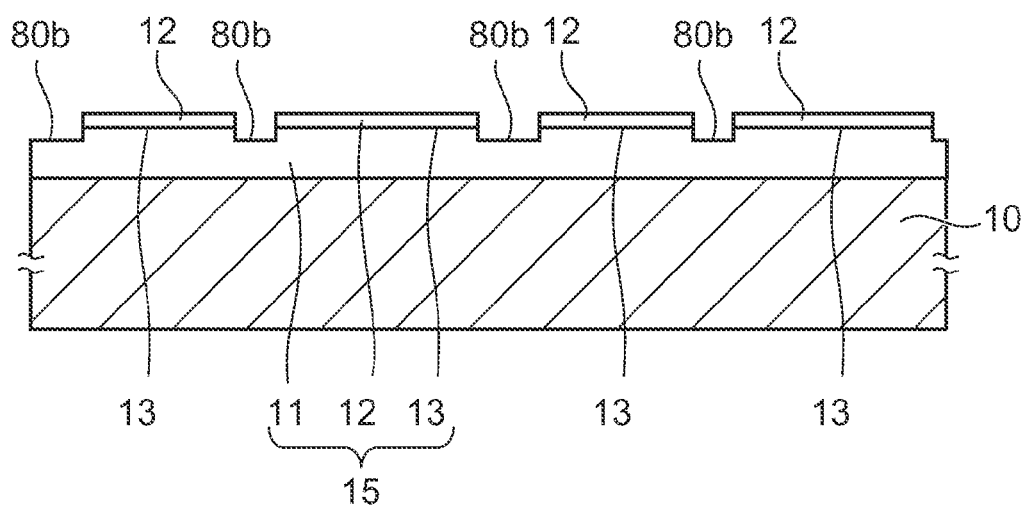

As shown in FIGS. 22A and 22B, the n-side regions 80b are formed by the front surface of the first semiconductor layer 11 being exposed by selectively removing a portion of the light emitting layer 13 and the second semiconductor layer 12 formed on the entire surface of the second surface of the first semiconductor layer 11.

The n-side regions 80b are formed in multiple locations (e.g., two locations) for every one chip. The n-side electrodes 61 are provided respectively on the n-side regions 80b. The two n-side electrodes 61 are positioned with the second semiconductor layer 12 interposed in the surface direction of the second surface.

An insulating film 71 is provided on the second semiconductor layer 12 provided between the two n-side electrodes 61; and the p-side electrode 62 is not provided on the second semiconductor layer 12 provided between the two n-side electrodes 61. The n-side reflecting electrode 63 is provided on the two n-side electrodes 61 and on the insulating film 71 on the second semiconductor layer 12 interposed between the n-side electrodes 61.

In other words, the n-side reflecting electrode 63 includes two n-side vias 63a provided respectively on the two n-side electrodes 61, and a linking portion 63b linking the two n-side vias 63a; and the n-side vias 63a and the linking portion 63b are provided as a single body from the same material. The linking portion 63b extends in a direction linking the two n-side vias 63a and is provided on the second semiconductor layer 12 interposed between the two n-side electrodes 61 with the insulating film 71 interposed between the linking portion 63b and the second semiconductor layer 12.

Figure 25A:
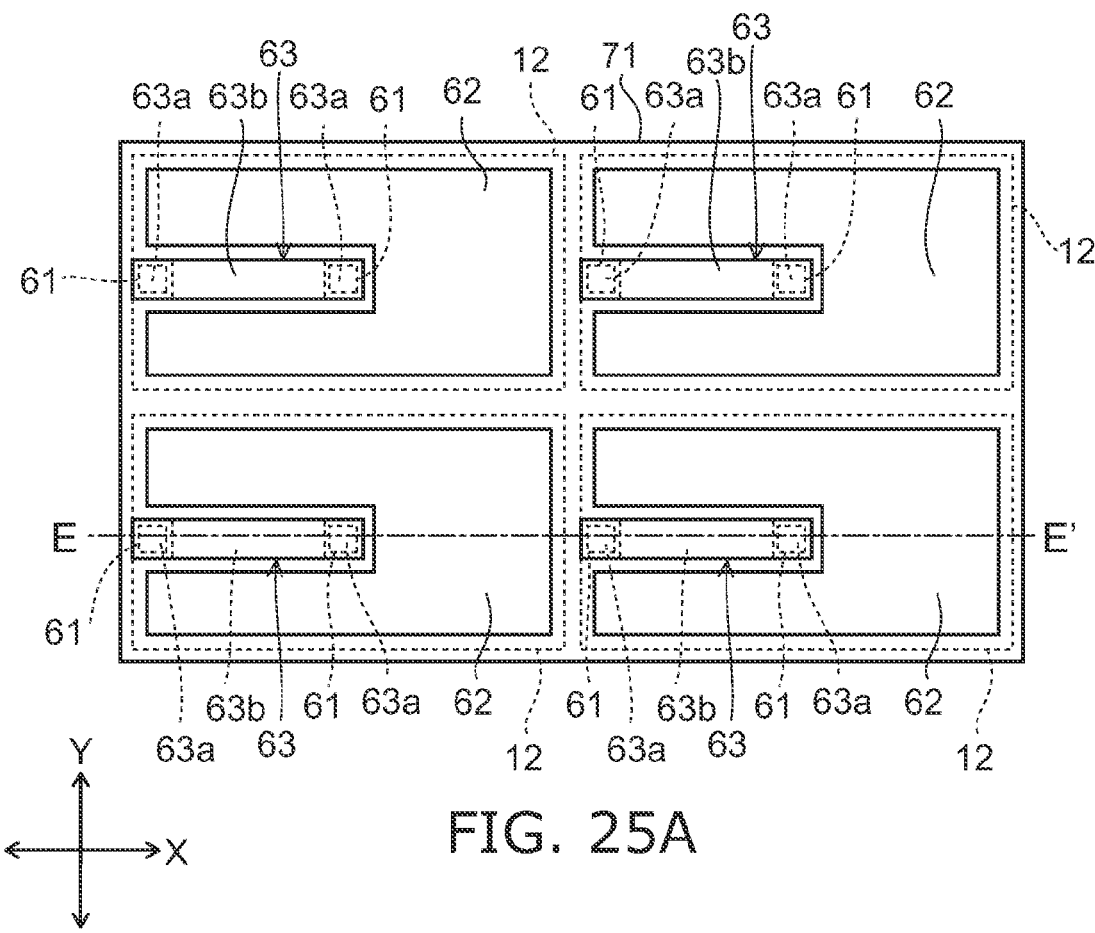

The n-side reflecting electrode 63 is provided to straddle the second semiconductor layer 12 provided between the two n-side electrodes 61; and the planar configuration of the n-side reflecting electrode 63 is formed in a rectangular configuration as shown in FIG. 25A.

The direction in which the n-side reflecting electrode 63 extends is taken as the first direction X; and a direction orthogonal to the first direction X in the plan view of FIG. 25A is taken as the second direction Y. The light emitting layer 13, the second semiconductor layer 12, and the p-side electrode 62 are provided on both second direction Y sides of the n-side reflecting electrode 63. The n-side reflecting electrode 63 is provided between the p-side electrode 62 in the second direction Y.

The p-side electrode 62, the n-side electrodes 61, and the n-side reflecting electrode 63 are provided on the same surface side which is the side opposite to the first surface 15a which is the main light extraction surface of the semiconductor layer 15. The p-side electrode 62 is provided on the region including the light emitting layer 13; and the n-side electrodes 61 are provided on the n-side regions 80b not including the light emitting layer 13. The n-side reflecting electrode 63 is provided on the n-side electrodes 61 and on the light emitting layer 13 between the n-side electrodes 61.

The p-side electrode 62 contacts the second semiconductor layer 12 and includes, for example, a contact layer including at least one selected from nickel (Ni), gold (Au), and rhodium (Rh) that is capable of forming an alloy with the gallium (Ga) included in the second semiconductor layer 12. The p-side electrode 62 further includes a reflective layer that is provided on the contact layer, has a reflectance for the light emitted by the light emitting layer 13 that is higher than that of the contact layer, and includes, for example, silver (Ag) as the main component.

The n-side electrodes 61 contact the first semiconductor layer 11 and include, for example, at least one selected from nickel (Ni), gold (Au), and rhodium (Rh) that is capable of forming an alloy with the gallium (Ga) included in the first semiconductor layer 11.

The n-side reflecting electrode 63 is formed simultaneously with the p-side electrode 62 from the same material. The n-side reflecting electrode 63 has a reflectance for the light emitted by the light emitting layer 13 that is higher than that of the n-side electrodes 61 and includes, for example, silver (Ag) as the main component.

An insulating film 76 is provided on the insulating film 71, on the p-side electrode 62, and on the n-side reflecting electrode 63. The insulating film 76 covers the p-side electrode 62 and the n-side reflecting electrode 63.

The insulating film 76 is, for example, a resin such as polyimide, etc. Or, an inorganic film such as a silicon oxide film, a silicon nitride film, etc., may be used as the insulating film 76.

A p-side interconnect layer 65 and an n-side interconnect layer 66 are provided to be separated from each other on the insulating film 76. The p-side interconnect layer 65 and the n-side interconnect layer 66 are formed by electroplating as described below. The p-side interconnect layer 65 also includes a metal film 64 used as the seed metal in the plating. Similarly, the n-side interconnect layer 66 also includes the metal film 64 used as the seed metal.

The p-side interconnect layer 65 is provided on the p-side electrode 62 with the insulating film 76 interposed. A first opening is made in the insulating film 76 to reach the p-side electrode 62; and the p-side interconnect layer 65 is electrically connected to the p-side electrode 62 by means of a p-side via provided inside the first opening.

The n-side interconnect layer 66 is provided on the n-side reflecting electrode 63 with the insulating film 76 interposed. The second opening is made in the insulating film 76 to reach the n-side reflecting electrode 63; and the n-side interconnect layer 66 is electrically connected to the n-side reflecting electrode 63 and the n-side electrodes 61 by means of an n-side via provided inside the second opening.

A p-type metal pillar 67 is provided on the p-side interconnect layer 65. The p-side interconnect layer 65 and the p-type metal pillar 67 are included in the p-side interconnect unit of the embodiment. An n-side metal pillar 68 is provided on the n-side interconnect layer 66. The n-side interconnect layer 66 and the n-side metal pillar 68 are included in the n-side interconnect unit of the embodiment.

A resin layer 77 is stacked on the insulating film 76 as another insulating film. The resin layer 77 covers the periphery of the p-side interconnect unit and the periphery of the n-side interconnect unit. Also, the resin layer 77 is filled between the p-type metal pillar 67 and the n-side metal pillar 68.

The side surface of the p-type metal pillar 67 and the side surface of the n-side metal pillar 68 are covered with the resin layer 77. The surface of the p-type metal pillar 67 on the side opposite to the p-side interconnect layer 65 is exposed from the resin layer 77 and functions as a p-side external terminal 67*a*. The surface of the n-side metal pillar 68 on the side opposite to the n-side interconnect layer 66 is exposed from the resin layer 77 and functions as an n-side external terminal 68*a*. The p-side external terminal 67*a* and the n-side external terminal 68*a* are bonded to pads formed in a not-shown mounting substrate via solder, etc.

The distance between the p-side external terminal 67*a* and the n-side external terminal 68*a* exposed at the same surface (in FIG. 32B, the upper surface) of the resin layer 77 is greater than the distance between the p-side interconnect layer 65 and the n-side interconnect layer 66 on the insulating film 76. The p-side external terminal 67*a* and the n-side external terminal 68*a* are separated by a distance such that the p-side external terminal 67*a* and the n-side external terminal 68*a* are not shorted to each other by the solder, etc., when mounting to the mounting substrate.

The p-side interconnect layer 65 and the n-side interconnect layer 66 can be near the process limits; and the surface area of the p-side interconnect layer 65 and the n-side interconnect layer 66 can be increased. As a result, the current distribution and the heat dissipation can be improved.

The surface area of the n-side interconnect layer 66 spreading on the insulating film 76 is greater than the total surface area of the multiple n-side electrodes 61 on the second surface.

According to the third embodiment, a high light output can be obtained by the light emitting layer 13 formed over the region that is larger than the n-side electrodes 61. Further, the n-side electrodes 61 provided in the region that is narrower than the region including the light emitting layer 13 is drawn out to the mounting surface side as the n-side interconnect layer 66 that has a larger surface area.

The p-type metal pillar 67 is thicker than the p-side interconnect layer 65; and the n-side metal pillar 68 is thicker than the n-side interconnect layer 66. The thicknesses of the p-type metal pillar 67, the n-side metal pillar 68, and the resin layers 77 are thicker than the semiconductor layer 15. Here, "thickness" is the thickness in the vertical direction in FIG. 32B.

The thicknesses of the p-type metal pillar 67 and the n-side metal pillar 68 are thicker than the thickness of the stacked body (the chip) including the semiconductor layer 15, the p-side electrode 62, the n-side electrodes 61, and the n-side reflecting electrode 63. The aspect ratios (the ratios of the thickness to the planar size) of the metal pillars 67 and 68 are not limited to being 1 or more and may be smaller than 1. In other words, the thicknesses of the metal pillars 67 and 68 may be less than the planar sizes of the metal pillars 67 and 68.

According to the third embodiment, the semiconductor layer 15 can be stably supported by the support body including the p-type metal pillar 67, the n-side metal pillar 68, and the resin layer 77 even if the substrate 10 described below used to form the semiconductor layer 15 is removed; and the mechanical strength of the semiconductor light emitting device 3 can be increased.

Copper, gold, nickel, silver, etc., may be used as the materials of the p-side interconnect layer 65, the n-side interconnect layer 66, the p-type metal pillar 67, and the n-side metal pillar 68. Among these, good thermal conductivity, high migration resistance, and excellent adhesion with insulating materials are obtained when copper is used.

The resin layer 77 reinforces the p-type metal pillar 67 and the n-side metal pillar 68. It is desirable for the resin layer 77 to have a coefficient of thermal expansion near to or the same as that of the mounting substrate. Examples of such a resin layer 25 include, for example, an epoxy resin, a silicone resin, a fluorocarbon resin, etc.

The stress applied to the semiconductor layer 15 via the solder in the state in which the semiconductor light emitting device 3 is mounted to the mounting substrate via the p-side external terminal 67*a* and the n-side external terminal 68*a* can be relaxed by being absorbed by the p-type metal pillar 67 and the n-side metal pillar 68.

As described below, the substrate 10 used when forming the semiconductor layer 15 is removed from the first surface 15*a*. Therefore, the semiconductor light emitting device 3 can be thinner.

The phosphor layer 50 is provided on the first surface 15*a*. The phosphor layer 50 includes the transparent resin 51 as a transparent medium and the phosphor 52 having a multiple particle configuration dispersed in the transparent resin 51.

The transparent resin 51 is transmissive to the light emitted by the light emitting layer 13 and the light emitted by the phosphor 52 and may include, for example, a silicone resin, an acrylic resin, a phenyl resin, etc.

The phosphor 52 is capable of absorbing the emitted light (the excitation light) of the light emitting layer 13 and emitting a wavelength-converted light. Therefore, the semiconductor light emitting device 3 of the third embodiment is capable of emitting a mixed light of the light emitted by the light emitting layer 13 and the wavelength-converted light of the phosphor 52.

For example, white, lamp, etc., can be obtained as a mixed color of the blue light of the light emitting layer 13 which is the InGaN-based material and the yellow light which is the wavelength-converted light of the phosphor 52 in the case where the phosphor 52 is a yellow phosphor that emits yellow light. The phosphor layer 50 may have a configuration including multiple types of phosphors (e.g., a red phosphor that emits red light and a green phosphor that emits green light).

In the semiconductor light emitting device 3 of the third embodiment, the p-side electrode 62, the n-side electrodes 61, and the n-side reflecting electrode 63 are provided at the second surface on the side opposite to the first surface 15$a$ which is the main extraction surface of the light. Accordingly, the light extraction from the first surface 15$a$ is not impeded by the electrodes.

The n-side regions 80$b$ at the second surface of the first semiconductor layer 11 and the n-side electrodes 61 provided on the n-side regions 80$b$ are interspersed at the second surface in a dot configuration or an island configuration. Therefore, the uniform current distribution in the surface direction of the light emitting layer 13 can be realized while increasing the light emission surface area by reducing the region not including the light emitting layer 13.

As shown in FIG. 25A, the p-side electrode 62 and the n-side reflecting electrode 63 that are highly reflective to the light emitted by the light emitting layer 13 spread over substantially the entire surface on the side opposite to the light extraction surface (the first surface 15$a$). Accordingly, the reflecting surface area of the light radiated from the light emitting layer 13 to the side opposite to the light extraction surface (the first surface 15$a$) can be large; and a high light extraction efficiency is obtained.

The n-side electrodes 61 are separated into a plurality on the second surface of the first semiconductor layer 11. The multiple n-side electrodes 61 are electrically connected to each other by the n-side reflecting electrode 63 provided on the second semiconductor layer 12 existing between the multiple n-side electrodes 61 with the insulating film 71 interposed between the n-side reflecting electrode 63 and the second semiconductor layer 12.

The reflecting surface area of the side opposite to the light extraction surface can be increased by using, for example, a material including silver that has a high reflectance as the electrode to connect the multiple n-side electrodes 61. By forming the n-side reflecting electrode 63 from the same material as the p-side electrode 62 when forming the p-side electrode 62, the processes do not increase and costs can be lower.

A method for manufacturing the semiconductor light emitting device 3 of the third embodiment will now be described with reference to FIG. 21A to FIG. 32B. FIG. 21A to FIG. 32B show a partial region in the wafer state.

FIG. 21B, FIG. 22B, FIG. 23B, FIG. 24B, FIG. 25B, FIG. 26B, FIG. 27B, FIG. 28B, FIG. 29B, FIG. 30B, and FIG. 32B show the E-E' cross sections of FIG. 21A, FIG. 22A, FIG. 23A, FIG. 24A, FIG. 25A, FIG. 26A, FIG. 27A, FIG. 28A, FIG. 29A, FIG. 30A, and FIG. 32A, respectively.

Figure 21A:
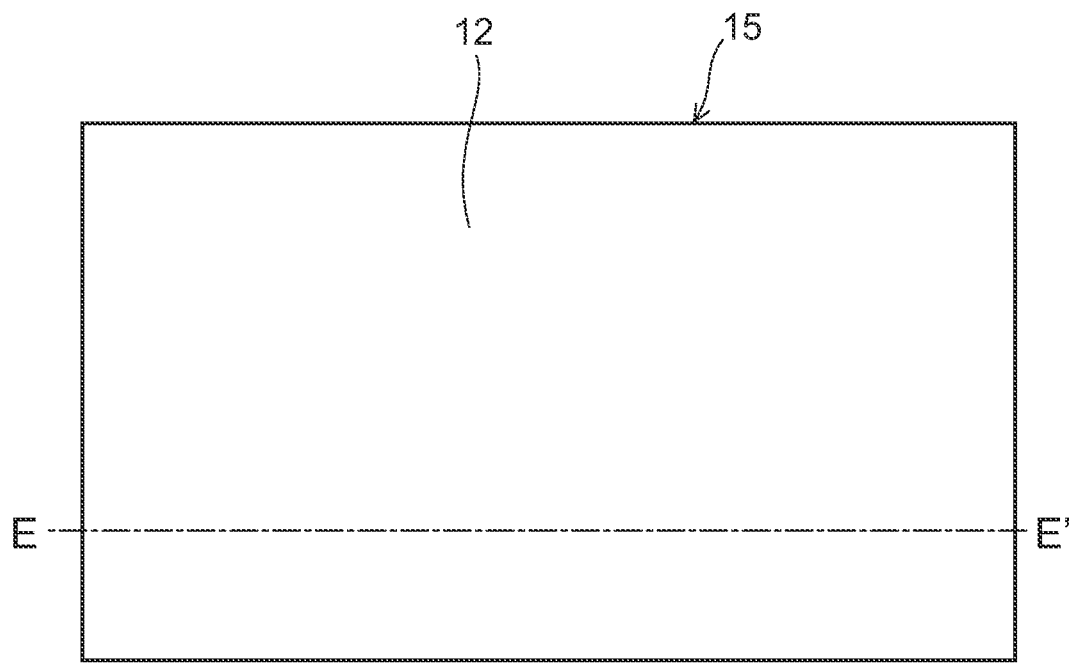
FIG. 21A to FIG. 32B are schematic views showing a method for manufacturing the semiconductor light emitting device of the third embodiment.
Figure 21B:
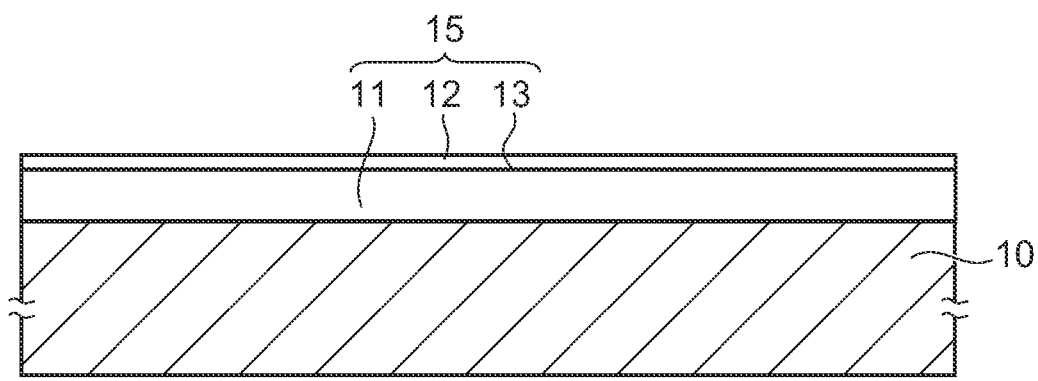

As shown in FIG. 21B, the semiconductor layer 15 is formed on the substrate 10. First, the first semiconductor layer 11 is formed on the major surface of the substrate 10; the light emitting layer 13 is formed on the first semiconductor layer 11; and the second semiconductor layer 12 is formed on the light emitting layer 13.

Crystal growth of the semiconductor layer 15 which is a nitride semiconductor of $In_xAl_yGa_{1-x-y}N$ ($0 \leq x \leq 1$, $0 \leq y \leq 1$, and $x+y \leq 1$) may be performed by, for example, MOCVD on a sapphire substrate. Or, a silicon substrate may be used as the substrate 10.

The semiconductor layer 15 is formed on the entire surface of the substrate 10. Subsequently, a portion of the first semiconductor layer 11 is exposed by removing a portion of the light emitting layer 13 and the second semiconductor layer 12 as shown in FIGS. 22A and 22B by, for example, RIE using a not-shown resist. The semiconductor layer 15 is separated into a plurality on the substrate 10 by a trench 73 made in a planar pattern having, for example, a lattice configuration.

The regions where the first semiconductor layer 11 is exposed are the n-side regions 80$b$ not including the light emitting layer 13 and the second semiconductor layer 12.

Figure 23A:
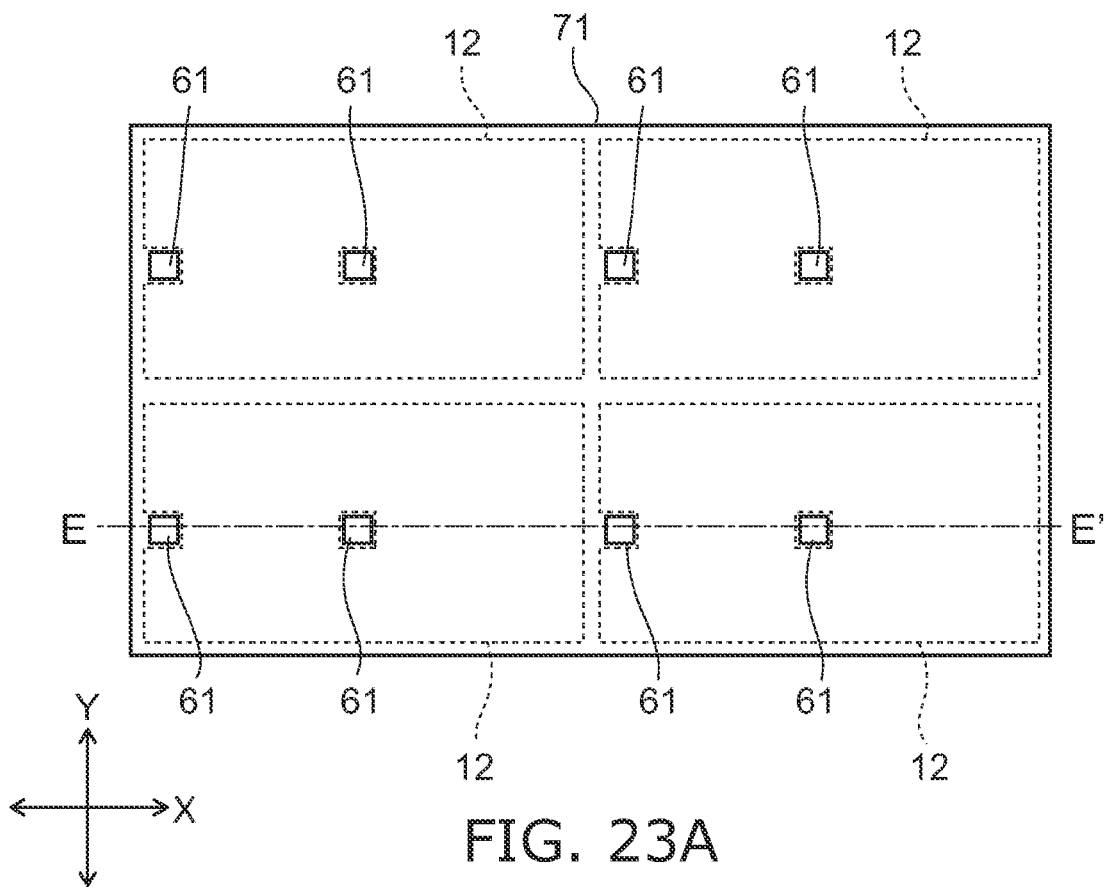
Figure 23B:
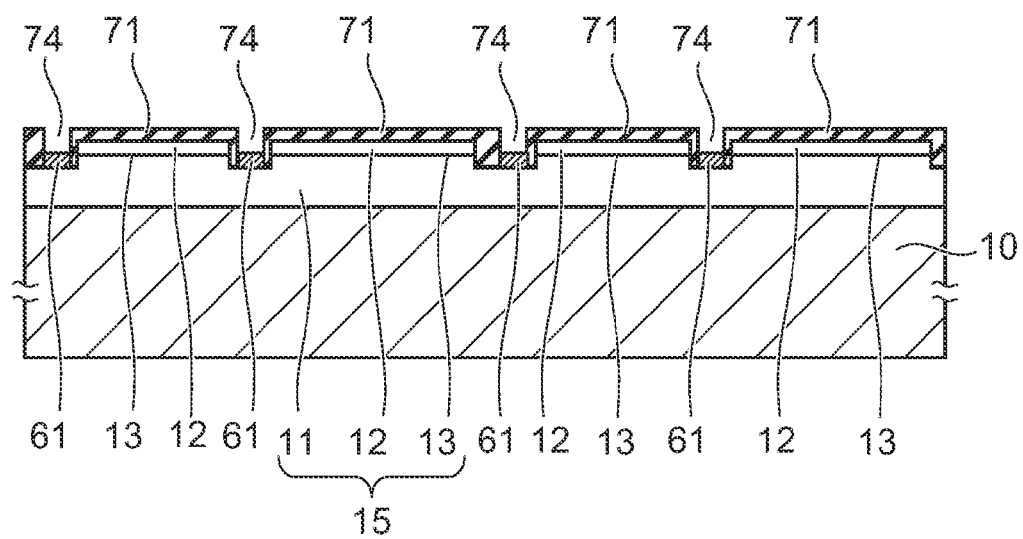

Then, after covering all of the exposed portions on the substrate 10 with the insulating film 71 shown in FIGS. 23A and 23B, openings 74 are made selectively in the insulating film 71. The insulating film 71 is a resin film or an inorganic film such as a silicon nitride film, a silicon oxide film, etc.

The openings 74 are made on the portion (the n-side regions 80$b$) where the first semiconductor layer 11 is exposed to reach the front surface of the n-side regions 80$b$. The n-side electrodes 61 are formed inside the openings 74.

Figure 24A:
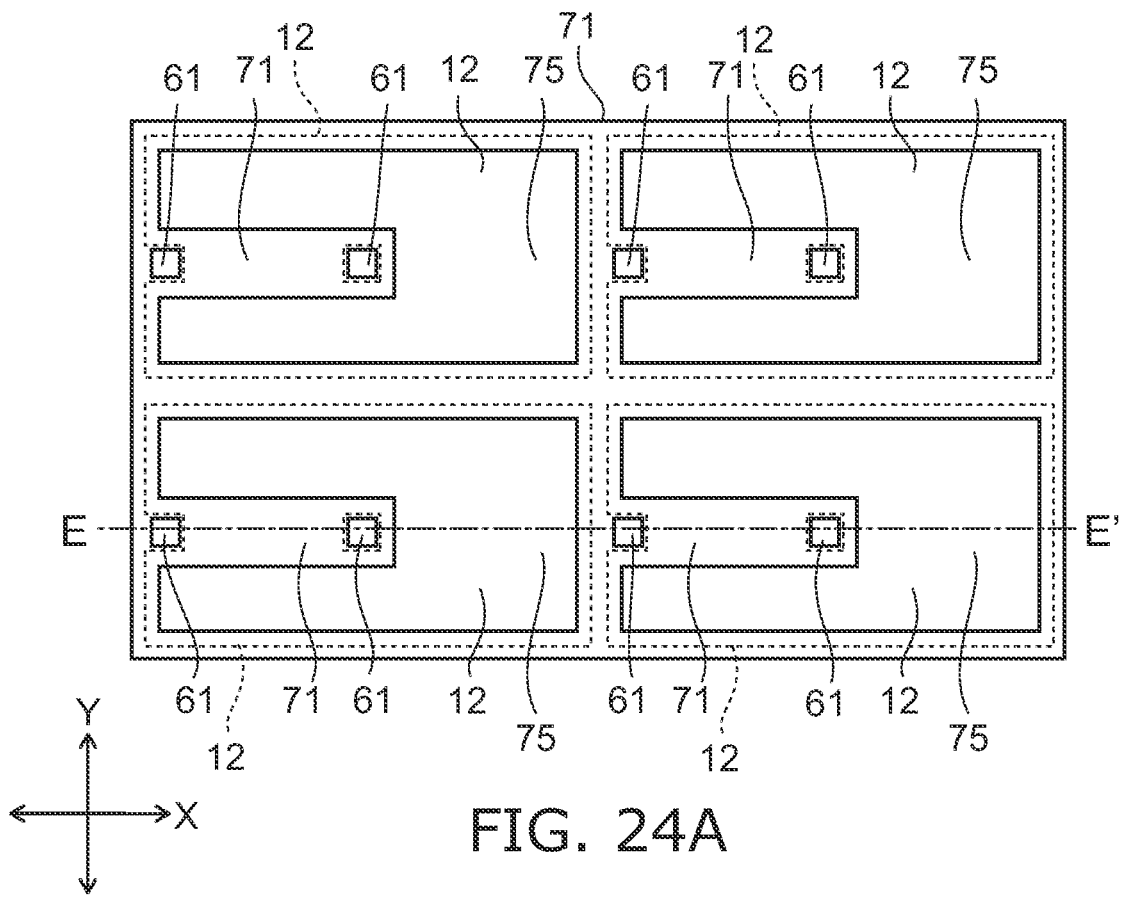
Figure 24B:
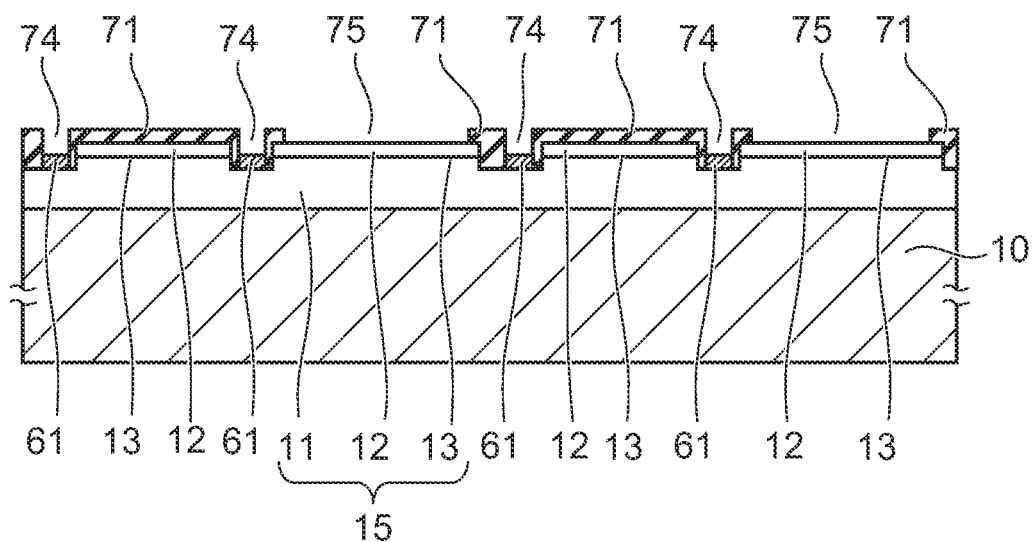

Then, an opening 75 is made in the insulating film 71 on the second semiconductor layer 12 by removing a portion of the insulating film 71 covering the front surface of the second semiconductor layer 12 as shown in FIGS. 24A and 24B. The opening 75 is not made on the second semiconductor layer 12 provided between the n-side electrodes 61 in the X direction; and the front surface of the second semiconductor layer 12 between the n-side electrodes 61 remains covered with the insulating film 71.

Figure 25B:
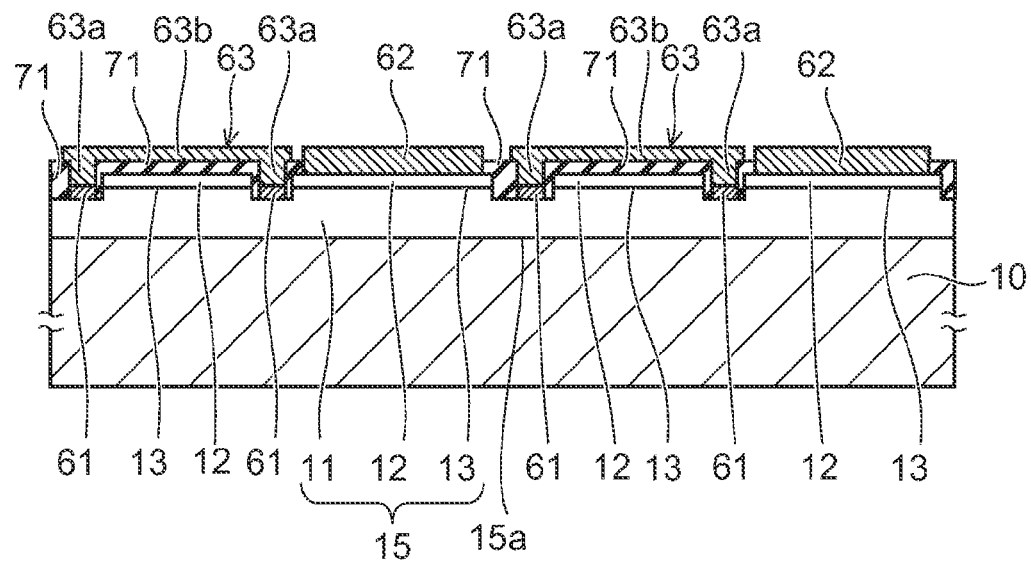

As shown in FIGS. 25A and 25B, the n-side vias 63$a$ are formed on the n-side electrodes 61 inside the openings 74; the linking portion 63$b$ is formed on the insulating film 71 on the second semiconductor layer 12 between the n-side electrodes 61; and the p-side electrode 62 is formed on the front surface of the second semiconductor layer 12 inside the opening 75. In other words, the p-side electrode 62 and the n-side reflecting electrode 63 are formed simultaneously from the same material. The p-side electrode 62 and the n-side reflecting electrode 63 may be formed by, for example, sputtering using a not-shown mask.

Figure 26A:
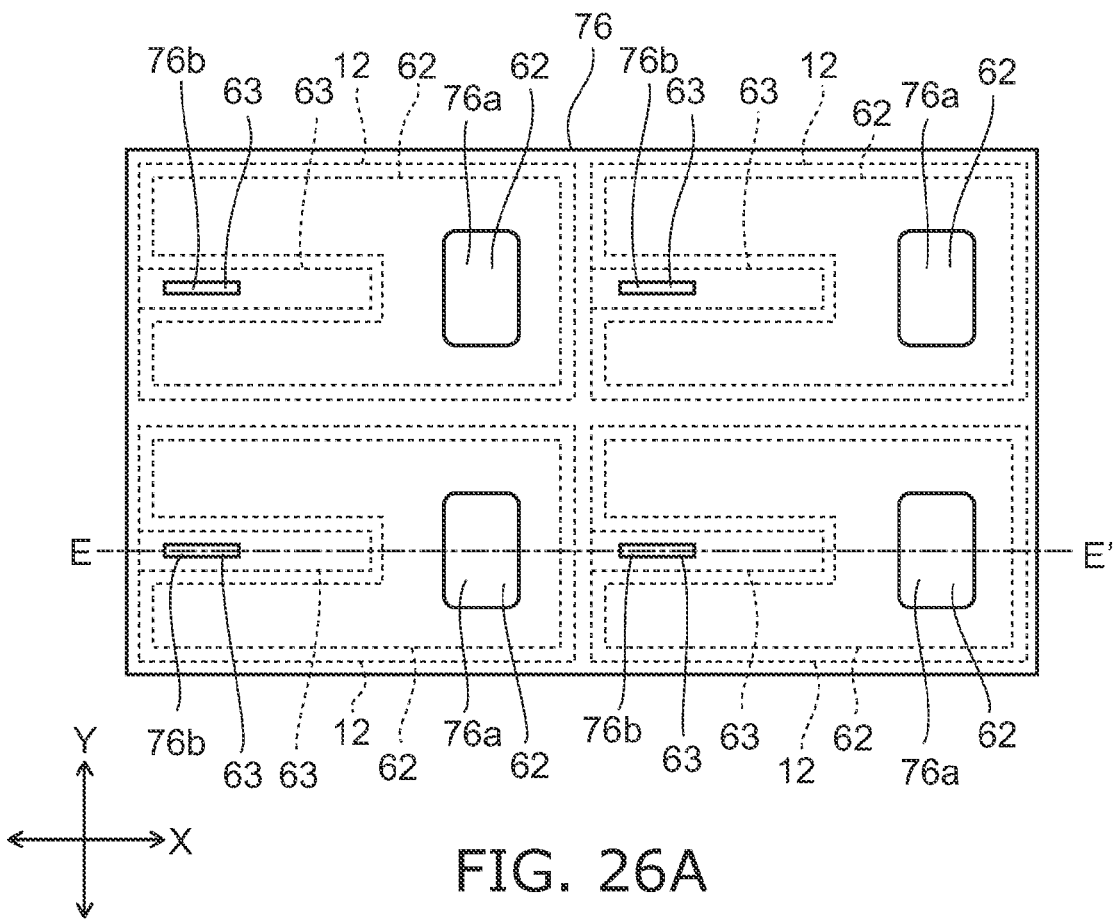
Figure 26B:
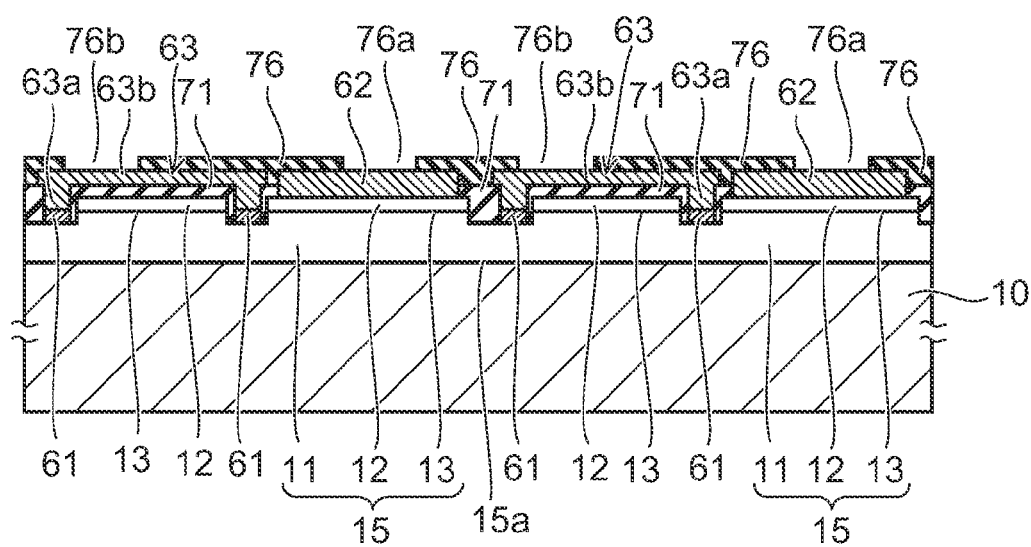

Then, after covering all of the exposed portions on the substrate 10 major surface with the insulating film 76 shown in FIG. 26B, a first opening 76$a$ is made by removing a portion of the insulating film 76 on the p-side electrode 62; and a second opening 76$b$ is made by removing a portion of the insulating film 76 on the n-side reflecting electrode 63. The p-side electrode 62 is exposed in the first opening 76$a$; and the n-side reflecting electrode 63 is exposed in the second opening 76$b$.

Figure 27A:
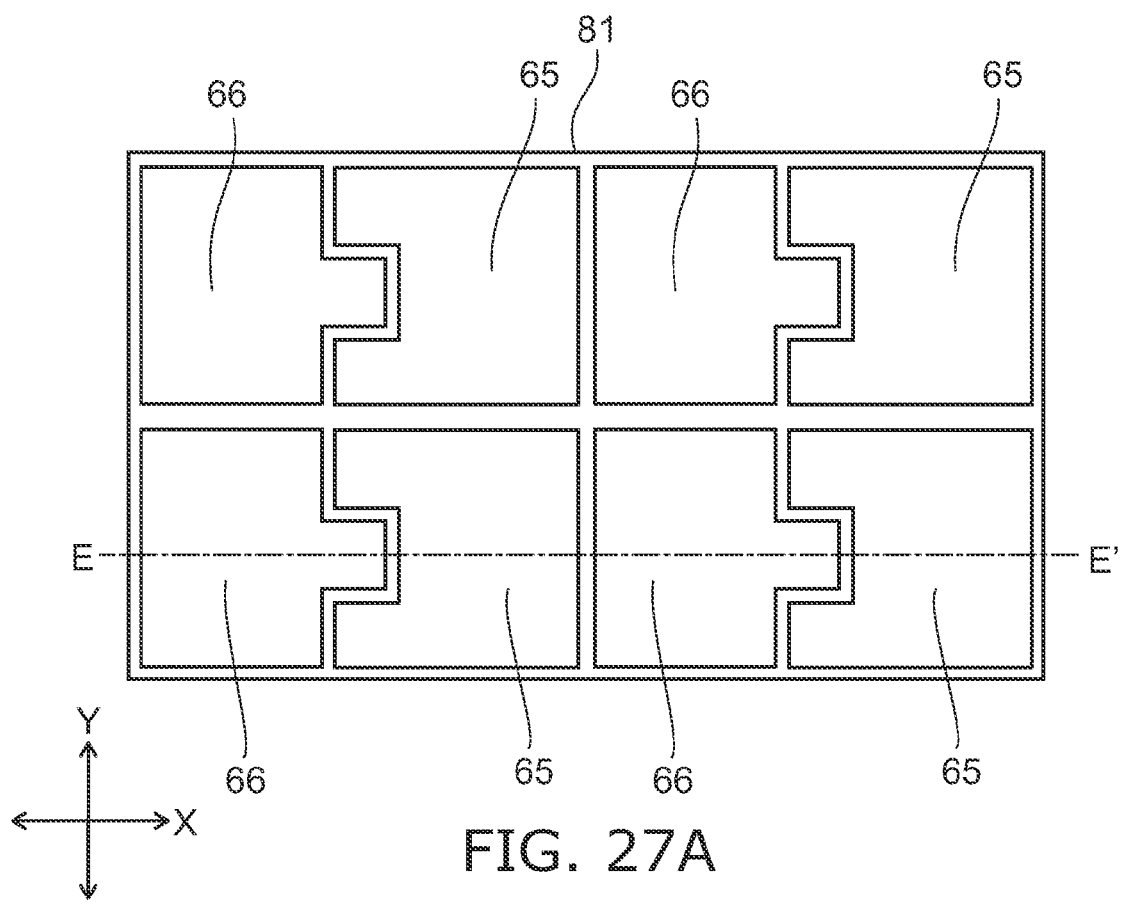
Figure 27B:
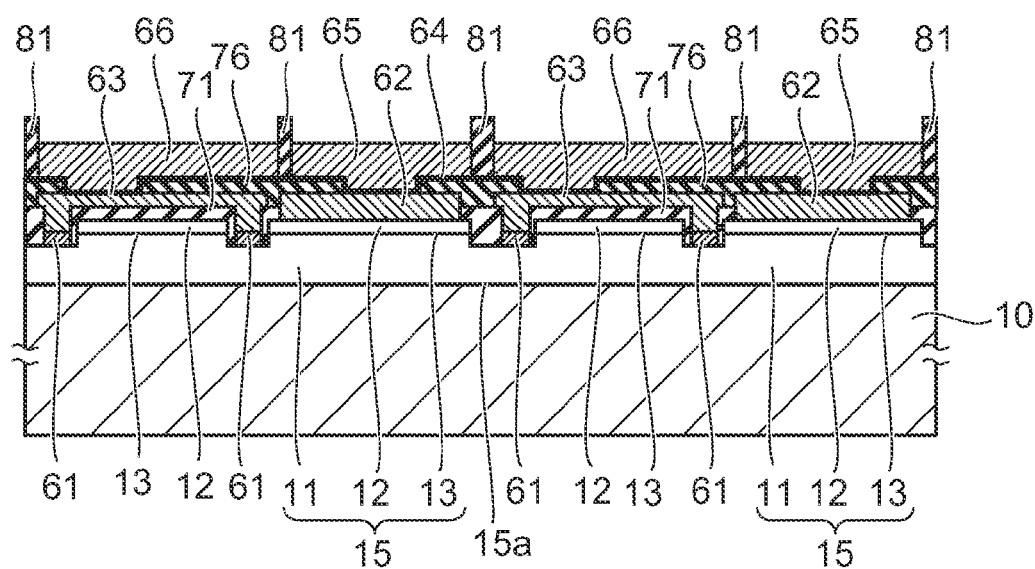

Then, as shown in FIG. 27B, the metal film 64 is formed on the front surface of the insulating film 76, the inner wall (the side wall and the bottom portion) of the first opening 76$a$, and the inner wall (the side wall and the bottom portion) of the second opening 76$b$. The metal film 64 is used as the seed metal of the plating described below.

The metal film 64 is formed by, for example, sputtering. The metal film 64 includes, for example, a stacked film of titanium (Ti) and copper (Cu) stacked in order from the lower layer side. Or, an aluminum film may be used instead of the titanium film.

Then, a resist 81 is formed selectively on the metal film 64; and Cu electroplating is performed using the metal film 64 as a current path.

Thereby, the p-side interconnect layer 65 and the n-side interconnect layer 66 are formed selectively on the metal film 64. The p-side interconnect layer 65 and the n-side interconnect layer 66 are made of, for example, a copper material formed simultaneously by plating.

Figure 28A:
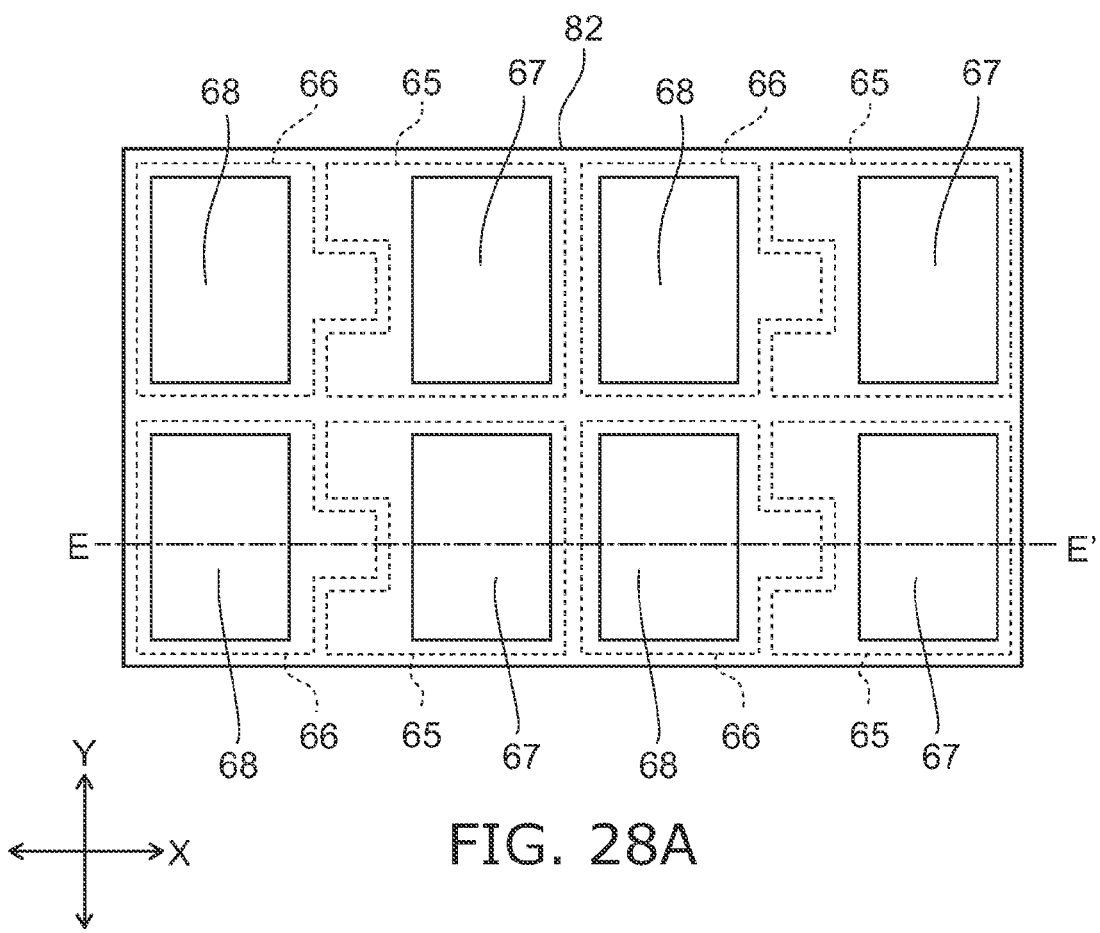
Figure 28B:
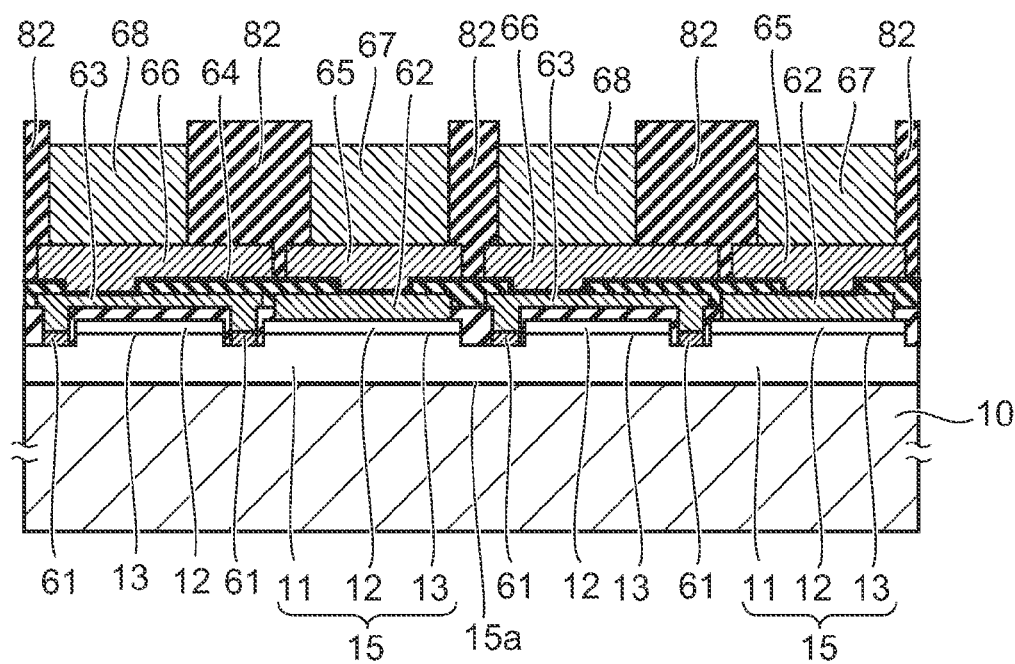

Then, as shown in FIGS. 28A and 28B, a resist 82 for forming the metal pillars is formed. The resist 82 is thicker than the resist 81 described above. The resist 81 may be left without being removed in the previous process; and the resist 82 may be formed to overlap the resist 81.

Continuing, Cu electroplating using the metal film 64 as a current path is performed using the resist 82 as a mask. Thereby, the p-type metal pillar 67 is formed on the p-side interconnect layer 65; and the n-side metal pillar 68 is formed on the n-side interconnect layer 66. The p-type metal pillar 67 and the n-side metal pillar 68 are made of, for example, a copper material formed simultaneously by plating.

Figure 29A:
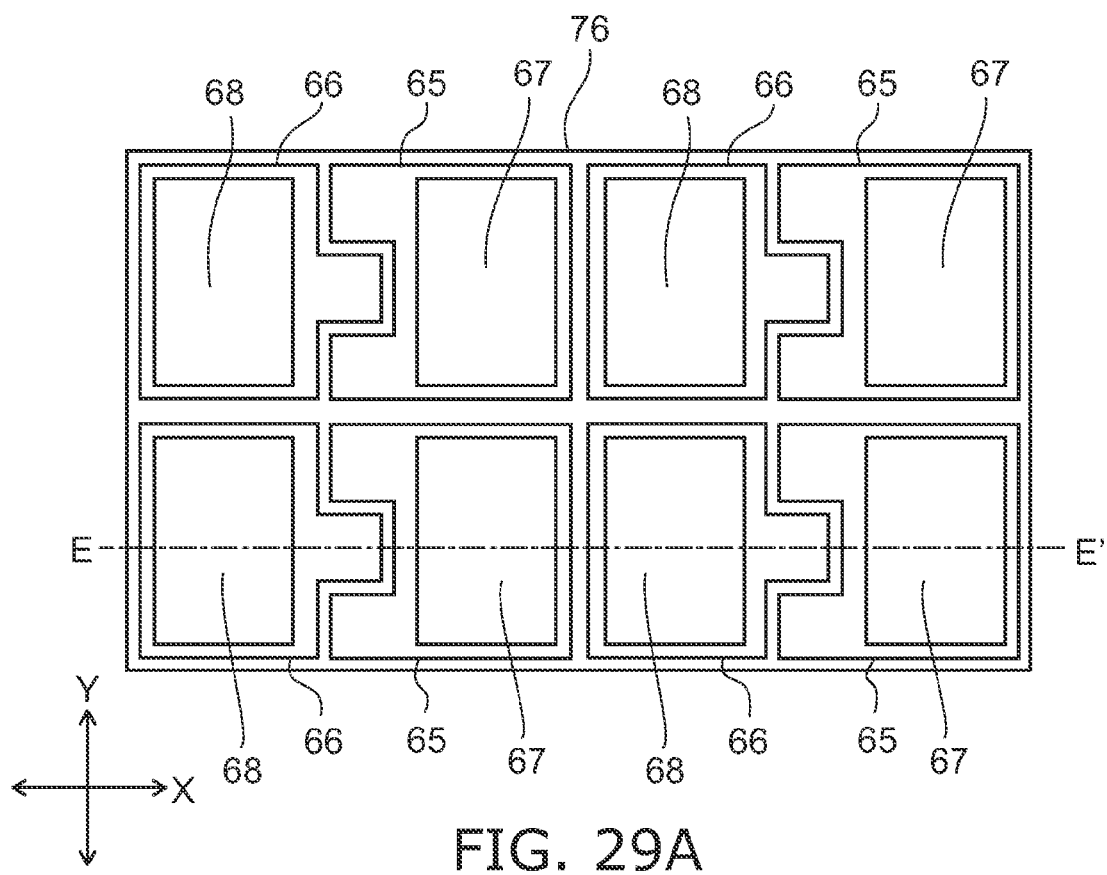
Figure 29B:
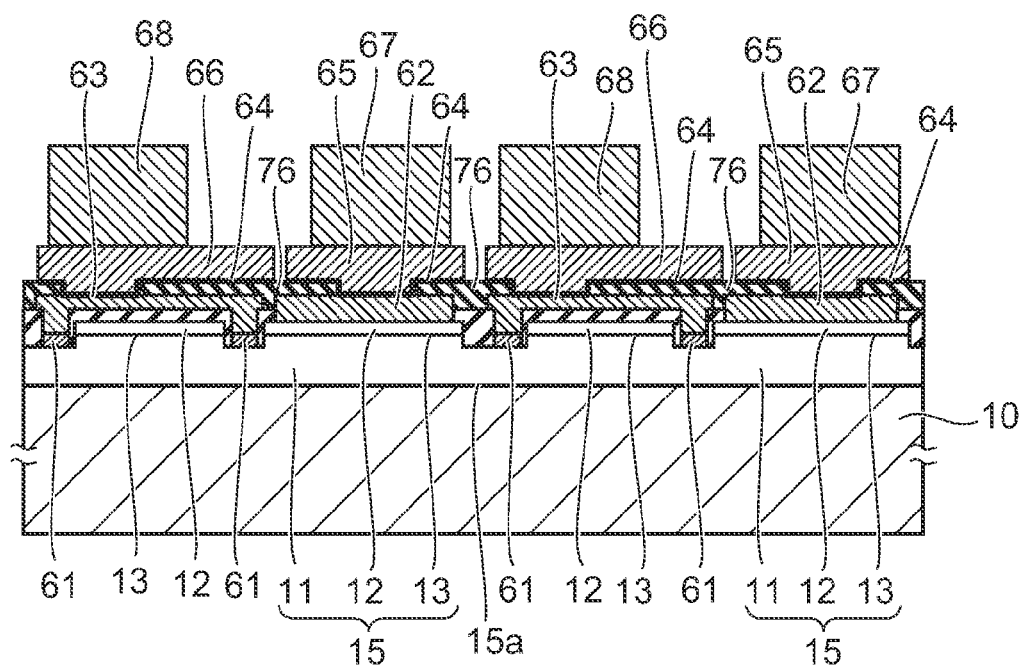

The resist 82 is removed as shown in FIG. 29B using, for example, a solvent or oxygen plasma. Subsequently, the exposed portion of the metal film 64 used as the seed metal is removed by wet etching. Thereby, as shown in FIG. 29B, the electrical connection by means of the metal film 64 between the p-side interconnect layer 65 and the n-side interconnect layer 66 is broken.

Figure 30A:
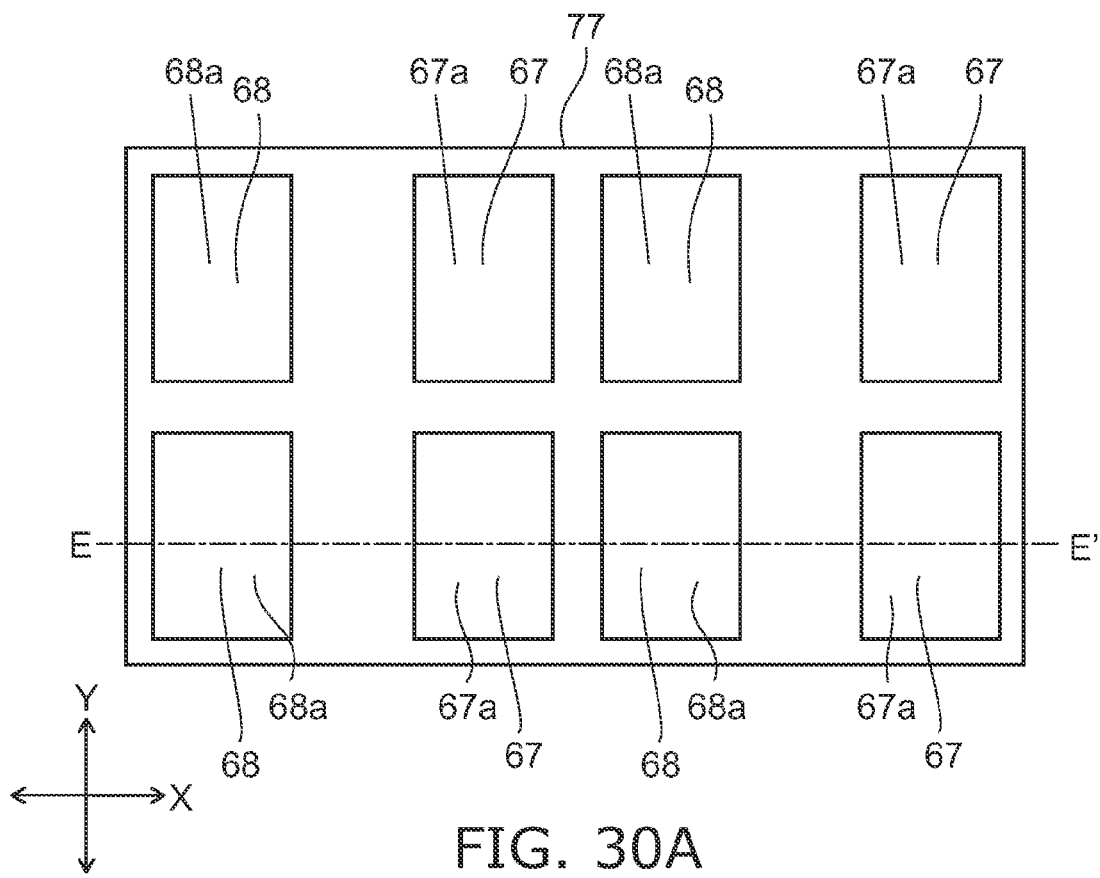
Figure 30B:
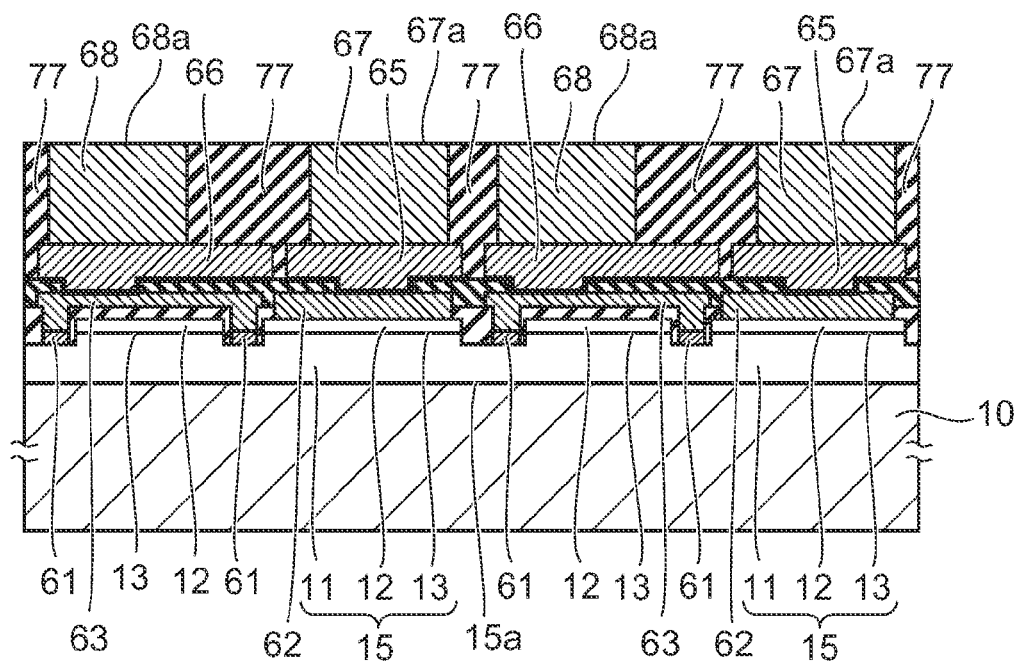

Then, after forming the resin layer 77 to cover the p-side interconnect layer 65, the n-side interconnect layer 66, the p-type metal pillar 67, and the n-side metal pillar 68 as shown in FIGS. 30A and 30B, the resin layer 77 is polished to expose the end surface (the p-side external terminal 67a) of the p-type metal pillar 67 and the end surface (the n-side external terminal 68a) of the n-side metal pillar 68 from the resin layer 77.

The resin layer 77 is insulative. The resin layer 77 may be light-shielding to the light emitted by the light emitting layer 13 by the resin layer 77 containing, for example, carbon black.

Figure 31A:
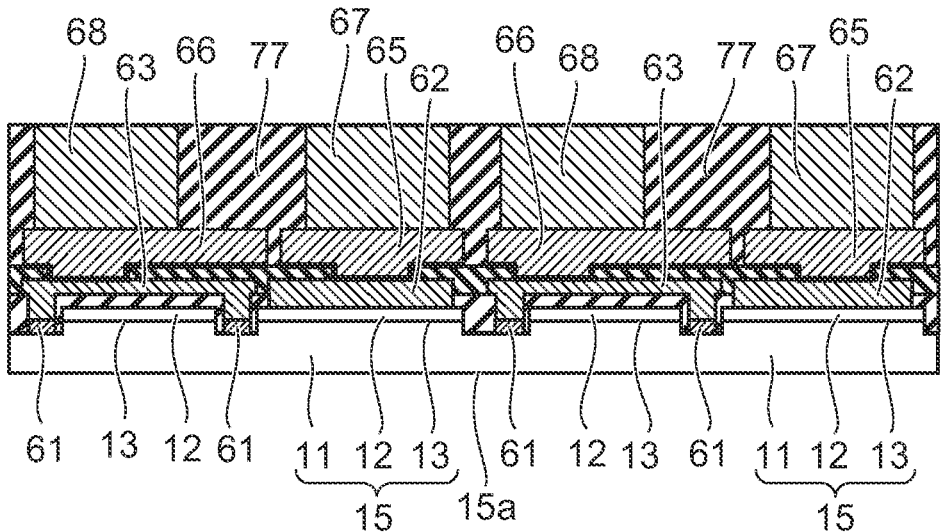

Then, the substrate 10 is removed as shown in FIG. 31A. In the case where the substrate 10 is the sapphire substrate, the substrate 10 can be removed by, for example, laser lift-off. Specifically, laser light is irradiated from the back surface side of the substrate 10 toward the first semiconductor layer 11. The substrate 10 is transmissive to the laser light; and the laser light has a wavelength in the absorption region of the first semiconductor layer 11.

When the laser light reaches the interface between the substrate 10 and the first semiconductor layer 11, the first semiconductor layer 11 proximal to the interface decomposes by absorbing the energy of the laser light. The first semiconductor layer 11 decomposes into gallium (Ga) and nitrogen gas. A micro gap is made between the substrate 10 and the first semiconductor layer 11 by this decomposition reaction; and the substrate 10 and the first semiconductor layer 11 separate.

The irradiation of the laser light is performed over the entire wafer by performing multiply for every set region; and the substrate 10 is removed.

In the case where the substrate 10 is the silicon substrate, the substrate 10 can be removed by etching.

Because the stacked body described above formed on the major surface of the substrate 10 is reinforced by the p-type metal pillar 67, the n-side metal pillar 68, and the resin layer 77 that are thicker than the semiconductor layer 15, it is possible to maintain the wafer state even in the case where there is no substrate 10.

The resin layer 77 and the metals included in the p-type metal pillar 67 and the n-side metal pillar 68 are materials more flexible than the semiconductor layer 15. The semiconductor layer 15 is supported by such a flexible support body. Therefore, destruction of the semiconductor layer 15 can be avoided even in the case where the large internal stress generated in the epitaxial growth of the semiconductor layer 15 on the substrate 10 is relieved all at once when peeling the substrate 10.

Figure 31B:
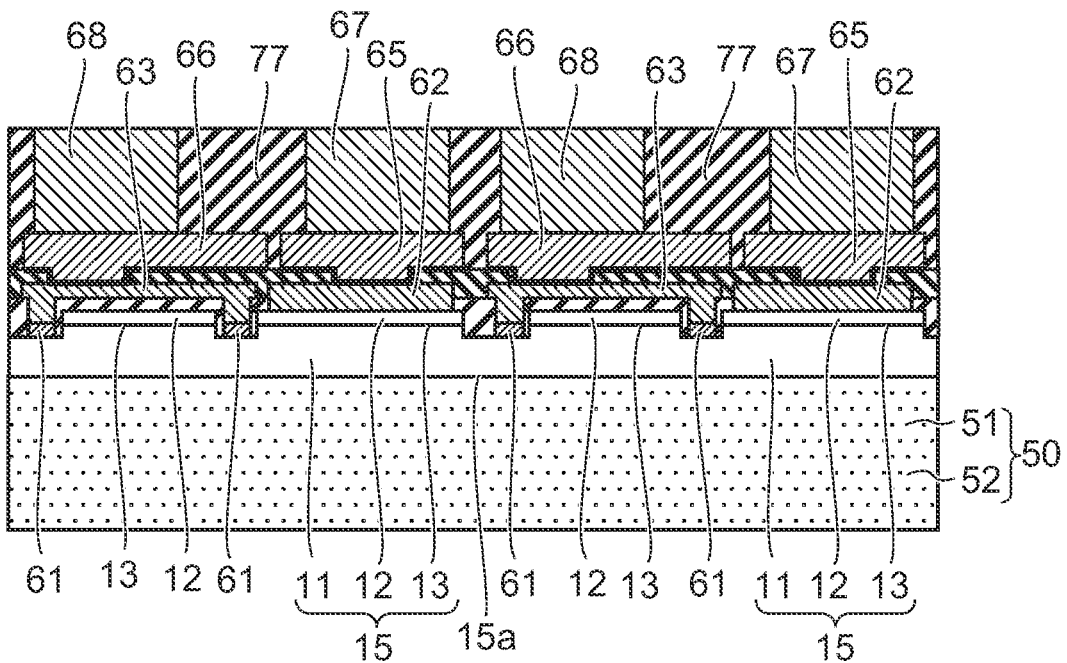

As shown in FIG. 31B, the phosphor layer 50 is formed on the first surface 15a exposed by the removal of the substrate 10. The polishing process of the resin layer 77 described above may be performed after the removal process of the substrate 10 or after the formation of the phosphor layer 50.

The phosphor layer 50 is formed by thermally curing the liquid transparent resin 51 into which the phosphor 52 is dispersed after supplying the transparent resin 51 onto the first surface 15a by a method such as, for example, printing, potting, molding, compression molding, etc.

Then, singulation into the multiple semiconductor light emitting devices 3 is performed as shown in FIGS. 32A and 32B by cutting the resin layer 77, the insulating film 76, the insulating film 71, the first semiconductor layer 11, and the phosphor layer 50 at the position of the trench 73 shown in FIG. 22A described above.

The singulated semiconductor light emitting device 3 may have a single-chip structure including one semiconductor layer or may have a mufti-chip structure including multiple semiconductor layers 15.

Because the processes described above until the dicing are performed collectively in the wafer state, it is unnecessary to perform the interconnects and the packaging for each of the individual devices that is singulated; and it becomes possible to drastically reduce the production costs. In other words, the interconnects and the packaging are already complete in the singulated state. Therefore, the productivity can be increased; and as a result, price reductions become easy.

Fourth Embodiment

Figure 34A:
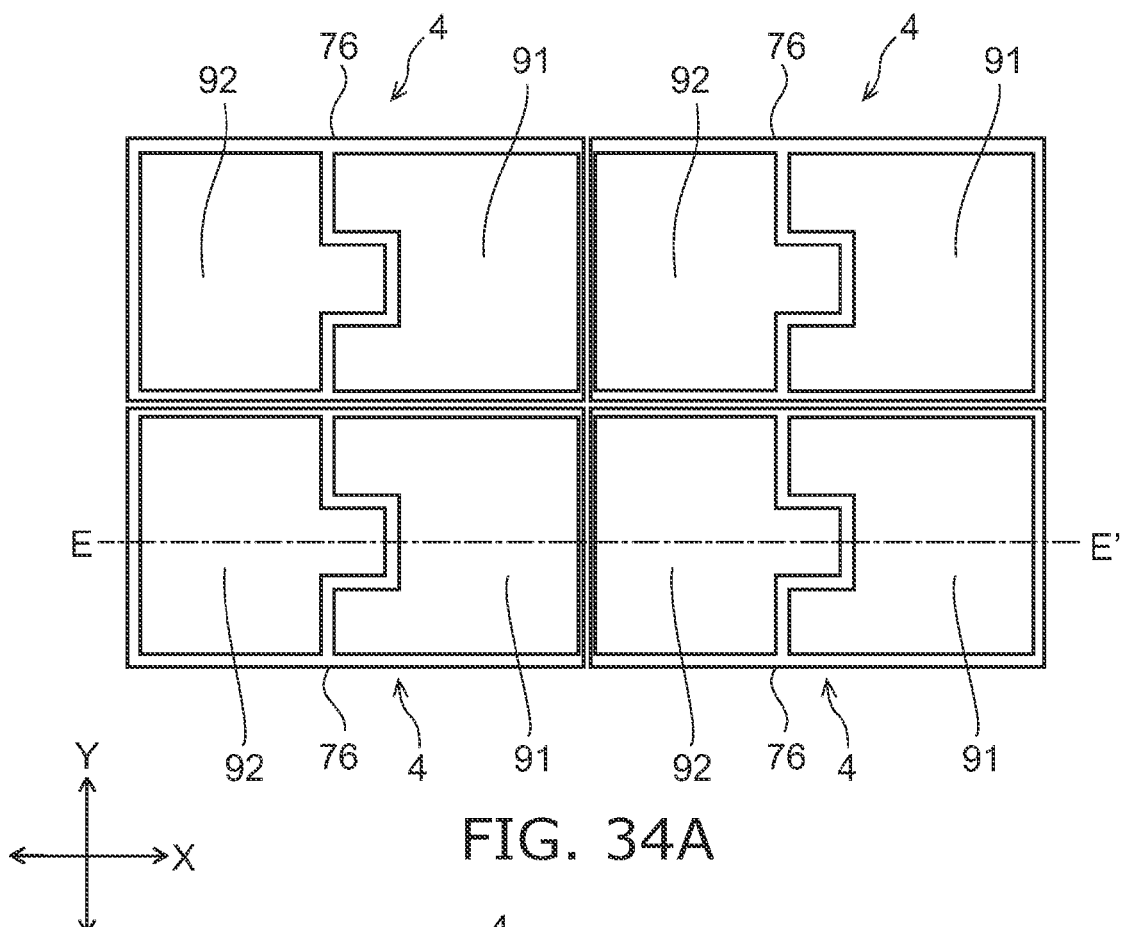
Figure 34B:
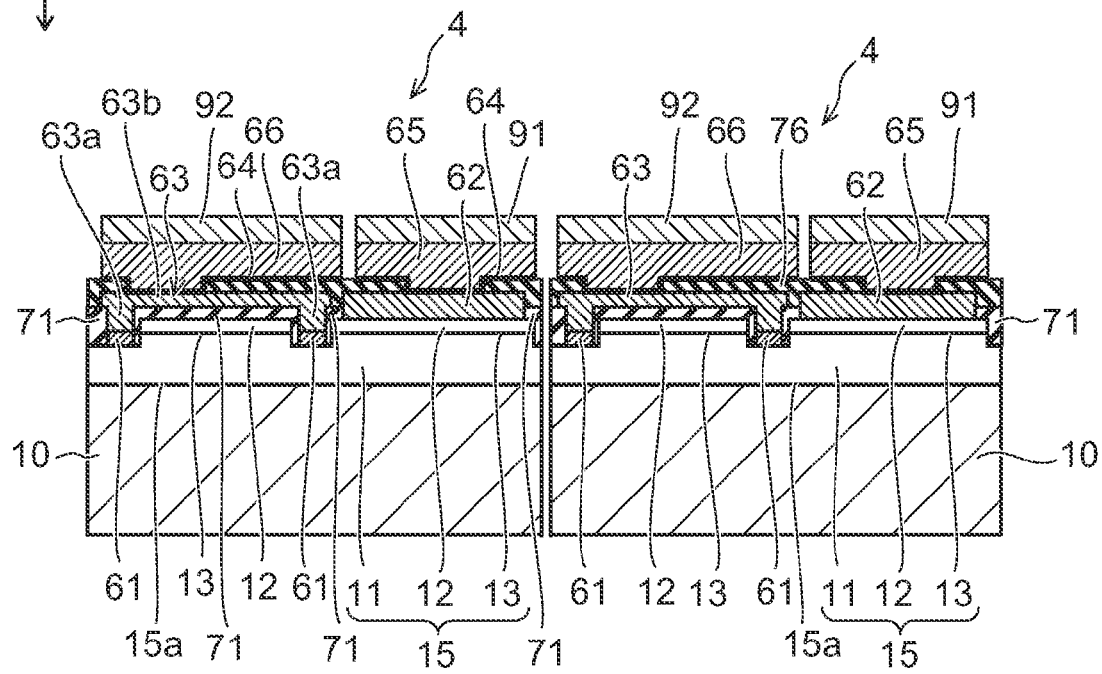

FIG. 34A is a schematic plan view of a semiconductor light emitting device 4 of a fourth embodiment. FIG. 34B is a schematic cross-sectional view of the semiconductor light emitting device 4 of the fourth embodiment.

FIG. 34A shows, for example, four semiconductor light emitting devices 4 singulated from the wafer state. FIG. 34B is the E-E' cross-sectional view of FIG. 34A.

The semiconductor light emitting device 4 of the fourth embodiment differs from the semiconductor light emitting device 3 of the third embodiment in that the semiconductor light emitting device 4 does not include the metal pillars 67 and 68 and the resin layer 77.

In the semiconductor light emitting device 4 of the fourth embodiment, the substrate 10 used in the growth of the semiconductor layer 15 is left on the first surface 15a; and the substrate 10 functions as a support body of the semiconductor layer 15. The substrate 10 is, for example, a sapphire substrate that is transmissive to the light emitted by the light emitting layer 13.

The refractive indexes of the GaN layer, the sapphire substrate, and air are 2.4, 1.8, and 1.0, respectively; and the refractive indexes of the media change in stages in the direction in which the light is extracted. Therefore, the light extraction efficiency can be increased. The phosphor layer 50 may be provided on the substrate 10.

Solder 91 is provided on the p-side interconnect layer 65; solder 92 is provided on the n-side interconnect layer 66; and the semiconductor light emitting device 4 is mounted on the mounting substrate by bonding the solder 91 and 92 to the pads of the mounting substrate.

Figure 33A:
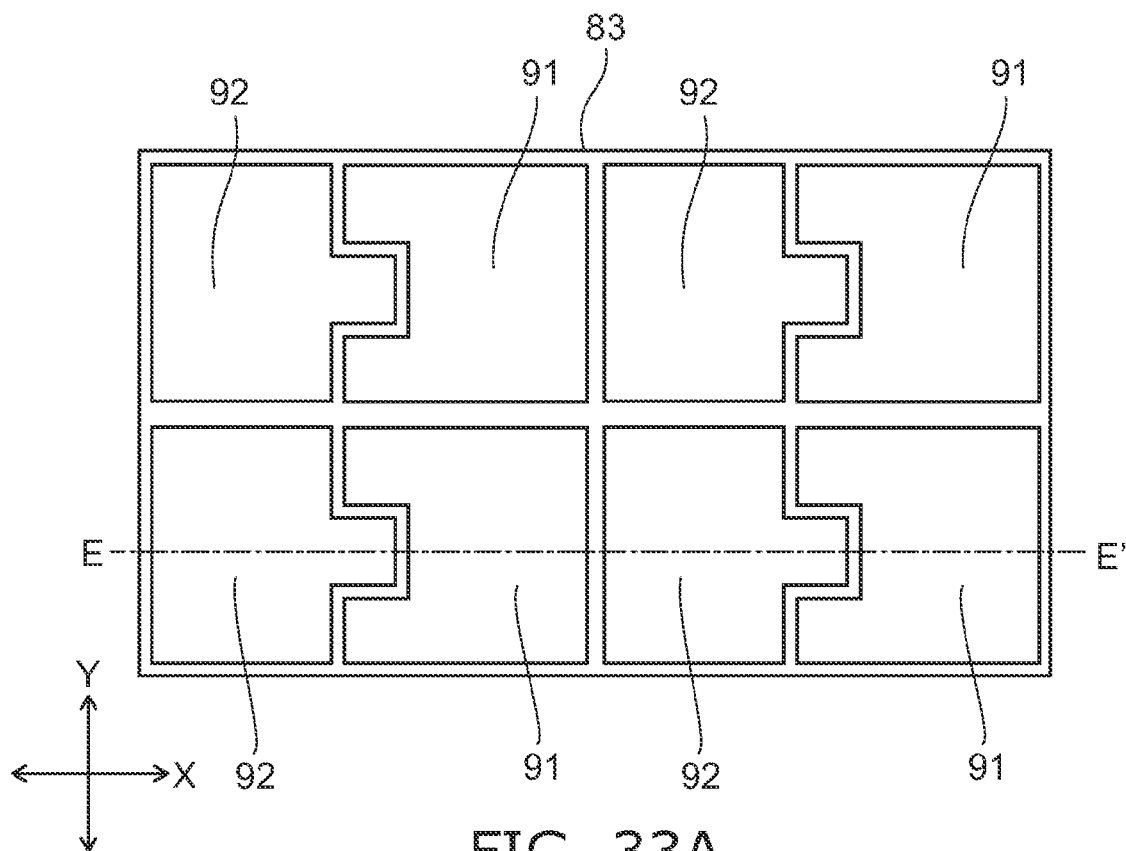
FIG. 33A to FIG. 34B are schematic views showing a method for manufacturing the semiconductor light emitting device of the fourth embodiment.
Figure 33B:
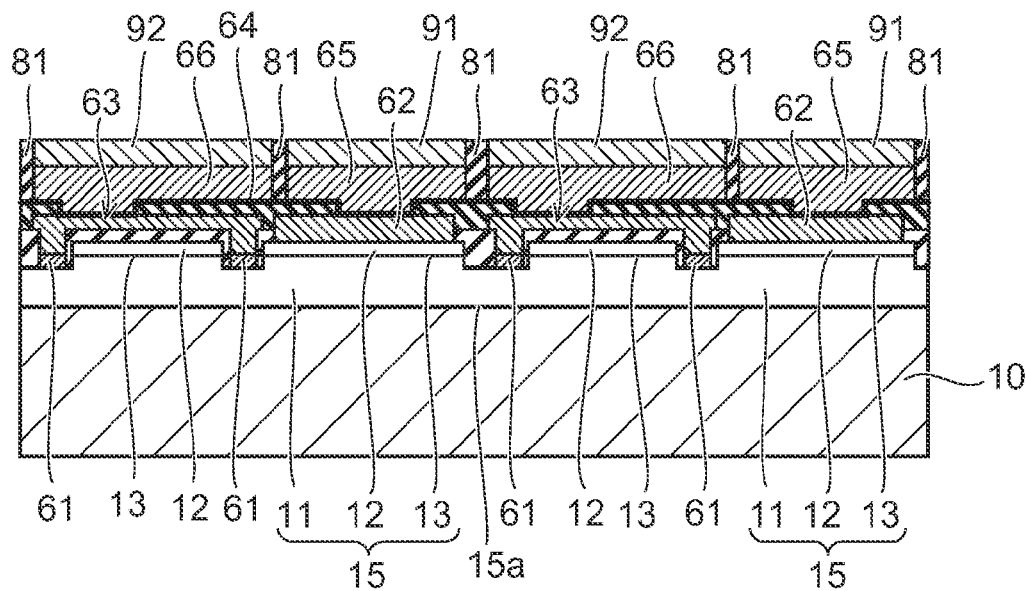

The processes up to those shown in FIGS. 27A and 27B progress similarly to the third embodiment recited above. Subsequently, as shown in FIGS. 33A and 33B, the solder 91 is formed on the p-side interconnect layer 65 and the solder 92 is formed on the n-side interconnect layer 66 by plating using the resist 81 as a mask.

Subsequently, the resist 81 is removed; and the exposed portion of the metal film 64 used as the seed metal of the plating is removed as shown in FIG. 34B. Thereby, the electrical connection by means of the metal film 64 between the p-side interconnect layer 65 and the n-side interconnect layer 66 is broken.

Subsequently, singulation into the multiple semiconductor light emitting devices 4 is performed by cutting the insulating film 76, the insulating film 71, the first semiconductor layer 11, and the substrate 10.

Fifth Embodiment

Figure 47A:
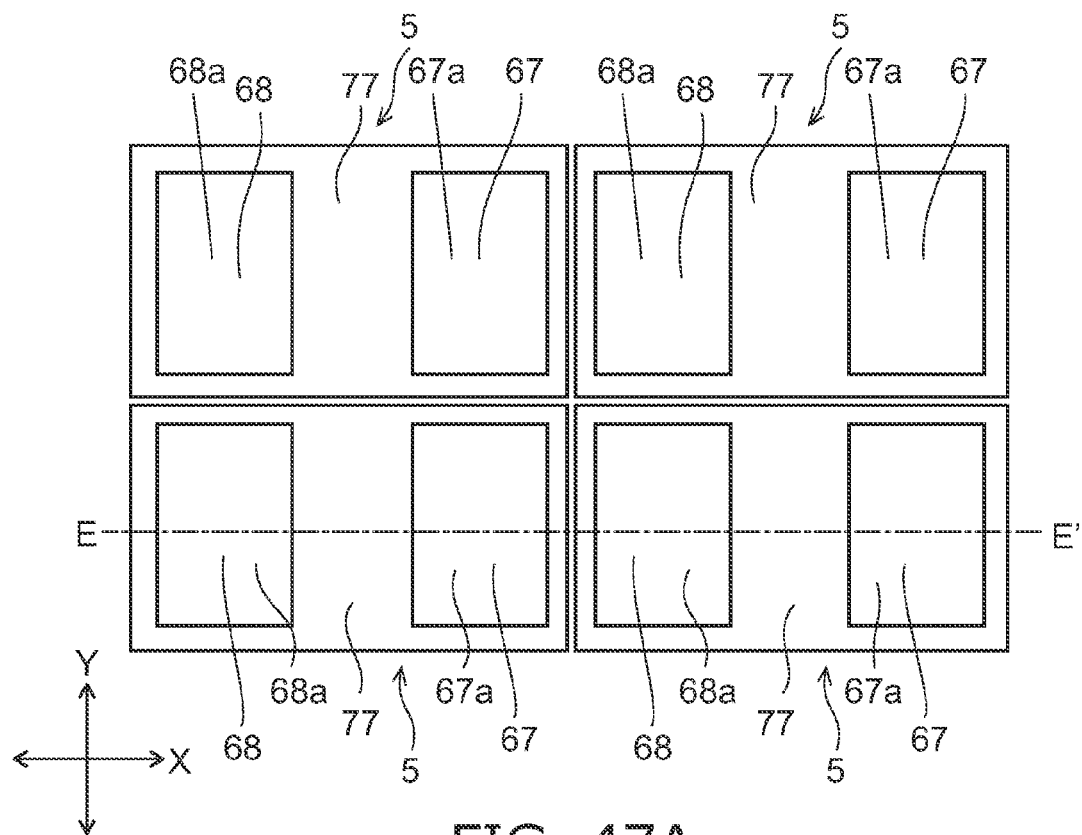
Figure 47B:
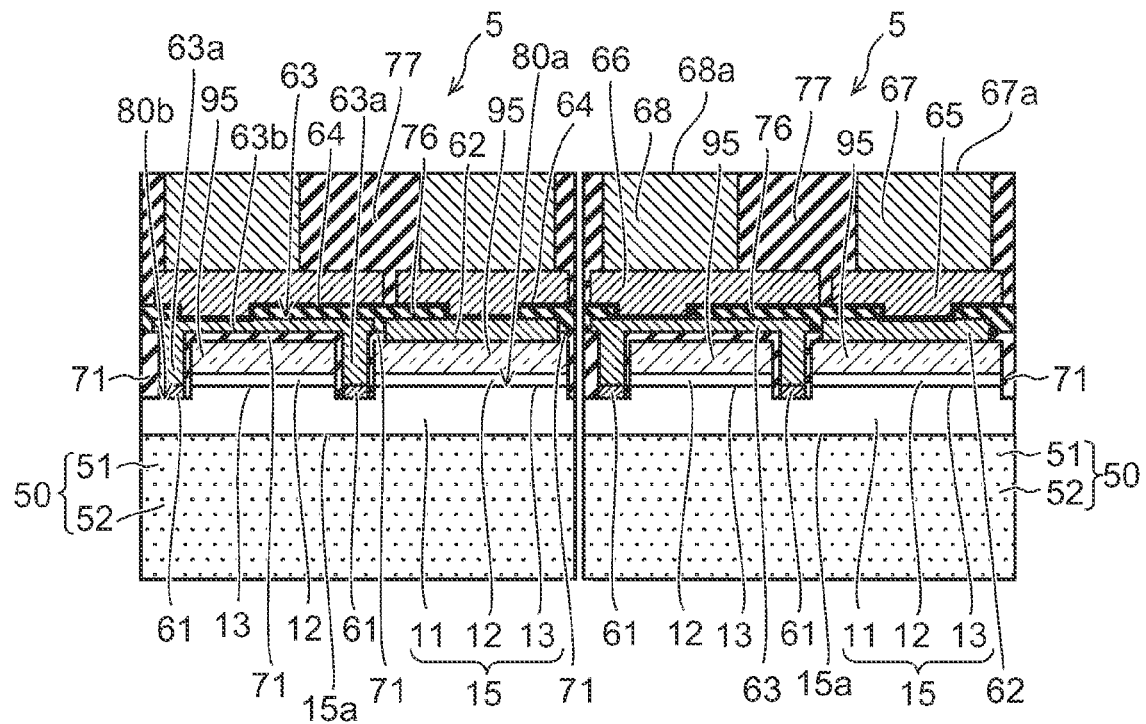

FIG. 47A is a schematic plan view of a semiconductor light emitting device 5 of a fifth embodiment; and FIG. 47B is a schematic cross-sectional view of the semiconductor light emitting device 5 of the fifth embodiment.

FIG. 47A shows, for example, four semiconductor light emitting devices 5 singulated from the wafer state. FIG. 47B is the E-E' cross-sectional view of FIG. 47A.

In addition to each of the components of the semiconductor light emitting device 3 of the third embodiment described above, the semiconductor light emitting device 5 of the fifth embodiment includes a transparent electrode 95. The transparent electrode 95 is transmissive (is transparent) to the light emitted by the light emitting layer 13; and the material of the transparent electrode 95 is, for example, ITO (Indium Tin Oxide).

The transparent electrode 95 is provided on the second semiconductor layer 12 and is not provided in the n-side regions 80b. The transparent electrode 95 is provided between the p-side electrode 62 and the second semiconductor layer 12 and is electrically connected to the p-side electrode 62 and the second semiconductor layer 12.

The transparent electrode 95 is provided also on the second semiconductor layer 12 under the n-side reflecting electrode 63. The insulating film 71 is provided between the n-side reflecting electrode 63 and the transparent electrode 95; and the n-side reflecting electrode 63 and the transparent electrode 95 do not connect to each other.

Figure 37A:
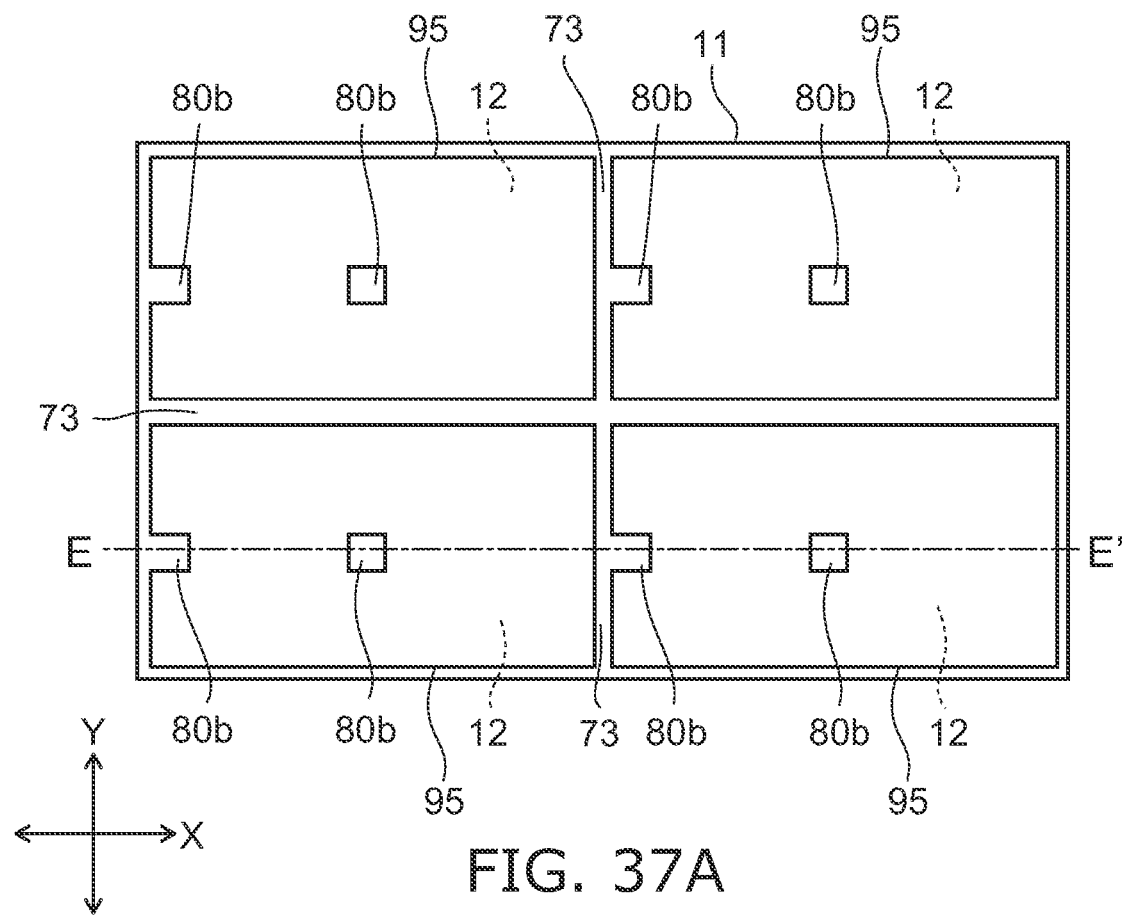

As shown in FIG. 37A which shows the top view of the transparent electrode 95, the transparent electrode 95 is provided on the second semiconductor layer 12 in the same planar pattern as the second semiconductor layer 12.

The transparent electrode 95 under the p-side electrode 62 and the transparent electrode 95 under the n-side reflecting electrode 63 are linked as a single body. Accordingly, the current from the p-side electrode 62 can be supplied to the light emitting layer 13 under the n-side reflecting electrode 63 by means of the transparent electrode 95.

The second semiconductor layer 12 including the p-type GaN which has a high resistance compared to an n-type GaN has an ability to cause the current to flow in the lateral direction (the direction perpendicular to the thickness direction) that is inferior to that of the first semiconductor layer 11 including the n-type GaN.

However, according to the fifth embodiment, the ability of the current supplied from the second semiconductor layer 12 side to the light emitting layer 13 to flow in the lateral direction can be increased by providing the transparent electrode 95 on the second semiconductor layer 12. As a result, in particular, the light emission intensity in the region under the n-side reflecting electrode 63 where the p-side electrode 62 is not provided can be increased.

By controlling the thickness of the transparent electrode 95 such that the distance between the light emitting layer 13 and the n-side reflecting electrode 63 is ½ of the light emission wavelength of the light emitting layer 13, the reflection loss due to interference can be suppressed; and a high reflection efficiency is obtained.

A method for manufacturing the semiconductor light emitting device 5 of the fifth embodiment will now be described with reference to FIG. 36A to FIG. 47B. FIG. 36A to FIG. 47B show a partial region in the wafer state.

FIG. 36B, FIG. 37B, FIG. 38B, FIG. 39B, FIG. 40B, FIG. 41B, FIG. 42B, FIG. 43B, FIG. 44B, FIG. 45B, and FIG. 47B show the E-E' cross sections of FIG. 36A, FIG. 37A, FIG. 38A, FIG. 39A, FIG. 40A, FIG. 41A, FIG. 42A, FIG. 43A, FIG. 44A, FIG. 45A, and FIG. 47A, respectively.

Figure 36A:
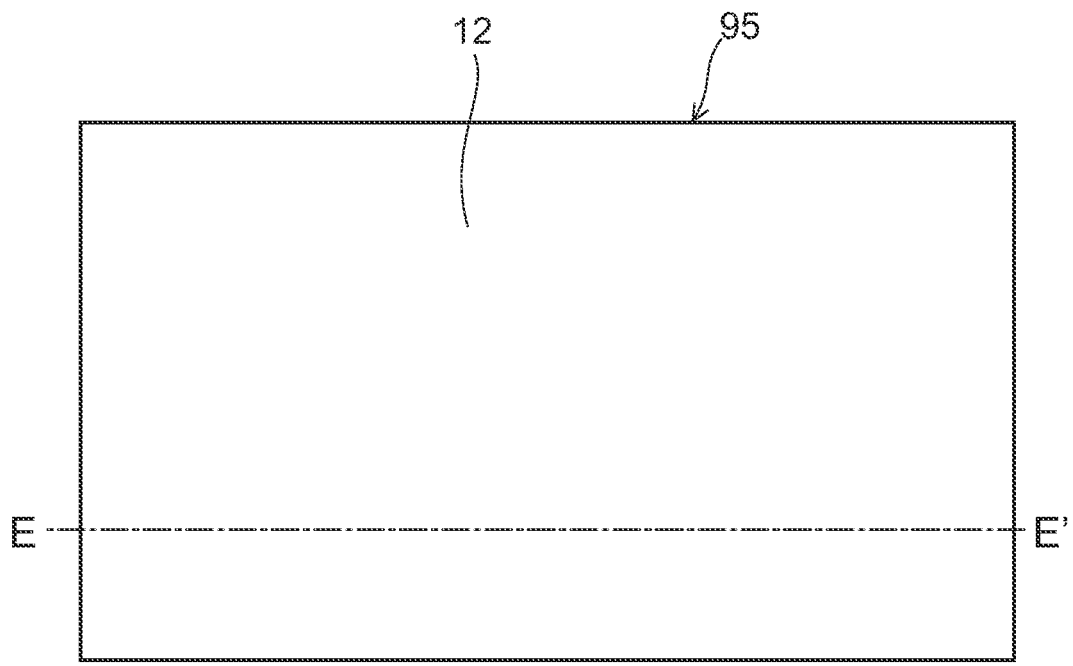
FIG. 36A to FIG. 47B are schematic views showing a method for manufacturing the semiconductor light emitting device of the fifth embodiment.
Figure 36B:
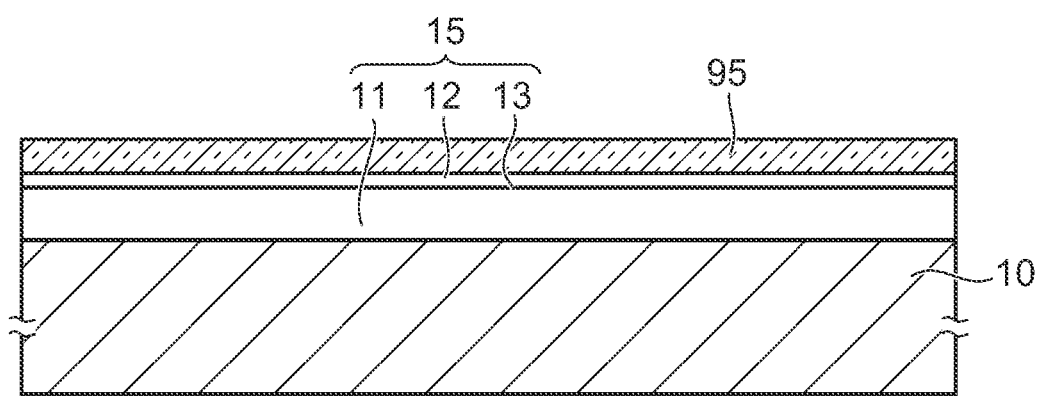

As shown in FIG. 36B, the transparent electrode 95 is formed on the entire surface of the second semiconductor layer after the semiconductor layer 15 including the first semiconductor layer 11, the light emitting layer 13, and the second semiconductor layer 12 is formed on the substrate 10.

Figure 37B:
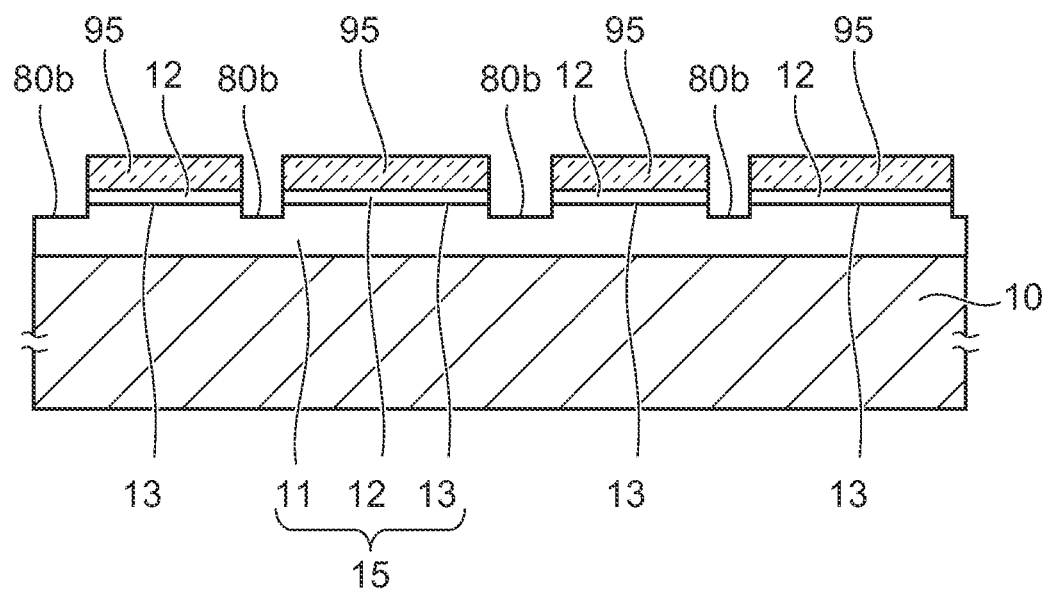

Then, a portion of the first semiconductor layer 11 is exposed by removing a portion of the stacked film of the transparent electrode 95, the second semiconductor layer 12, and the light emitting layer 13 as shown in FIGS. 37A and 37B by, for example, RIE using a not-shown resist. The regions where the first semiconductor layer 11 is exposed are the n-side regions 80b not including the transparent electrode 95, the second semiconductor layer 12, and the light emitting layer 13.

Figure 38A:
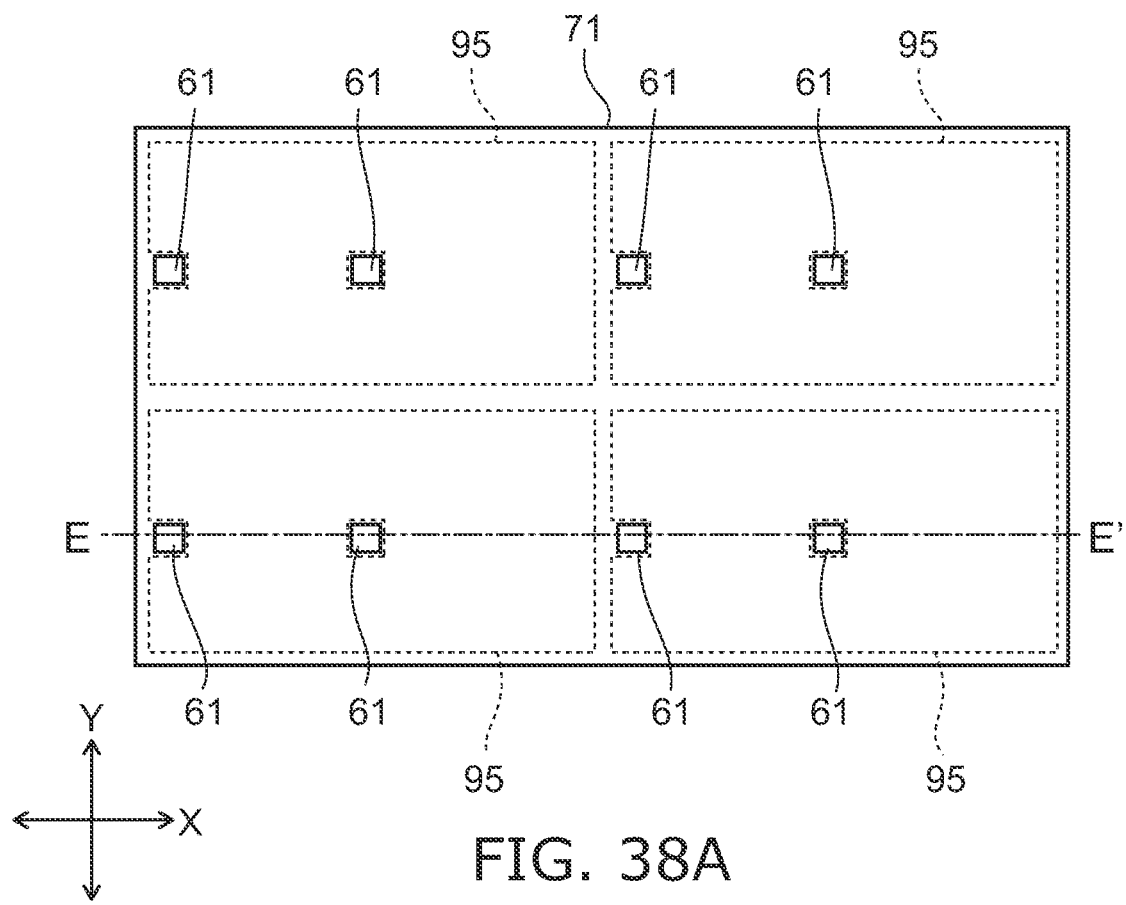
Figure 38B:
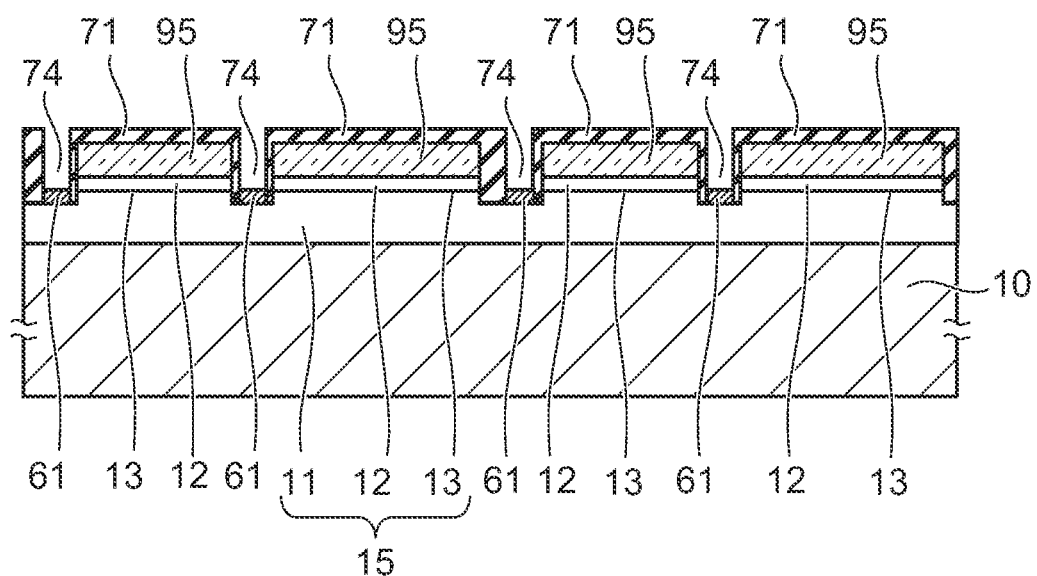
Figure 39A:
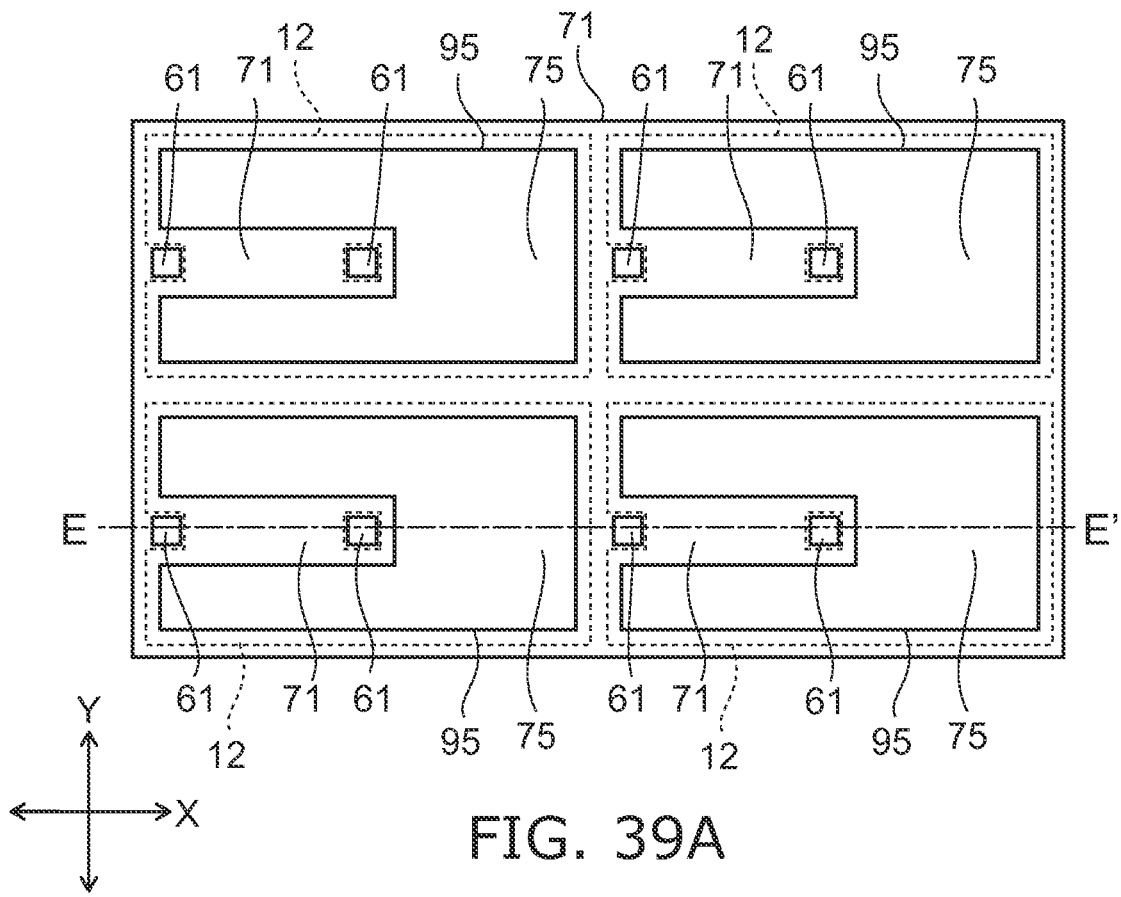
Figure 39B:
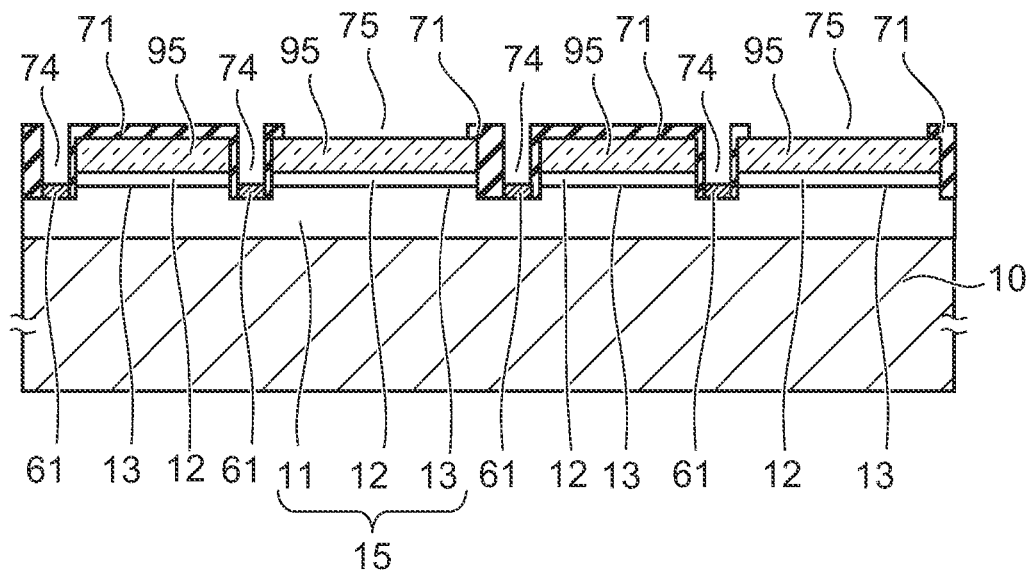

Continuing, after covering all of the exposed portions on the substrate 10 with the insulating film 71 shown in FIGS. 38A and 38B, the openings 74 are made selectively in the insulating film 71. The opening 75 is made in the insulating film 71 on the transparent electrode 95 by removing a portion of the insulating film 71 covering the front surface of the transparent electrode 95 as shown in FIGS. 39A and 39B.

Figure 40A:
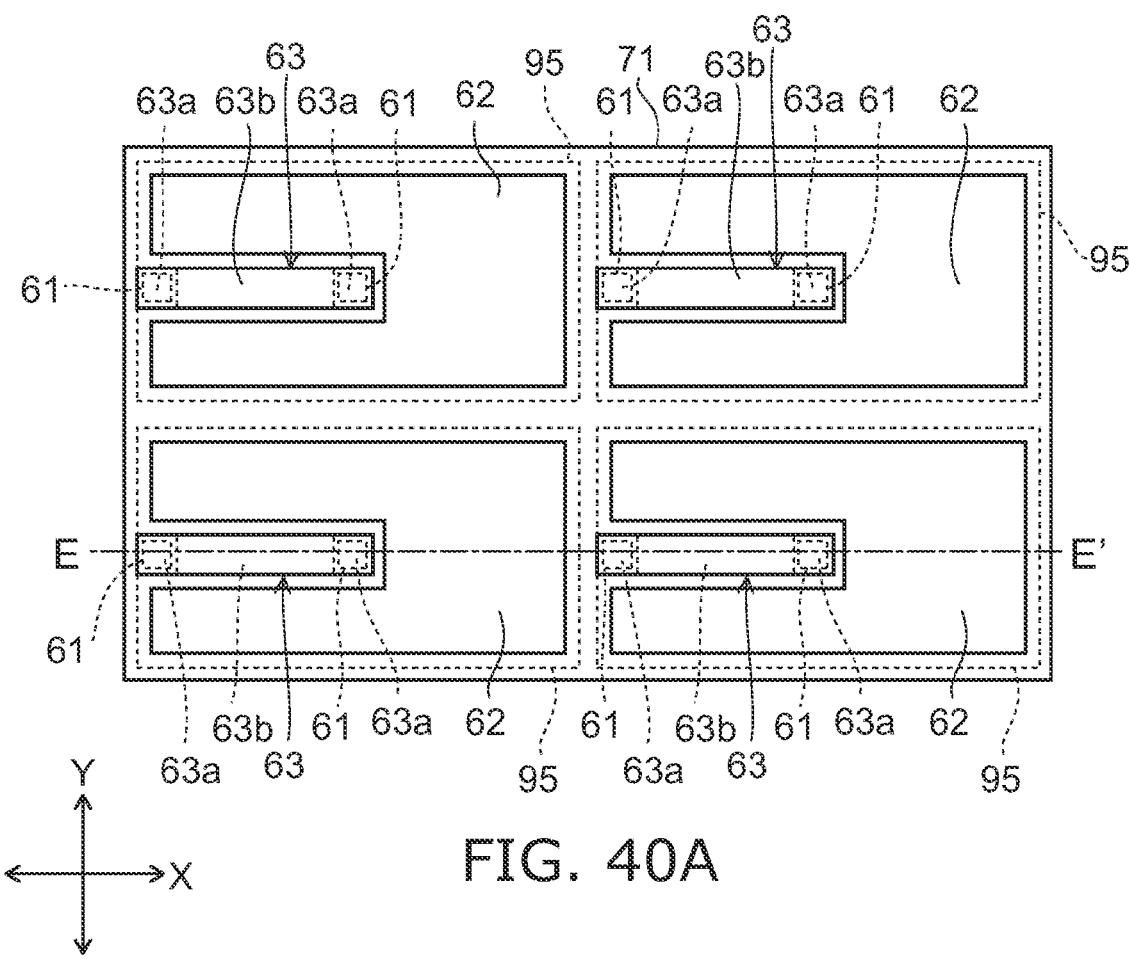
Figure 40B:
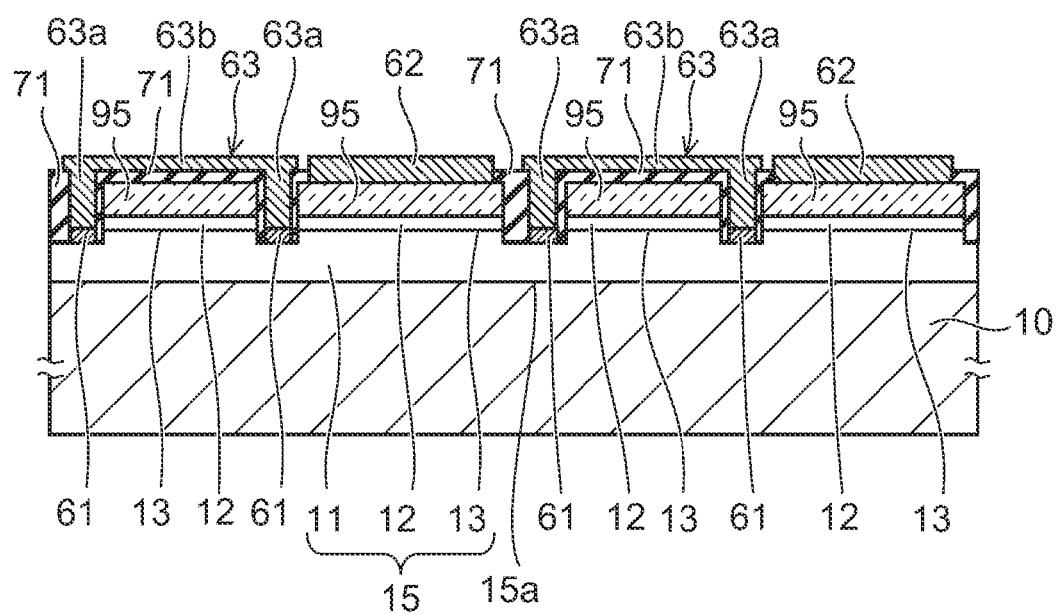

As shown in FIGS. 40A and 40B, the n-side vias 63a are formed on the n-side electrodes 61 inside the openings 74; the linking portion 63b is formed on the insulating film 71 on the second semiconductor layer 12 between the n-side electrodes 61; and the p-side electrode 62 is formed on the front surface of the transparent electrode 95 inside the opening 75.

Figure 41A:
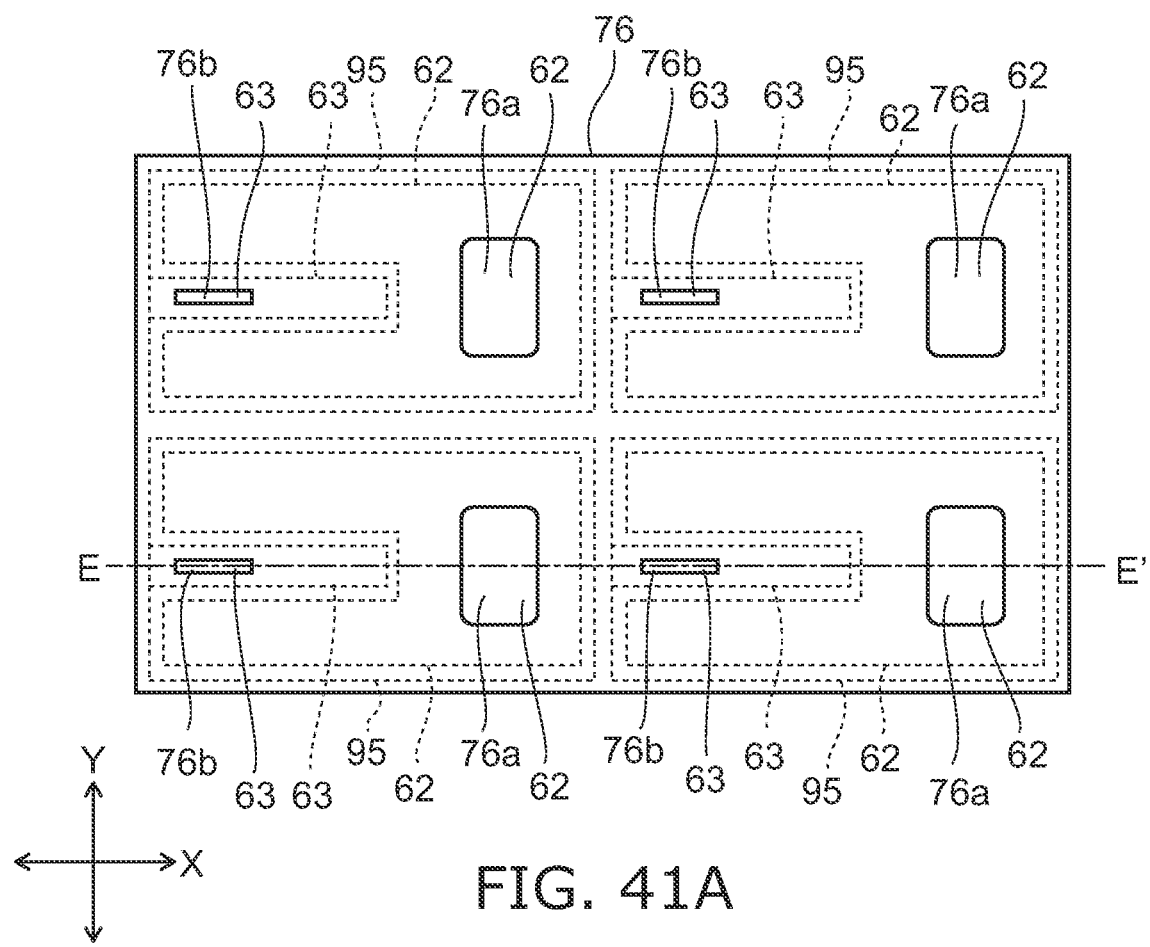
Figure 41B:
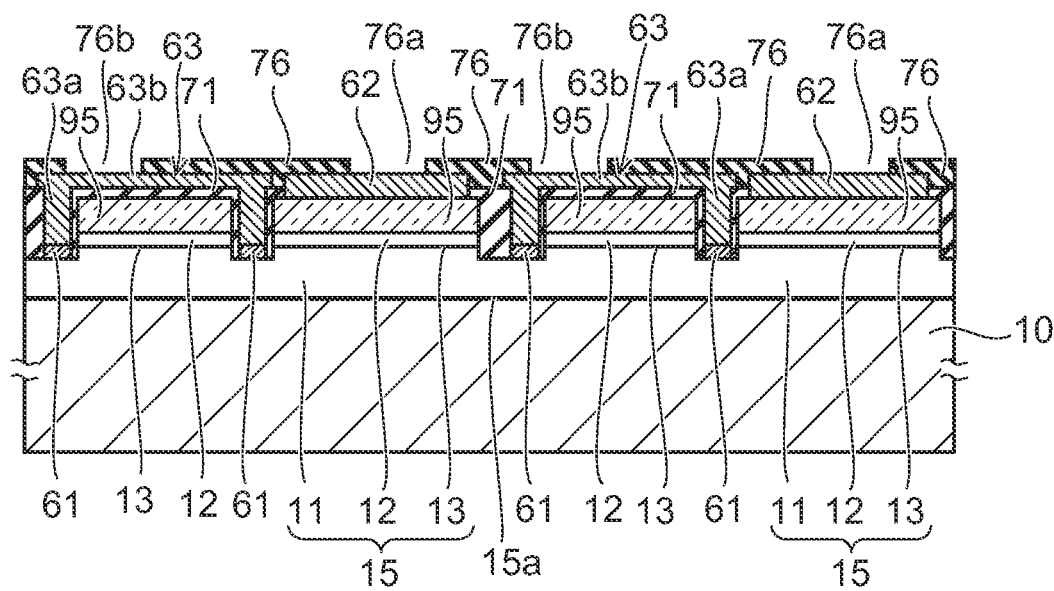

Then, after covering all of the exposed portions on the substrate 10 major surface with the insulating film 76 shown in FIG. 41B, the first opening 76a is made by removing a portion of the insulating film 76 on the p-side electrode 62; and the second opening 76b is made by removing a portion of the insulating film 76 on the n-side reflecting electrode 63. The p-side electrode 62 in the first opening 76a is exposed; and the n-side reflecting electrode 63 in the second opening 76b is exposed.

Figure 42A:
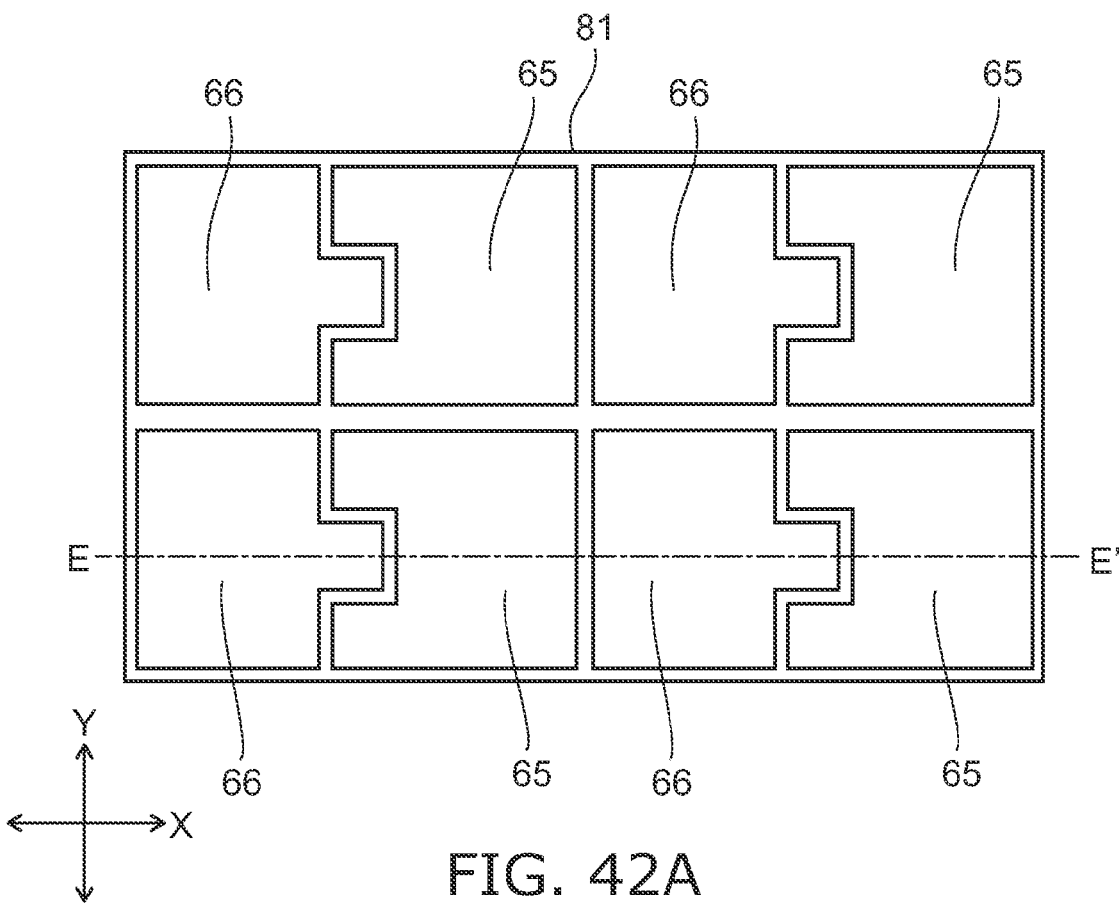
Figure 42B:
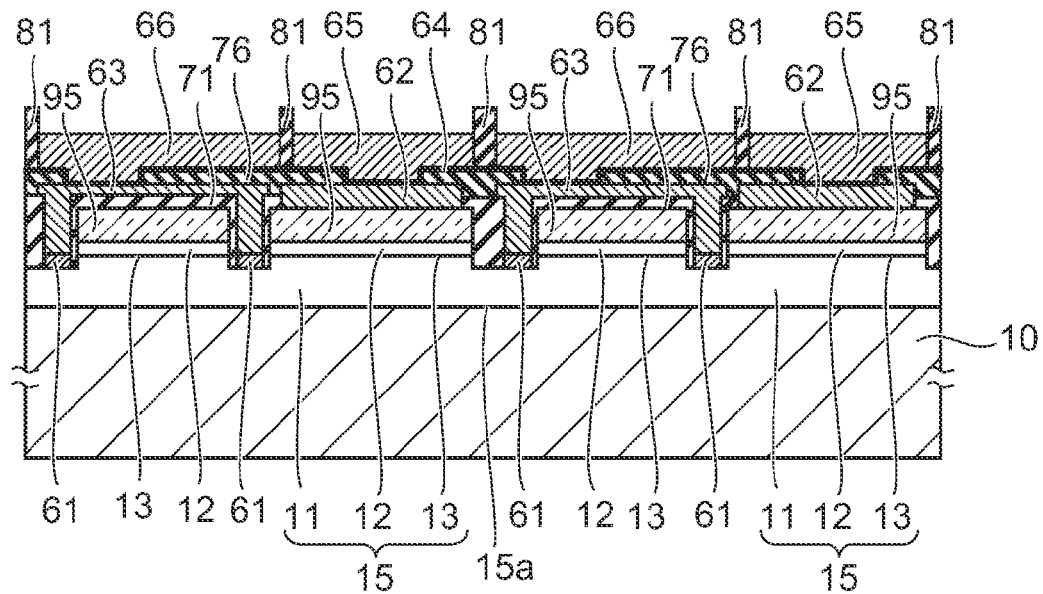

Continuing, as shown in FIG. 42B, the metal film 64 is formed on the front surface of the insulating film 76, the inner wall (the side wall and the bottom portion) of the first opening 76a, and the inner wall (the side wall and the bottom portion) of the second opening 76b.

Then, the resist 81 is formed selectively on the metal film 64; and Cu electroplating is performed using the metal film 64 as a current path. Thereby, the p-side interconnect layer 65 and the n-side interconnect layer 66 are formed selectively on the metal film 64.

Figure 43A:
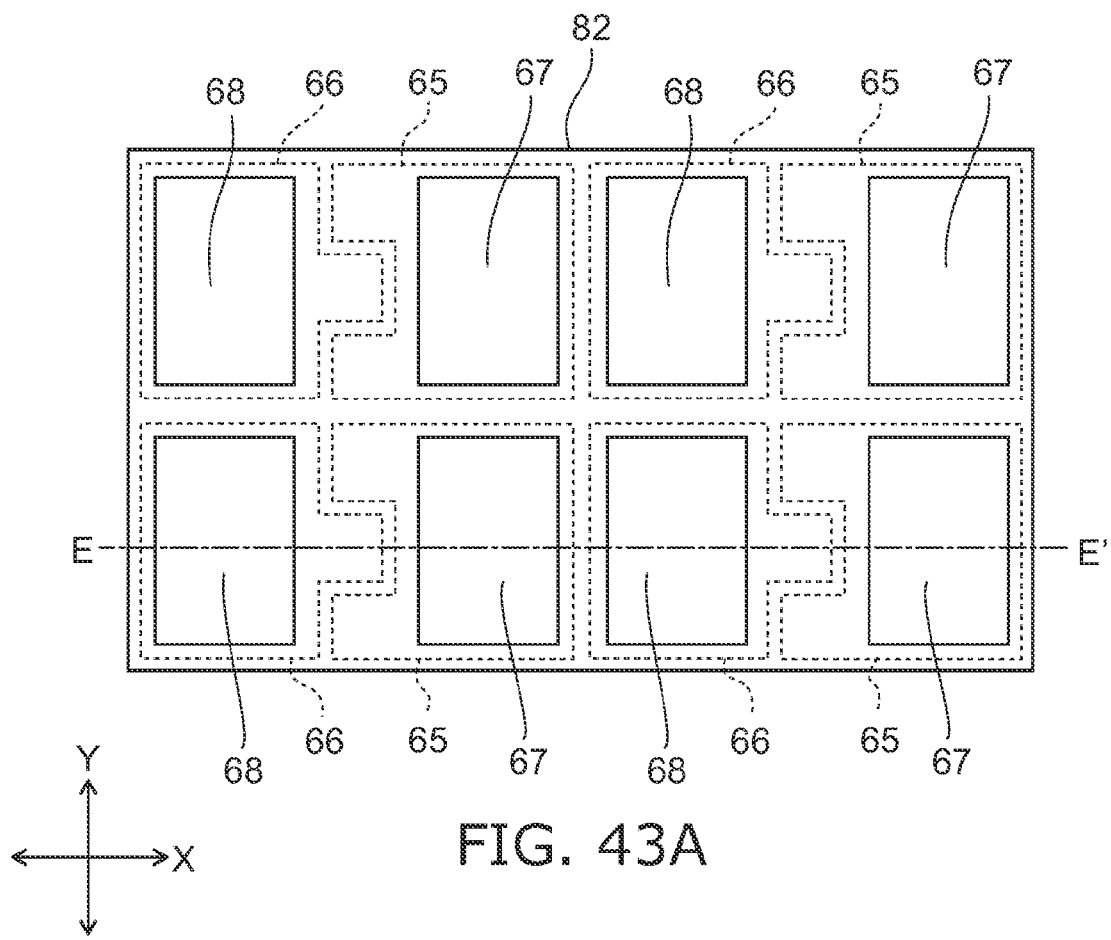
Figure 43B:
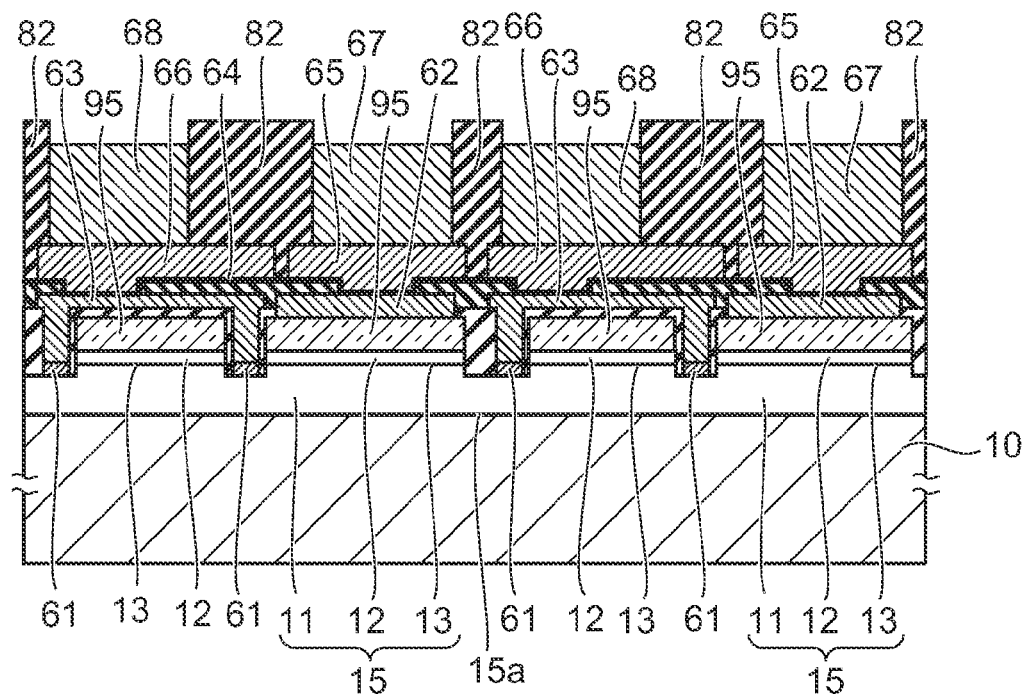

Continuing as shown in FIGS. 43A and 43B, the resist 82 for forming the metal pillars is formed. Then, Cu electroplating using the metal film 64 as a current path is performed using the resist 82 as a mask. Thereby, the p-type metal pillar 67 is formed on the p-side interconnect layer 65; and the n-side metal pillar 68 is formed on the n-side interconnect layer 66.

Figure 44A:
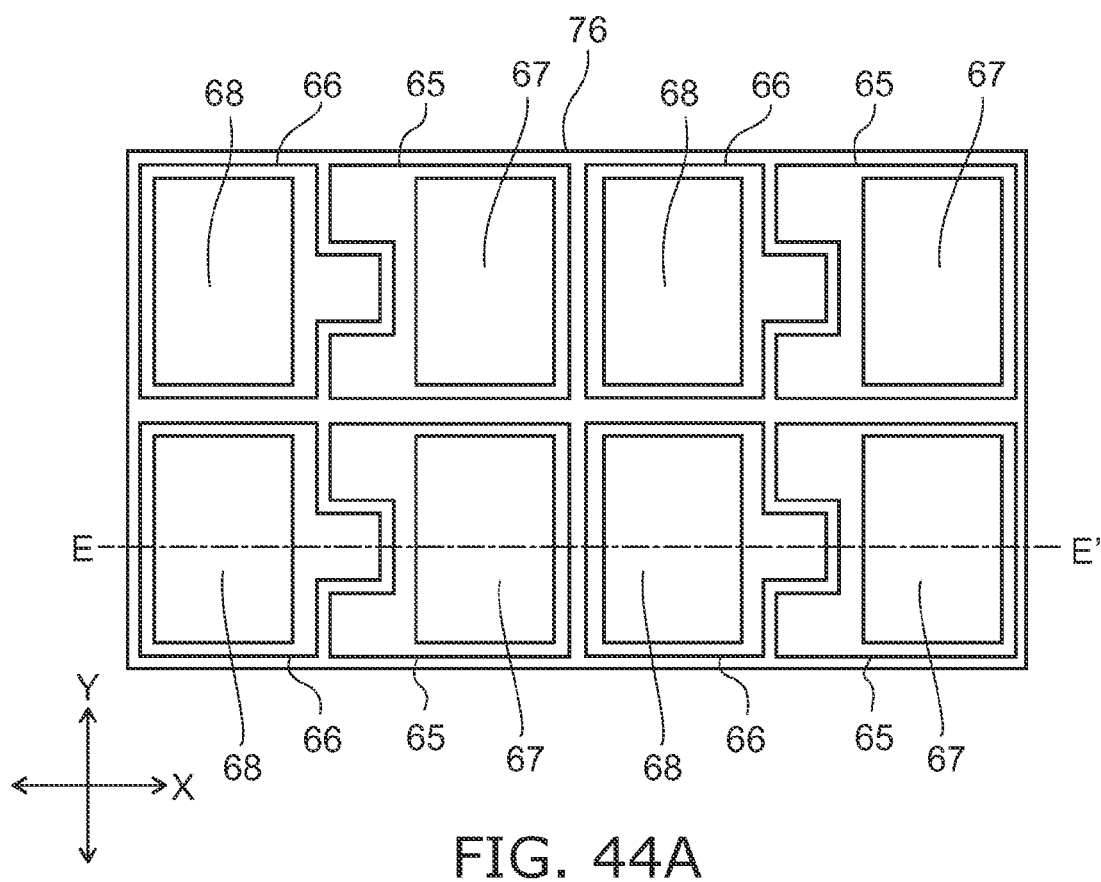
Figure 44B:
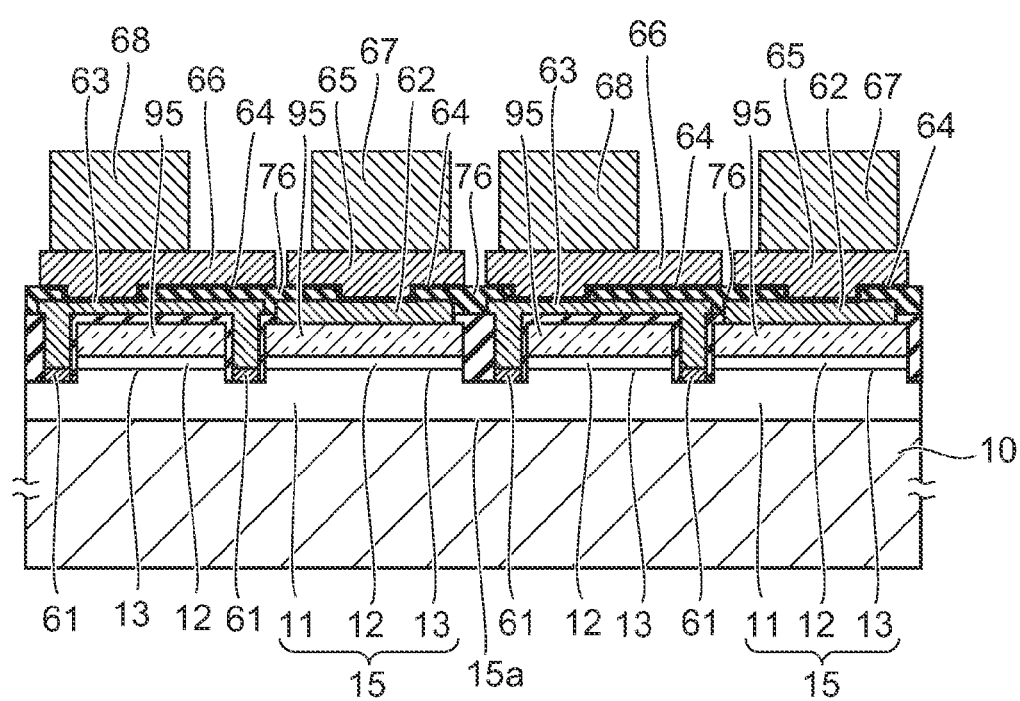

The resist 82 is removed as shown in FIG. 44B using, for example, a solvent or oxygen plasma. Subsequently, the exposed portion of the metal film 64 used as the seed metal is removed by we etching. Thereby, as shown in FIG. 44B, the electrical connection by means of the metal film 64 between the p-side interconnect layer 65 and the n-side interconnect layer 66 is broken.

Figure 45A:
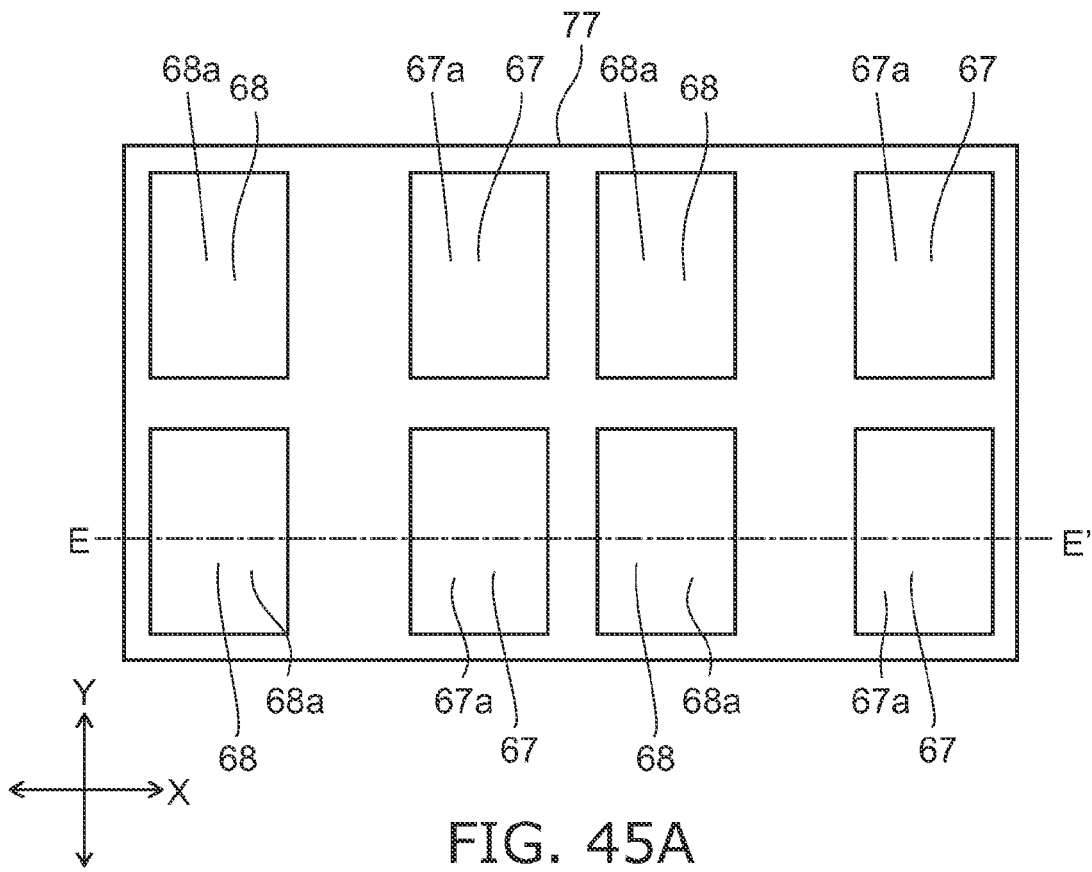
Figure 45B:
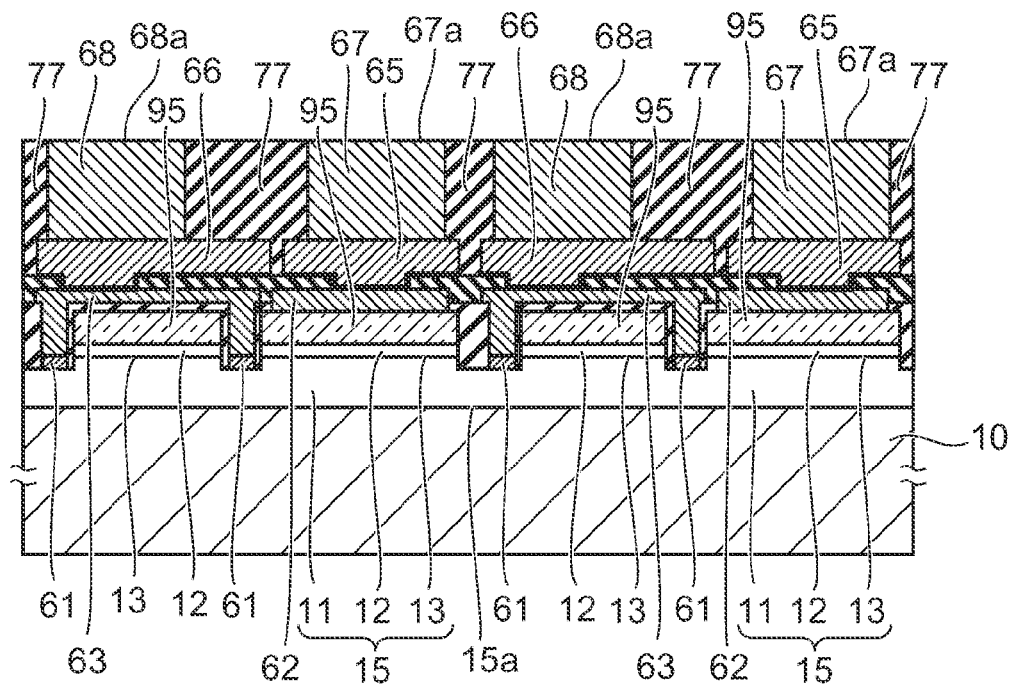

Then, as shown in FIGS. 45A and 45B, after forming the resin layer 77 covering the p-side interconnect layer 65, the n-side interconnect layer 66, the p-type metal pillar 67, and the n-side metal pillar 68, the resin layer 77 is polished to expose the end surface (the p-side external terminal 67*a*) of the p-type metal pillar 67 and the end surface (the n-side external terminal 68*a*) of the n-side metal pillar 68 from the resin layer 77.

Figure 46A:
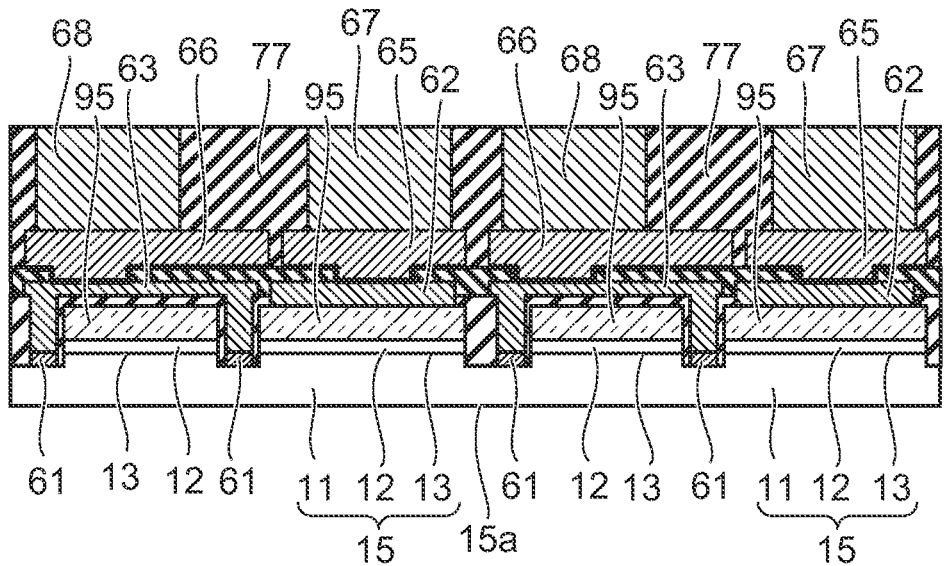

Continuing as shown in FIG. 46A, the substrate 10 is removed. In the case where the substrate 10 is the sapphire substrate, the substrate 10 can be removed by, for example, laser lift-off. In the case where the substrate 10 is the silicon substrate, the substrate 10 can be removed by etching.

Figure 46B:
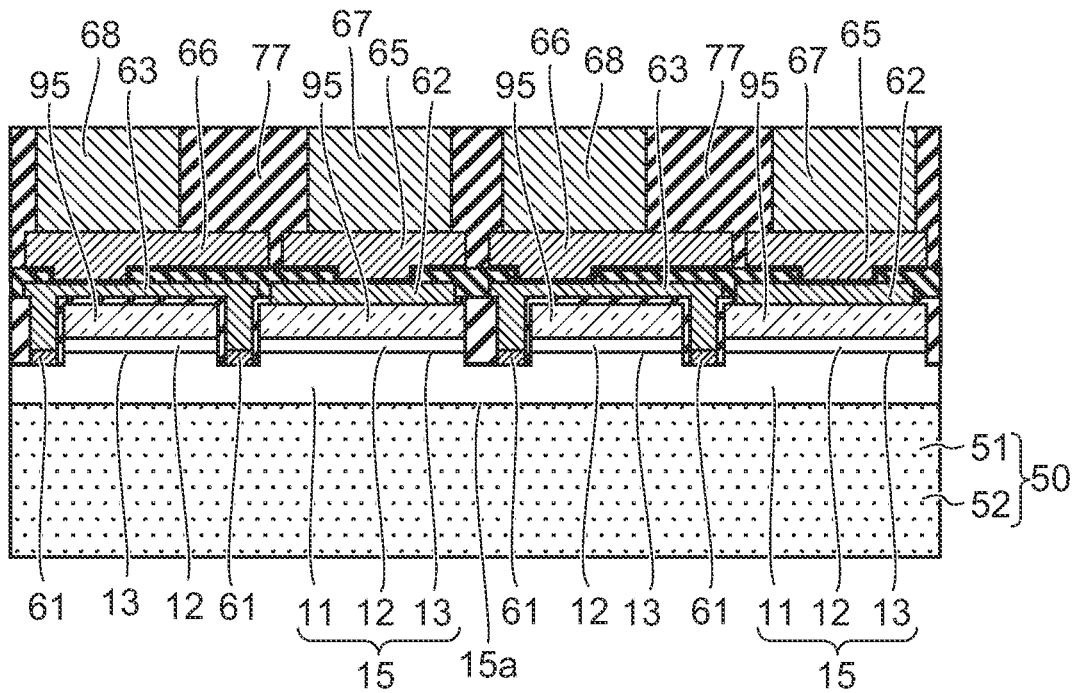

As shown in FIG. 46B, the phosphor layer 50 is formed on the first surface 15*a* exposed by the removal of the substrate 10. The polishing process of the resin layer 77 described above may be performed after the removal process of the substrate 10 and may be performed after the formation of the phosphor layer 50.

Then, singulation into the multiple semiconductor light emitting devices 5 is performed as shown in FIGS. 47A and 47B by cutting the resin layer 77, the insulating film 76, the insulating film 71, the first semiconductor layer 11, and the phosphor layer 50 at the position of the trench 73 shown in FIG. 37A.

In the embodiment as well, because each of the processes described above until the dicing is performed can be performed collectively in the wafer state, it is unnecessary to perform the interconnects and the packaging for every singulated individual device; and it becomes possible to drastically reduce the production costs. In other words, the interconnects and the packaging are already complete in the singulated state. Therefore, the productivity can be increased; and as a result, price reductions become easy.

Figure 35:
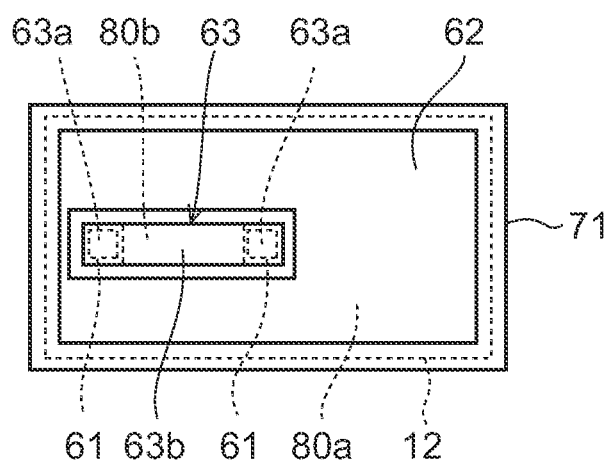
FIG. 35 is a schematic plan view of another semiconductor light emitting device of the third, fourth and fifth embodiments.

FIG. 35 shows a modification of the semiconductor light emitting devices of the third to fifth embodiments and corresponds to one chip region of the plan view of FIG. 25A.

In other words, in the structure of FIG. 35 similarly to the first and second embodiments described above, the p-side region 80*a*, the light emitting layer 13, and the second semiconductor layer 12 exist completely around the n-side regions 80*b* and the n-side electrodes 61 provided on the n-side regions 80*b*.

Accordingly, the current spreads from one n-side electrode 61 to the entire peripheral region of the one n-side electrode 61; and the current can be supplied efficiently to the entire region of the light emitting layer 13. Accordingly, the entire region of the light emitting layer 13 can be efficiently caused to emit light.

Sixth Embodiment

Figure 48:
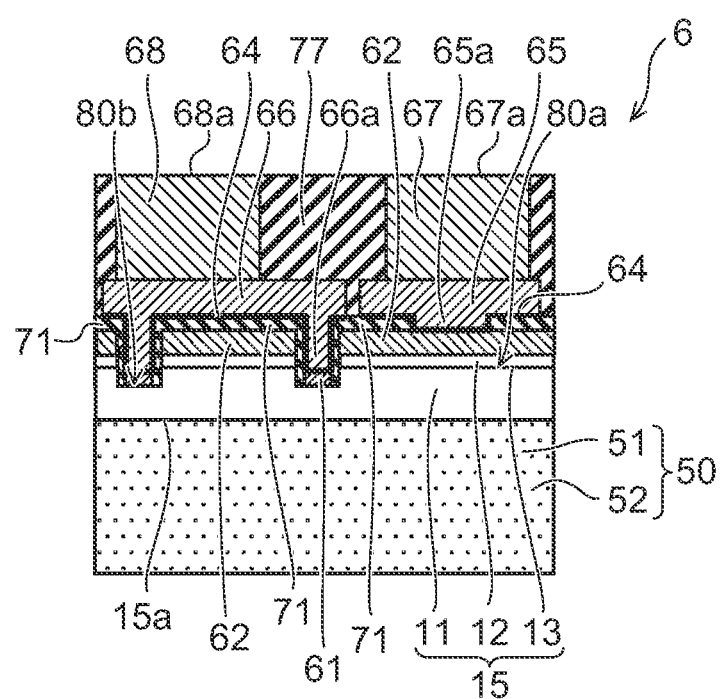
FIG. 48 is a schematic cross-sectional view of a semiconductor light emitting device of a sixth embodiment.

FIG. 48 is a schematic cross-sectional view of a semiconductor light emitting device 6 of a sixth embodiment.

Figure 50A:
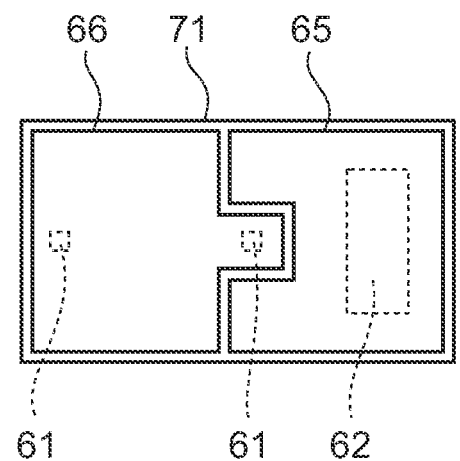
Figure 50B:
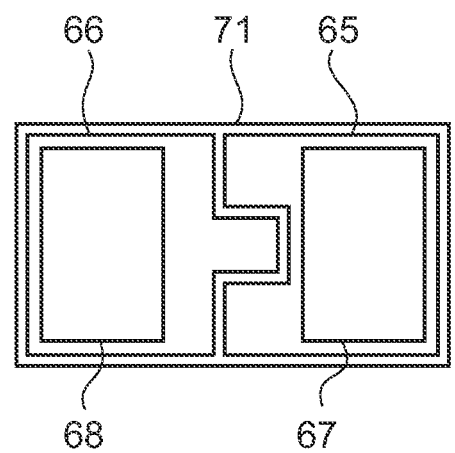
Figure 50C:
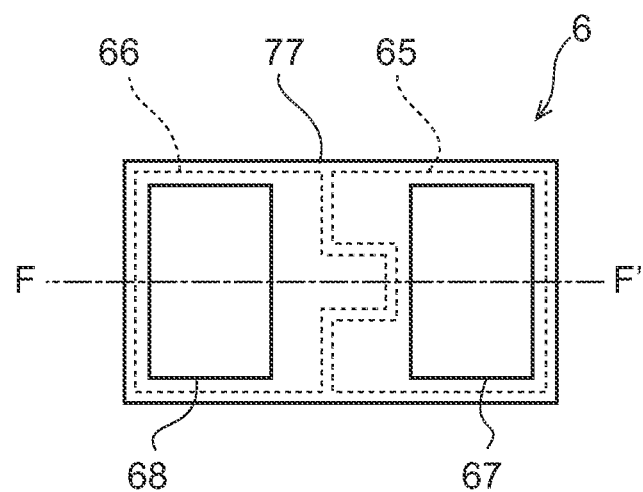

FIG. 50C is a schematic plan view of the semiconductor light emitting device 6 of the sixth embodiment; and FIG. 48 corresponds to the F-F' cross section of FIG. 50C.

FIG. 49A to FIG. 50B are schematic plan views of the components of the semiconductor light emitting device 6 of the sixth embodiment on the second surface side.

Similarly to the embodiment recited above, the semiconductor light emitting device 6 of the sixth embodiment includes the semiconductor layer 15. The semiconductor layer includes the first semiconductor layer 11, the second semiconductor layer 12, and the light emitting layer 13.

Figure 49A:
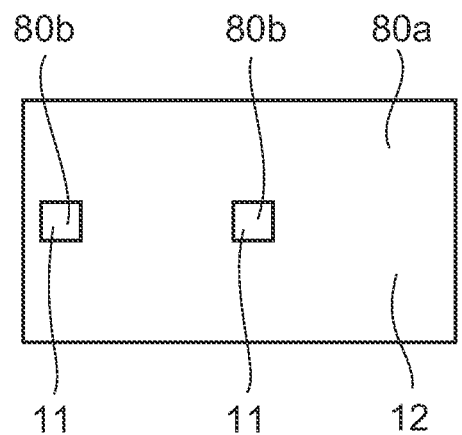
FIG. 49A to FIG. 50C are schematic plan views of the semiconductor light emitting device of the sixth embodiment.

The first semiconductor layer 11 including the n-type GaN layer has the first surface 15*a* and the second surface provided on the side opposite to the first surface 15*a*. As shown in FIG. 49A, the second surface has the p-side region 80*a* and the n-side regions 80*b*.

The light emitting layer (the active layer) 13 is provided on the p-side region 80*a* at the second surface of the first semiconductor layer 11; and the second semiconductor layer 12 including the p-type GaN layer is provided on the light emitting layer 13. The light emitting layer 13 is provided between the first semiconductor layer 11 and the second semiconductor layer 12.

The light emitting layer 13 and the second semiconductor layer 12 are not provided in the n-side regions 80*b* at the second surface of the first semiconductor layer 11.

The p-side electrode 62 is provided on the front surface of the second semiconductor layer 12. The n-side electrodes 61 are provided on the n-side regions 80*b* at the second surface of the first semiconductor layer 11.

The n-side regions 80*b* are formed by the front surface of the first semiconductor layer 11 being exposed by selectively removing a portion of the light emitting layer 13 and the second semiconductor layer 12 formed on the entire surface of the second surface of the first semiconductor layer 11.

Figure 49B:
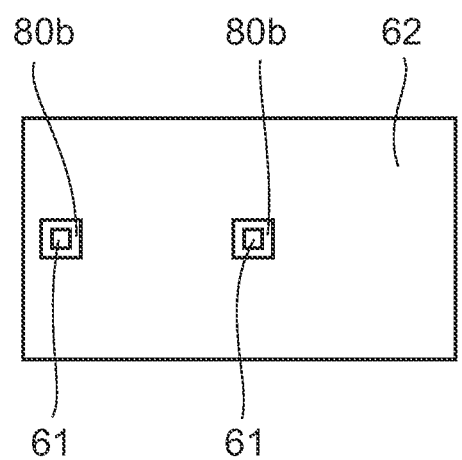

As shown in FIG. 49A, the n-side regions 80*b* are formed in multiple locations (e.g., two locations) for every one chip. As shown in FIG. 49B, the n-side electrodes 61 are provided respectively on the n-side regions 80*b*.

The p-side electrode 62 is provided also on the second semiconductor layer 12 provided between the two n-side electrodes 61. The p-side electrode 62 is provided on the region including the light emitting layer 13; and the n-side electrodes 61 are provided on the n-side regions 80*b* not including the light emitting layer 13.

The insulating film 71 is provided on the p-side electrode 62. The insulating film 71 is provided also on the side surfaces of the n-side electrodes 61, the side surface of the light emitting layer 13, the side surface of the second semiconductor layer 12, and the side surface of the p-side electrode 62.

The p-side electrode 62 contacts the second semiconductor layer 12 and includes a contact layer including, for example, at least one selected from nickel (Ni), gold (Au), and rhodium (Rh) that is capable of forming an alloy with the gallium (Ga) included in the second semiconductor layer 12. The p-side electrode 62 further includes a reflective layer that is provided on the contact layer, has a reflectance for the light emitted by the light emitting layer 13 that is higher than that of the contact layer, and includes, for example, silver (Ag) as the main component.

The p-side interconnect layer 65 and the n-side interconnect layer 66 are provided to be separated from each other on the insulating film 71 with the metal film 64 interposed between the insulating film 71 and the p-side interconnect layer and between the insulating film 71 and the n-side interconnect layer 66.

The planar layout of the p-side interconnect layer 65 and the n-side interconnect layer 66 is shown in FIG. 50A.

Similarly to the embodiment recited above, the p-side interconnect layer 65 and the n-side interconnect layer 66 are formed by electroplating. The metal film 64 is used as the seed metal in the plating.

Figure 49C:
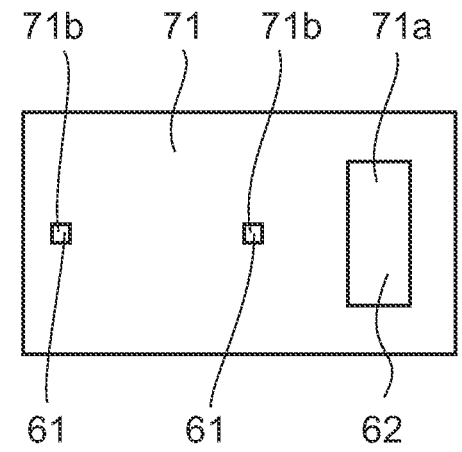

A first opening 71*a* is made in the insulating film 71 to reach the p-side electrode 62 as shown in FIG. 49C; and the p-side interconnect layer 65 is electrically connected to the p-side electrode 62 by means of a p-side via 65*a* (shown in FIG. 48) provided inside the first opening 71*a*.

Second openings 71*b* are made in the insulating film 71 to reach the n-side electrodes 61 as shown in FIG. 49C; and the n-side interconnect layer 66 is electrically connected to the n-side electrodes 61 by means of n-side vias 66*a* (shown in FIG. 48) provided inside the second openings 71*b*.

The n-side interconnect layer 66 is provided also on the insulating film 71 on the semiconductor layer 15 between two n-side electrodes 61.

The p-type metal pillar 67 is provided on the p-side interconnect layer 65. The n-side metal pillar 68 is provided on the n-side interconnect layer 66.

The planar layout of the p-type metal pillar 67 and the n-side metal pillar 68 is shown in FIG. 50B.

The p-side interconnect layer 65 and the p-type metal pillar 67 are included in the p-side interconnect unit of the embodiment. The n-side interconnect layer 66 and the n-side metal pillar 68 are included in the n-side interconnect unit of the embodiment.

The resin layer 77 is stacked on the insulating film 71. The resin layer 77 covers the periphery of the p-side interconnect unit and the periphery of the n-side interconnect unit. Also, the resin layer 77 is filled between the p-type metal pillar 67 and the n-side metal pillar 68.

In the sixth embodiment as well, a high light output can be obtained by the light emitting layer 13 formed over the region that is larger than the n-side electrodes 61. Further, the n-side electrodes 61 provided in the region that is narrower than the region including the light emitting layer 13 are drawn out to the mounting surface side as the n-side interconnect layer 66 that has a larger surface area.

The p-side electrode 62 is connected to the p-type metal pillar 67 including the external terminal 67*a* of the mounting via a single-layer interconnect (the p-side interconnect layer 65). The n-side electrodes 61 are connected to the n-type metal pillar 68 including the external terminal 68*a* of the mounting via a single-layer interconnect (the n-side interconnect layer 66).

The phosphor layer 50 is provided on the first surface 15*a*. The phosphor layer 50 includes the transparent resin 51 as a transparent medium and the phosphor 52 having a multiple particle configuration dispersed in the transparent resin 51.

In the semiconductor light emitting device 6 of the sixth embodiment as well, the light extraction from the first surface 15*a* is not impeded by the electrodes because the p-side electrode 62 and the n-side electrodes 61 are provided at the second surface on the side opposite to the first surface 15*a* which is the main extraction surface of the light.

The n-side regions 80*b* at the second surface of the first semiconductor layer 11 and the n-side electrodes 61 provided on the n-side regions 80*b* are interspersed at the second surface in a dot configuration or an island configuration. Therefore, the uniform current distribution in the surface direction of the light emitting layer 13 can be realized while increasing the light emission surface area by reducing the region not including the light emitting layer 13.

As shown in FIG. 49B, the p-side electrode 62 that is highly reflective to the light emitted by the light emitting layer 13 spreads over substantially the entire surface of the second surface. Accordingly, the reflecting surface area of the light radiated from the light emitting layer 13 to the side opposite to the light extraction surface (the first surface 15*a*) can be large; and a high light extraction efficiency is obtained.

As shown in FIG. 48 and FIGS. 49A and 49B, the light emitting layer 13 and the p-side electrode 62 exist completely around the n-side regions 80*b* and the n-side electrodes 61. Accordingly, the current from one n-side electrode 61 spreads 360 degrees around the one n-side electrode 61; and the current can be supplied efficiently to the entire region of the light emitting layer 13. Accordingly, according to the embodiment, the entire region of the light emitting layer 13 can be efficiently caused to emit light.

The transparent electrode may be provided between the second semiconductor layer 12 and the p-side electrode 62 in the structure of the sixth embodiment as in the fifth embodiment described above. By controlling the thickness of the transparent electrode such that the distance between the light emitting layer 13 and the p-side electrode 62 is ½ of the light emission wavelength of the light emitting layer 13, the reflection loss due to interference can be suppressed; and a high reflection efficiency is obtained.

Seventh Embodiment

FIGS. 51A to 51D are schematic plan views of the components of the semiconductor light emitting device 7 of the seventh embodiment on the second surface side.

In the semiconductor light emitting device 7 of the seventh embodiment, the planar layout of the p-side region 80*a*, the n-side regions 80*b*, the p-side electrode 62, the n-side electrodes 61, the p-side interconnect layer 65, the n-side interconnect layer 66, the p-type metal pillar 67, and the n-side metal pillar 68 is different from that of the semiconductor light emitting device 6 of the sixth embodiment recited above.

Figure 51A:
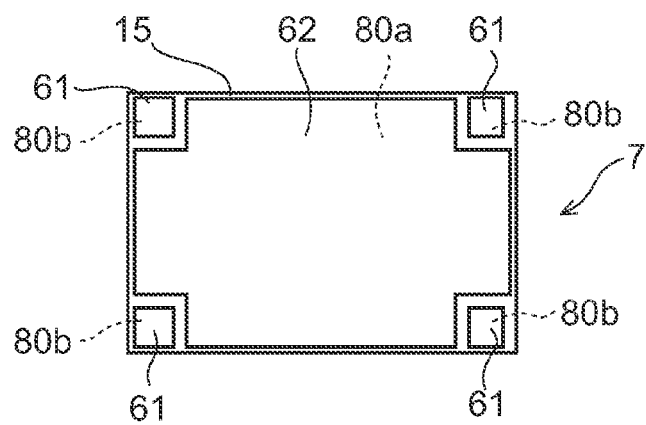
FIGS. 51A to 51D are schematic plan views of a semiconductor light emitting device of a seventh embodiment.

FIG. 51A corresponds to FIG. 49B of the sixth embodiment recited above and shows the planar layout of the p-side electrode 62 and the n-side electrodes 61 of the semiconductor light emitting device 7 of the seventh embodiment.

Figure 51B:
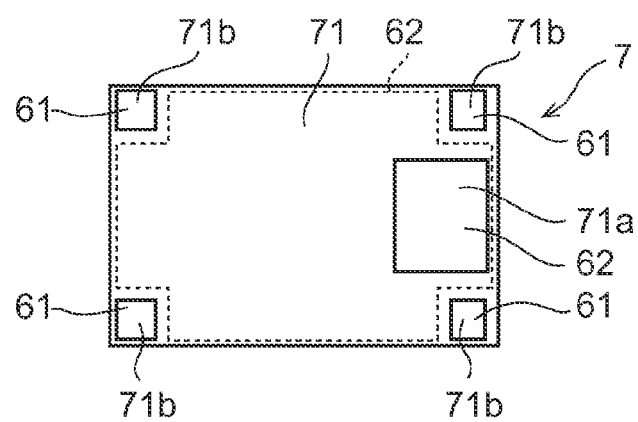

FIG. 51B corresponds to FIG. 49C of the sixth embodiment recited above and is a plan view of the insulating film 71 and the openings 71*a* and 71*b* of the semiconductor light emitting device 7 of the seventh embodiment.

Figure 51C:
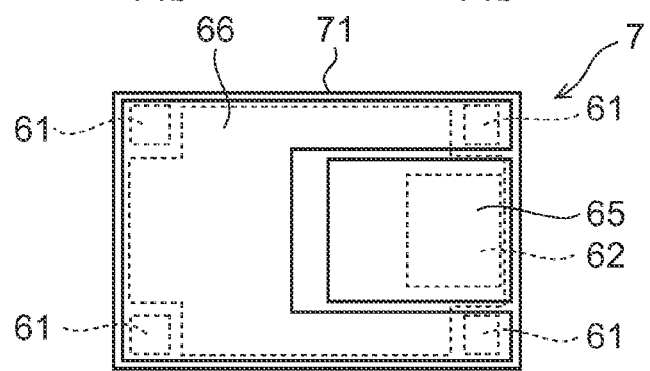

FIG. 51C corresponds to FIG. 50A of the sixth embodiment recited above and shows the planar layout of the p-side interconnect layer 65 and the n-side interconnect layer 66 of the semiconductor light emitting device 7 of the seventh embodiment.

Figure 51D:
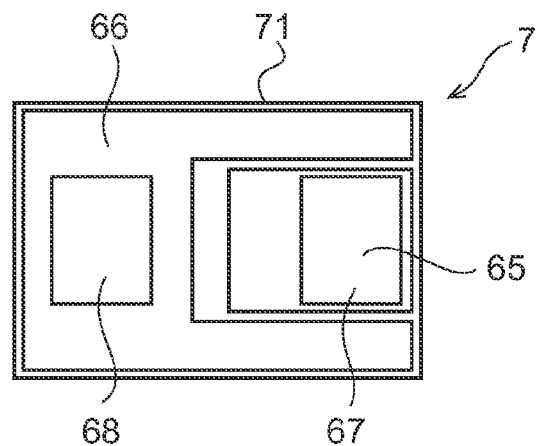

FIG. 51D corresponds to FIG. 50B of the sixth embodiment recited above and shows the planar layout of the p-type metal pillar 67 and the n-side metal pillar 68 of the semiconductor light emitting device 7 of the seventh embodiment.

Similarly to the embodiment recited above, the n-side regions 80*b* are formed by the front surface of the first semiconductor layer 11 being exposed by selectively removing a portion of the light emitting layer 13 and the second semiconductor layer 12 formed on the entire surface of the second surface of the first semiconductor layer 11.

The n-side regions 80*b* are formed in multiple locations for every one chip. In the embodiment, for example, four n-side regions 80*b* are formed at four corners of the chip. Then, the n-side electrodes 61 are provided respectively on the n-side regions 80*b*. The p-side electrode 62 is provided between the n-side electrodes 61 when viewed in plan in FIG. 51A.

Then, similarly to the embodiment recited above, the p-side interconnect layer 65 and the n-side interconnect layer 66 are provided to be separated from each other on the insulating film 71 as shown in FIG. 51C.

The first opening 71a is made in the insulating film 71 to reach the p-side electrode 62 as shown in FIG. 51B; and the p-side interconnect layer 65 is electrically connected to the p-side electrode 62 by means of a p-side via provided inside the first opening 71a.

The second openings 71b are made in the insulating film 71 to reach the n-side electrodes 61 as shown in FIG. 51B; and the n-side interconnect layer 66 is electrically connected to the n-side electrodes 61 by means of n-side vias provided inside the second openings 71b.

The multiple n-side electrodes 61 are separated from each other without being linked on the second surface. The multiple n-side electrodes 61 are connected to a common n-side interconnect layer 66 spreading on the insulating film 71.

As shown in FIG. 51D, the p-type metal pillar 67 is provided on the p-side interconnect layer 65; and the n-side metal pillar 68 is provided on the n-side interconnect layer 66.

The p-side electrode 62 is connected to the p-type metal pillar 67 via a single-layer interconnect (the p-side interconnect layer 65). The n-side electrodes 61 are connected to the n-type metal pillar 68 via a single-layer interconnect (the n-side interconnect layer 66).

In the seventh embodiment as well, a high light output can be obtained by the light emitting layer 13 formed over the region that is larger than the n-side electrodes 61. Further, the n-side electrodes 61 provided in the region that is narrower than the region including the light emitting layer 13 are drawn out to the mounting surface side as the n-side interconnect layer 66 that has a larger surface area.

The n-side regions 80b and the n-side electrodes 61 provided on the n-side regions 80b are interspersed at the second surface in a dot configuration or an island configuration. Therefore, a uniform current distribution in the surface direction of the light emitting layer 13 can be realized while increasing the light emission surface area by reducing the region not including the light emitting layer 13.

As shown in FIG. 51A, the p-side electrode 62 that is highly reflective to the light emitted by the light emitting layer 13 spreads over substantially the entire surface of the second surface other than the four corners. Accordingly, the reflecting surface area of the light radiated from the light emitting layer 13 to the side opposite to the light extraction surface (the first surface 15a) can be large; and a high light extraction efficiency is obtained.

FIGS. 52A to 52D are schematic plan views showing a modification of the planar layout of the components of the semiconductor light emitting device 3 of the third embodiment described above on the second surface side.

Figure 52A:
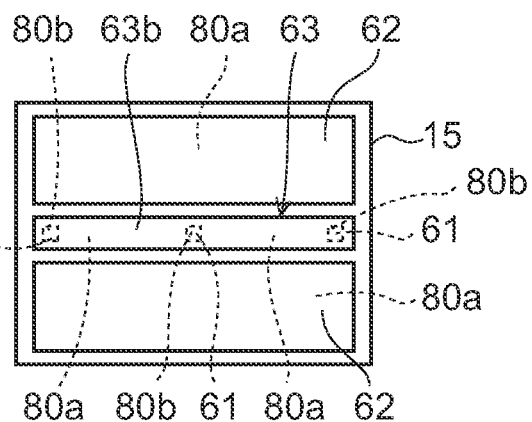
FIGS. 52A to 52D are schematic plan views of another semiconductor light emitting device of the third embodiment.

FIG. 52A corresponds to FIG. 25A recited above and shows the planar layout of the p-side electrode 62, the n-side electrodes 61, and the n-side reflecting electrode 63.

Figure 52B:
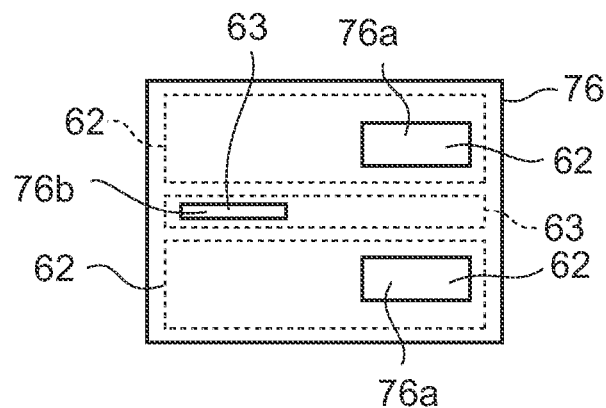

FIG. 52B corresponds to FIG. 26A recited above and is a plan view of the insulating film 76 and the openings 76a and 76b.

Figure 52C:
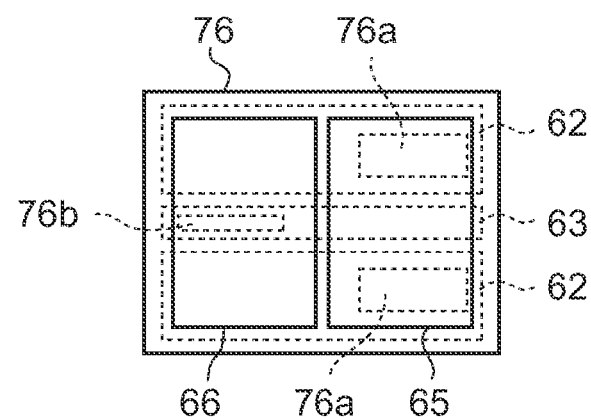

FIG. 52C corresponds to FIG. 27A recited above and shows the planar layout of the p-side interconnect layer 65 and the n-side interconnect layer 66.

Figure 52D:
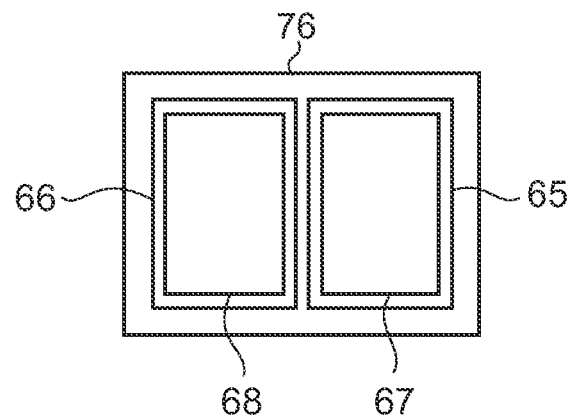

FIG. 52D corresponds to FIG. 29A recited above and shows the planar layout of the p-type metal pillar 67 and the n-side metal pillar 68.

In the modification as well, the n-side regions 80b are formed in multiple locations (e.g., three locations) for every one chip; and the n-side electrodes 61 are provided respectively on the n-side regions 80b. The three n-side electrodes 61 are arranged, for example, in the longitudinal direction (the X direction of FIG. 25A) of the chip.

The modification differs from the third embodiment recited above in that the p-side electrode 62 is divided into two by the n-side reflecting electrode 63 inside one chip as shown in FIG. 52A. The n-side reflecting electrode 63 is provided on the n-side electrodes 61 and on the light emitting layer 13 between the n-side electrodes 61.

As shown in FIG. 52B, one (second) opening 76b and two (first) p-side openings 76a are made in the insulating film 76 provided on the p-side electrodes 62 and the n-side reflecting electrode 63.

The opening 76b communicates with the n-side reflecting electrode 63 formed on the n-side reflecting electrode 63. The openings 76a are made respectively on the two p-side electrodes 62 divided by the n-side reflecting electrode 63; and the openings 76a communicate with the p-side electrodes 62.

As shown in FIG. 52C, the p-side interconnect layer 65 and the n-side interconnect layer 66 are provided to be separated from each other on the insulating film 76.

The p-side interconnect layer 65 is electrically connected to the p-side electrodes 62 by means of p-side vias provided inside the openings 76a made in the insulating film 76. The n-side interconnect layer 66 is electrically connected to the n-side reflecting electrode 63 and the n-side electrodes 61 by means of an n-side via provided inside the opening 76b made in the insulating film 76.

As shown in FIG. 52D, the p-type metal pillar 67 is provided on the p-side interconnect layer 65; and the n-side metal pillar 68 is provided on the n-side interconnect layer 66.

In the modification as well, a high light output can be obtained by the light emitting layer 13 formed over the region that is larger than the n-side electrodes 61. Further, the n-side electrodes 61 provided in the region that is narrower than the region including the light emitting layer 13 are drawn out to the mounting surface side as the n-side interconnect layer 66 that has a larger surface area.

The n-side regions 80b and the n-side electrodes 61 provided on the n-side regions 80b are interspersed at the second surface in a dot configuration or an island configuration. Therefore, a uniform current distribution in the surface direction of the light emitting layer 13 can be realized while increasing the light emission surface area by reducing the region not including the light emitting layer 13.

As shown in FIG. 52A, the p-side electrode 62 and the n-side reflecting electrode 63 that are highly reflective to the light emitted by the light emitting layer 13 spread over substantially the entire surface on the side opposite to the light extraction surface (the first surface 15a). Accordingly, the reflecting surface area of the light radiated from the light emitting layer 13 to the side opposite to the light extraction surface (the first surface 15a) can be large; and a high light extraction efficiency is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device, comprising:
a first semiconductor layer having a first surface and a second surface opposite to the first surface, the second surface having a p-side region and a plurality of n-side regions;
a light emitting layer provided on the p-side region;
a second semiconductor layer provided on the light emitting layer;
a p-side electrode provided on the second semiconductor layer;
a plurality of n-side electrodes provided respectively on the plurality of n-side regions;
a first insulating film provided on the p-side electrode and on the plurality of n-side electrodes;
a p-side interconnect unit provided on the first insulating film to connect to the p-side electrode through a first via piercing the first insulating film;
a plurality of second vias provided respectively on the plurality of n-side electrodes and piercing the first insulating film; and
an n-side interconnect unit provided on the first insulating film to commonly connect to the plurality of n-side electrodes through the plurality of second vias,
wherein a bottom surface of the n-side interconnect unit is coplanar with a top surface of the first insulating film and with a to surface of each of the plurality of second vias, the plurality of n-side regions are separated from each other without being linked at the second surface, and the p-side region is provided around each of the n-side regions at the second surface.

2. The device according to claim 1, wherein the plurality of n-side electrodes are interspersed in a dot configuration on the second surface.

3. The device according to claim 1, wherein
the p-side interconnect unit includes:
a p-side interconnect layer provided on the first insulating film; and
a p-type metal pillar provided on the p-side interconnect layer, the p-type metal pillar being thicker than the p-side interconnect layer, and
the n-side interconnect unit includes:
an n-side interconnect layer provided on the first insulating film; and
an n-side metal pillar provided on the n-side interconnect layer, the n-side metal pillar being thicker than the n-side interconnect layer.

4. The device according to claim 1, further comprising a second insulating film provided between the p-side interconnect unit and the n-side interconnect unit.

5. The device according to claim 4, wherein the second insulating film continuously covers a periphery of the p-side interconnect unit and a periphery of the n-side interconnect unit.

6. The device according to claim 3, wherein the p-side interconnect layer comprises a first single-layer structure provided on the first insulating film, and the n-side interconnect layer comprises a second single-layer structure provided on the first insulating film.

7. A semiconductor light emitting device, comprising:
a first semiconductor layer having a first surface and a second surface opposite to the first surface, the second surface having a p-side region and a plurality of n-side regions;
a light emitting layer provided on the p-side region;
a second semiconductor layer provided on the light emitting layer;
a p-side electrode provided on the second semiconductor layer, the p-side electrode being reflective to light emitted by the light emitting layer;
a plurality of n-side electrodes provided respectively on the plurality of n-side regions;
an insulating film provided on the second semiconductor layer and being sandwiched between respective ones of the plurality of n-side electrodes; and
an n-side reflecting electrode having a plurality of n-side vias connected respectively to the plurality of n-side electrodes, and a linking portion provided on the insulating film and linking the plurality of n-side vias,
wherein a bottom surface of the linking portion is coplanar with a to surface of the insulating film and with a to surface of each of the plurality of n-side vias, a reflectance of the n-side reflecting electrode for the light emitted by the light emitting layer is higher than a reflectance of the n-side electrodes for the light emitted by the light emitting layer, and the n-side reflecting electrode is made of a same material as the p-side electrode.

8. The device according to claim 7, wherein the p-side electrode and the n-side reflecting electrode include silver.

9. The device according to claim 7, further comprising a transparent electrode provided on the second semiconductor layer.

10. The device according to claim 9, wherein
the transparent electrode is provided between the p-side electrode and the second semiconductor layer, and is provided between the n-side reflecting electrode and the second semiconductor layer with the insulating film interposed, and
the transparent electrode provided between the p-side electrode and the second semiconductor layer is linked to the transparent electrode provided between the n-side reflecting electrode and the second semiconductor layer as a single body.

11. The device according to claim 10, wherein a distance between the light emitting layer and the n-side reflecting electrode is ½ of a light emission wavelength of the light emitting layer.

12. The device according to claim 7, wherein the plurality of n-side electrodes are interspersed in a dot configuration on the second surface.

13. A semiconductor light emitting device, comprising:
a first semiconductor layer having a first surface and a second surface opposite to the first surface, the second surface having a p-side region and a plurality of n-side regions;
a light emitting layer provided on the p-side region;
a second semiconductor layer provided on the light emitting layer;
a p-side electrode provided on the second semiconductor layer, the p-side electrode being reflective to light emitted by the light emitting layer;
a plurality of n-side electrodes provided respectively on the plurality of n-side regions;
a first insulating film provided on the p-side electrode and on the plurality of n-side electrodes;
a p-side interconnect unit provided on the first insulating film to connect to the p-side electrode through a first via piercing the first insulating film;
a plurality of second vias provided respectively on the plurality of n-side electrodes and piercing the first insulating film; and
an n-side interconnect unit provided on the first insulating film to commonly connect to the plurality of n-side electrodes through the plurality of second vias, wherein a bottom surface of the n-side interconnect unit is coplanar with a top surface of the first insulating film and with a to surface of each of the plurality of second vias, and the plurality of n-side regions are separated from each other without being linked at the second surface.

14. The device according to claim 13, wherein
the p-side interconnect unit includes:
- a p-side interconnect layer provided on the first insulating film; and
- a p-type metal pillar provided on the p-side interconnect layer, the p-type metal pillar being thicker than the p-side interconnect layer, and the n-side interconnect unit includes:
- an n-side interconnect layer provided on the first insulating film; and
- an n-side metal pillar provided on the n-side interconnect layer, the n-side metal pillar being thicker than the n-side interconnect layer.

15. The device according to claim 13, further comprising a second insulating film provided between the p-side interconnect unit and the n-side interconnect unit.

16. The device according to claim 15, wherein the second insulating film continuously covers a periphery of the p-side interconnect unit and a periphery of the n-side interconnect unit.

17. The device according to claim 13, wherein the plurality of n-side electrodes are interspersed in a dot configuration on the second surface.

18. The device according to claim 13, wherein the p-side electrode includes silver.

19. The device according to claim 13, wherein the p-side region is provided around each of the plurality of n-side electrodes.

20. The device according to claim 13, wherein a distance between the light emitting layer and the p-side electrode is ½ of a light emission wavelength of the light emitting layer.

* * * * *